(12) United States Patent
Suzawa et al.

(10) Patent No.: US 8,207,026 B2
(45) Date of Patent: Jun. 26, 2012

(54) MANUFACTURING METHOD OF THIN FILM TRANSISTOR AND MANUFACTURING METHOD OF DISPLAY DEVICE

(75) Inventors: Hideomi Suzawa, Kanagawa (JP); Takafumi Mizoguchi, Kanagawa (JP); Koji Dairiki, Kanagawa (JP); Mayumi Mikami, Kanagawa (JP); Yumiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 194 days.

(21) Appl. No.: 12/693,037

(22) Filed: Jan. 25, 2010

(65) Prior Publication Data

US 2010/0187535 A1    Jul. 29, 2010

(30) Foreign Application Priority Data

Jan. 28, 2009    (JP) ................ 2009-016472

(51) Int. Cl.
*H01L 21/764* (2006.01)
(52) U.S. Cl. .. 438/158; 438/713; 438/739; 257/E21.414
(58) Field of Classification Search .......... 257/E21.411, 257/E21.414; 438/22, 158, 713, 739
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,020,215 A | 2/2000 | Yagi et al. | |
| 6,388,291 B1 | 5/2002 | Zhang et al. | |
| 6,433,361 B1 | 8/2002 | Zhang et al. | |
| 6,485,997 B2 | 11/2002 | Lee et al. | |
| 6,493,048 B1 | 12/2002 | Baek et al. | |
| 6,555,843 B1 | 4/2003 | Yamazaki et al. | |
| 6,635,581 B2 | 10/2003 | Wong | |
| 6,933,165 B2 | 8/2005 | Musolf et al. | |
| 7,023,021 B2 | 4/2006 | Yamazaki et al. | |
| 7,116,384 B2 | 10/2006 | Chen | |
| 7,187,123 B2 * | 3/2007 | MacPherson | 313/506 |

(Continued)

FOREIGN PATENT DOCUMENTS

JP    64-084669 A    3/1989

(Continued)

OTHER PUBLICATIONS

C.W. Kim et al.; "42.1 A Novel Four-Mask-Count Process Architecture for TFT-LCDs"; SID 00 Digest : SID International Symposium Digest of Technical Papers; 2000; pp. 1006-1009.

(Continued)

*Primary Examiner* — Howard Weiss
*Assistant Examiner* — John C. Ingham
(74) *Attorney, Agent, or Firm* — Fish & Richardson P.C.

(57) ABSTRACT

To provide a method for manufacturing a thin film transistor and a display device using a small number of masks, a thin film transistor is manufactured in such a manner that a first conductive film, an insulating film, a semiconductor film, an impurity semiconductor film, and a second conductive film are stacked; then, a resist mask is formed thereover; first etching is performed to form a thin-film stack body; second etching in which the first conductive film is side-etched is performed by dry-etching to form a gate electrode layer; and a source electrode, a drain electrode, and the like are formed. Before the dry etching, it is preferred that at least a side surface of the etched semiconductor film be oxidized.

36 Claims, 58 Drawing Sheets

U.S. PATENT DOCUMENTS

| | | | |
|---|---|---|---|
| 7,223,643 B2 | 5/2007 | Ohnuma et al. | |
| 7,749,820 B2 * | 7/2010 | Miyairi | 438/151 |
| 7,790,483 B2 * | 9/2010 | Miyairi et al. | 438/22 |
| 7,883,943 B2 * | 2/2011 | Miyairi et al. | 438/151 |
| 7,985,605 B2 * | 7/2011 | Komori et al. | 438/22 |
| 7,989,234 B2 * | 8/2011 | Miyairi et al. | 438/22 |
| 7,989,275 B2 * | 8/2011 | Miyairi et al. | 438/151 |
| 2001/0049064 A1 | 12/2001 | Lee et al. | |
| 2005/0224796 A1 | 10/2005 | Zhang et al. | |
| 2006/0086934 A1 | 4/2006 | Iwamatsu et al. | |
| 2006/0290867 A1 | 12/2006 | Ahn et al. | |
| 2007/0002249 A1 | 1/2007 | Yoo et al. | |
| 2007/0093045 A1 | 4/2007 | Yamaguchi et al. | |
| 2007/0126969 A1 | 6/2007 | Kimura et al. | |
| 2007/0139571 A1 | 6/2007 | Kimura | |
| 2007/0146591 A1 | 6/2007 | Kimura et al. | |
| 2007/0222936 A1 | 9/2007 | Shih | |
| 2007/0238213 A1 | 10/2007 | Yamaguchi et al. | |
| 2008/0128809 A1 * | 6/2008 | Ohnuma | 257/347 |
| 2009/0101906 A1 | 4/2009 | Hosoya et al. | |
| 2009/0152559 A1 | 6/2009 | Miyairi et al. | |
| 2009/0212296 A1 | 8/2009 | Mizoguchi et al. | |
| 2009/0212300 A1 | 8/2009 | Komori | |
| 2009/0224249 A1 | 9/2009 | Miyairi et al. | |
| 2009/0227051 A1 | 9/2009 | Miyairi et al. | |
| 2009/0227076 A1 | 9/2009 | Miyairi | |
| 2009/0233389 A1 | 9/2009 | Miyairi et al. | |
| 2009/0261369 A1 | 10/2009 | Komori et al. | |
| 2009/0311809 A1 | 12/2009 | Miyairi et al. | |
| 2010/0230683 A1 | 9/2010 | Miyairi | |
| 2011/0263060 A1 | 10/2011 | Miyairi et al. | |

FOREIGN PATENT DOCUMENTS

| | | |
|---|---|---|
| JP | 03-011744 A | 1/1991 |
| JP | 03-161938 A | 7/1991 |
| JP | 07-307477 A | 11/1995 |
| JP | 2000-307118 A | 11/2000 |
| JP | 2003-179069 A | 6/2003 |
| JP | 2007-133371 A | 5/2007 |
| WO | 2008/099528 A1 | 8/2008 |

OTHER PUBLICATIONS

International Search Report (PCT Application No. PCT/JP2008/071746) dated Dec. 22, 2008, in English.

Written Opinion (PCT Application No. PCT/JP2008/071746) dated Dec. 22, 2008, in English.

* cited by examiner

B1　　　　　　　　　　　　　　　　　　　　　B2

B1　　　　　　　　　　　　　　　　　　　　　B2

MANUFACTURING METHOD OF THIN FILM TRANSISTOR AND MANUFACTURING METHOD OF DISPLAY DEVICE

BACKGROUND OF THE INVENTION

1. Field of the Invention

The present invention relates to manufacturing methods of a thin film transistor and a display device including the thin film transistor.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as ICs (integrated circuits) and electro-optical devices. In particular, thin film transistors are urgently developed as switching elements of display devices typified by liquid crystal display devices, electro luminescence (EL) display devices, and the like. In active matrix liquid crystal display devices, specifically, voltage is applied between a pixel electrode connected to a selected switching element and a counter electrode corresponding to the pixel electrode, and thus, a liquid crystal layer disposed between the pixel electrode and the counter electrode is aligned differently to be modulated optically. The optical modulation can be recognized as a display pattern by an observer. The active matrix liquid crystal display devices mentioned here form a display pattern on a screen by driving pixels that are arranged in a matrix form, with use of switching elements. The active matrix EL display devices mentioned here form a display pattern on a screen by driving pixels that are arranged in a matrix form, with use of switching elements.

The application of the above-described active matrix liquid crystal display devices and EL display devices is expanding, and demands for larger screen size, higher definition, and higher aperture ratio are increasing. In addition, it is demanded that the active matrix liquid crystal display devices and EL display devices have high reliability and that a production method of the active matrix liquid crystal display devices and EL display devices offer high yield and reduce production cost. In order to increase productivity and reduce production cost, the process can be simplified.

In the active matrix liquid crystal display devices and EL display devices, thin film transistors are mainly used as switching elements. In a manufacturing process of the thin film transistors, reduction in the number of photomasks used in photolithography is important for simplification of the process. For example, addition of one photomask needs the following steps: resist application, prebaking, light exposure, development, postbaking, and the like, and other steps before and after the aforementioned steps, such as film formation, etching, resist removal, cleaning, drying, and the like. Since the number of steps is thus significantly increased only by adding one photomask in the manufacturing process, many techniques for reducing the number of photomasks in the manufacturing process have been developed.

The thin film transistors are broadly classified into a top-gate type in which a gate electrode is formed over a channel formation region and a bottom-gate type in which a gate electrode is formed under a channel formation region. It is known that the number of photomasks used in a manufacturing process of bottom-gate thin film transistors is less than the number of photomasks used in a manufacturing process of top-gate thin film transistors. In general, three photomasks are used for manufacturing a bottom-gate thin film transistor.

Many conventional techniques for reducing the number of photomasks use a complicated technique such as backside light exposure, resist reflow, or a lift-off method, which requires a special apparatus. Using such complicated techniques may cause various problems, which leads to reduction in yield. Further, in many cases, reduction in the number of photomasks is at the expense of electric characteristics of a thin film transistor.

A widely known typical means for reducing the number of photomasks used for manufacturing a thin film transistor is a technique using a multi-tone mask (called a half-tone mask or a gray-tone mask). For example, Patent Document 1 discloses a technique for reducing the number of manufacturing steps by using a multi-tone mask.

REFERENCE

[Patent Document 1] Japanese Published Patent Application No. 2003-179069

With conventional techniques, it is difficult to further reduce the number of photomasks.

Even when bottom-gate thin film transistors are manufactured using a multi-tone mask as described above, at least two photomasks are needed, and one of the two is used for patterning a gate electrode layer.

SUMMARY OF THE INVENTION

An object of an embodiment of the present invention is to provide a new method for manufacturing a thin film transistor in which a gate electrode layer can be patterned without using an additional photomask. That is, an object is to reduce the number of photomasks used in photolithography than the number of photomasks conventionally used, without a complicated technique.

Further, an embodiment of the present invention can be particularly applied to a method for manufacturing a thin film transistor which is used in a pixel of a display device (also referred to as a pixel TFT). An embodiment of the present invention is to provide a method for manufacturing a display device in which the number of photomasks used in photolithography is less than that in the conventional methods, without a complicated technique.

Furthermore, an object is, not only to reduce the number of the photomasks, but also to provide a thin film transistor which has favorable electric characteristics, and a display device which has favorable display characteristics.

In a method for manufacturing a thin film transistor which is an embodiment of the present invention, a first conductive film and a thin-film stack body in which an insulating film, a semiconductor film, an impurity semiconductor film, and a second conductive film are stacked in this order over the first conductive film are formed; first etching is performed to expose the first conductive film and form at least a pattern of the thin-film stack body; and second etching is performed to form a pattern of the first conductive film. Here, the second etching is performed under such conditions as to selectively side-etch the first conductive film.

The first etching may be either dry etching or wet etching, and it is preferred to employ a highly anisotropic etching method (physical etching). For example, etching mainly using ions (ion etching or ion-assist etching) may be employed. By adopting a highly anisotropic etching method as the first etching, processing precision of a pattern can be improved.

As for the second etching, dry etching is employed. In particular, in the case where dry etching is employed also as the first etching, a step of drying or the like is unnecessary, which results in improving throughput. Note that a highly isotropic etching method (chemical etching) is employed for the second etching since the first conductive film should be side-etched. Since the second etching is performed under such conditions as to side-etch the first conductive film, the first conductive film recedes (reduces) to an inner side than the formed thin-film stack body. After the second etching, a side surface of the first conductive film exists more on the inside than a side surface of the formed thin-film stack body. Note that the distance between the side surface of the formed first conductive film and the side surface of the formed thin-film stack body is approximately uniform.

Note that the "pattern of the first conductive film" means, for example, a top view layout of a metal wiring which forms a gate electrode, a gate wiring, a capacitor electrode, a capacitor wiring, a power supply line, or the like.

One embodiment of the present invention is a method for manufacturing a thin film transistor including the steps of: forming a first conductive film, an insulating film, a semiconductor film, an impurity semiconductor film, and a second conductive film stacked in this order; forming a first resist mask over the second conductive film; performing first etching on the insulating film, the semiconductor film, the impurity semiconductor film, and the second conductive film using the first resist mask to expose at least a surface of the first conductive film; performing oxidation treatment to oxidize at least a side surface of the semiconductor film which is etched; performing second etching in which side-etching is performed on part of the first conductive film by dry etching to form a gate electrode layer; forming a second resist mask over the second conductive film; and performing third etching on each part of the second conductive film, the impurity semiconductor film, and the semiconductor film using the second resist mask to form a source and drain electrode layer, a source and drain region, and a semiconductor layer.

Another embodiment of the present invention is a method for manufacturing a thin film transistor including the steps of: forming a first conductive film, an insulating film, a semiconductor film, an impurity semiconductor film, and a second conductive film stacked in this order; forming a first resist mask over the second conductive film; performing first etching on the insulating film, the semiconductor film, the impurity semiconductor film, and the second conductive film using the first resist mask to expose at least a surface of the first conductive film; performing oxidation treatment to oxidize at least a side surface of the semiconductor film which is etched; forming a second resist mask over the second conductive film; performing second etching in which side-etching is performed on part of the first conductive film by dry etching to form a gate electrode layer; and performing third etching on each part of the second conductive film, the impurity semiconductor film, and the semiconductor film using the second resist mask to form a source and drain electrode layer, a source and drain region, and a semiconductor layer.

Another embodiment of the present invention is a method for manufacturing a thin film transistor including the steps of: forming a first conductive film, an insulating film, a semiconductor film, an impurity semiconductor film, and a second conductive film stacked in this order; forming a first resist mask having a depressed portion over the second conductive film; performing first etching on the insulating film, the semiconductor film, the impurity semiconductor film, and the second conductive film using the first resist mask to expose at least a surface of the first conductive film; performing oxidation treatment to oxidize at least a side surface of the semiconductor film which is etched; performing second etching in which side-etching is performed on part of the first conductive film by dry etching to form a gate electrode layer; forming a second resist mask by making the first resist mask recede (reduce) to expose part of the second conductive film overlapping with the depressed portion of the first resist mask; and performing third etching on each part of the second conductive film, the impurity semiconductor film, and the semiconductor film using the second resist mask to form a source and drain electrode layer, a source and drain region, and a semiconductor layer.

Another embodiment of the present invention is a method for manufacturing a thin film transistor including the steps of: forming a first conductive film, an insulating film, a semiconductor film, an impurity semiconductor film, and a second conductive film stacked in this order; forming a first resist mask having a depressed portion over the second conductive film; performing first etching on the insulating film, the semiconductor film, the impurity semiconductor film, and the second conductive film using the first resist mask to expose at least a surface of the first conductive film; performing oxidation treatment to oxidize at least a side surface of the semiconductor film which is etched; forming a second resist mask by making the first resist mask recede (reduce) to expose part of the second conductive film overlapping with the depressed portion of the first resist mask; performing second etching in which side-etching is performed on part of the first conductive film by dry etching to form a gate electrode layer; and performing third etching on each part of the second conductive film, the impurity semiconductor film, and the semiconductor film using the second resist mask to form a source and drain electrode layer, a source and drain region, and a semiconductor layer.

The method for manufacturing a thin film transistor according to any of the description above can be performed in such a manner that the first conductive film is formed using tungsten and the dry etching of the second etching is performed using a gas of chlorine trifluoride (chemical formula: $ClF_3$).

In the method for manufacturing a thin film transistor according to any of the description above, it is preferred that the first resist mask be formed using a multi-tone mask. By using the multi-tone mask, a resist mask having a depressed portion can be formed by a simple process.

By employing the method for manufacturing a thin film transistor according to any of the description above, an element region is formed by the first etching, and the second etching can make a side surface of the gate electrode layer more on the inside than a side surface of the element region by a substantially uniform distance.

A display device can be manufactured by selectively forming a pixel electrode so as to be electrically connected to the source and drain electrode layer of the thin film transistor manufactured by any of the above-described manufacturing methods.

In a display device thus manufactured may include the steps of forming a protective insulating film to cover the thin film transistor, forming an opening in the protective insulating film so as to expose part of the source and drain electrode layer, and selectively forming a pixel electrode in the opening and over the protective insulating film.

In the method for manufacturing a display device according to any of the description above, it is preferred that the protective insulating film be formed by stacking a protective insulating film formed by a CVD method or a sputtering method and a protective insulating film formed by a spin coating method. More preferably, the protective insulating film is formed by stacking a silicon nitride film formed by a CVD method or a sputtering method and an organic resin film formed by a spin coating method. By formation of the protective insulating film in this manner, the thin film transistor can be protected from an impurity element or the like which may adversely affect electric characteristics of the thin film transistor, and planarity of a surface over which a pixel electrode is formed can be improved; accordingly, reduction in yield can be prevented.

Alternatively, another embodiment of the present invention is a thin film transistor including a gate electrode layer, a gate insulating layer covering the gate electrode layer, a semiconductor layer provided over the gate insulating layer, an impurity semiconductor layer provided over the semiconductor layer, a source and drain electrode layer provided over the impurity semiconductor layer, and a cavity in contact with a side surface of the gate electrode layer, wherein a side surface of the semiconductor layer is oxidized. Since the side surface of the semiconductor layer is oxidized, in the manufacturing process, re-adhesion that is caused in the dry etching or the like on the semiconductor layer can be particularly prevented, which can result in prevention of reduction in the yield or the like. It is preferred that surfaces of the source and drain electrode layer also be oxidized.

It is preferred that etching be performed under such conditions as to cause unintended etching as little as possible.

Note that "a film has heat resistance" means that the film can keep the shape as a film and required function and characteristics under a temperature of a later step.

Note that a "gate wiring" means a wiring electrically connected to a gate electrode of a thin film transistor. The gate wiring is formed using a gate electrode layer. Further, the gate wiring is sometimes called a scanning line.

Note that a "source wiring" means a wiring electrically connected to either a source electrode or a drain electrode of a thin film transistor. The source wiring is formed using a source and drain electrode layer. Further, the source wiring is sometimes called a signal line.

In addition, a "power supply line" means a wiring which is electrically connected to a power supply and is held at a constant potential.

It is unnecessary to use an additional photomask for patterning a gate electrode, and thus, the number of steps for manufacturing a thin film transistor can be significantly reduced. Further, since the thin film transistor can be applied to a display device, the number of the manufacturing steps of the display device can also be significantly reduced.

More specifically, the number of photomasks can be reduced. It is possible to manufacture a thin film transistor using one photomask (multi-tone mask). As a result, the number of steps for manufacturing a thin film transistor and a display device can be significantly reduced. Further, since a thin film transistor can be manufactured using one photomask, misalignment in aligning a photomask can be prevented.

Unlike the conventional technique aiming at reducing the number of photomasks, a complicated step using backside light exposure, resist reflow, a lift-off method, or the like is unnecessary. As a result, the number of manufacturing steps of a thin film transistor and a display device can be significantly reduced without reducing yield.

In addition, the number of steps for manufacturing a thin film transistor can be significantly reduced with electric characteristics of the thin film transistor maintained. As a result, without the expense of display quality or the like of the display device, the number of steps for manufacturing a display device can be significantly reduced.

Furthermore, by the above-described advantageous effects, manufacturing cost of a thin film transistor and a display device can be significantly reduced.

In addition, a step of drying and the like after the second etching is unnecessary, which results in improving throughput.

Since a thin film transistor manufactured by any of the above-described manufacturing methods has a cavity in contact with an end portion of a gate electrode layer, leakage current between a gate electrode and a drain electrode can be made low.

DETAILED DESCRIPTION OF THE INVENTION

Figure 1A:
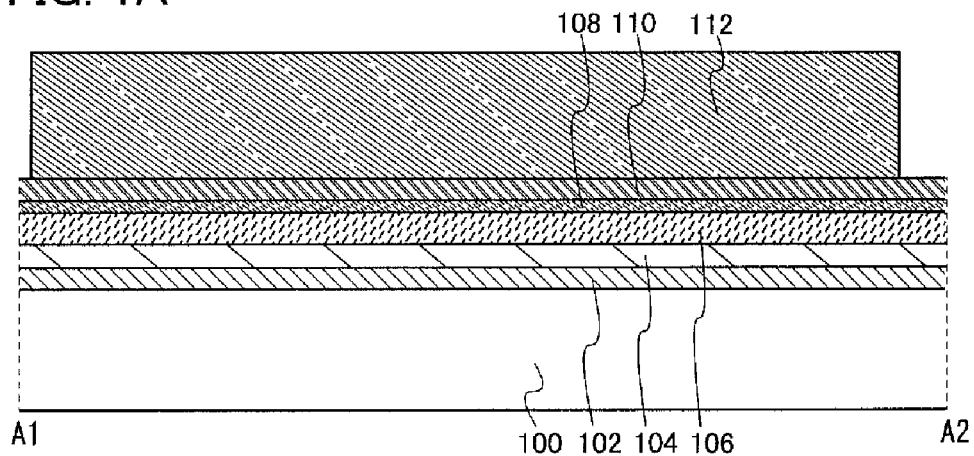
FIGS. 1A to 1C illustrate an example of a method for manufacturing a thin film transistor and a display device.

Embodiments of the present invention will be described below with reference to the drawings. Note that the present invention is not limited to the following description. It is easily understood by those skilled in the art that the mode and details can be changed in various ways without departing from the scope and spirit of the present invention. For that reason, the present invention should not be interpreted as being limited to the description of the embodiments given below. Note that the same reference numerals are commonly used to denote the same components among different drawings in structures of the present invention explained below. The same hatching pattern is applied to similar parts, and the similar parts are not especially denoted by reference numerals in some cases. Further, in principle, top views do not illustrate films which have an insulating property.

Embodiment 1

In this embodiment, an example of a method for manufacturing a thin film transistor and a method for manufacturing a display device in which the thin film transistors are arranged in a matrix form will be described with reference to FIG. 1A to FIG. 29C.

Figure 25:
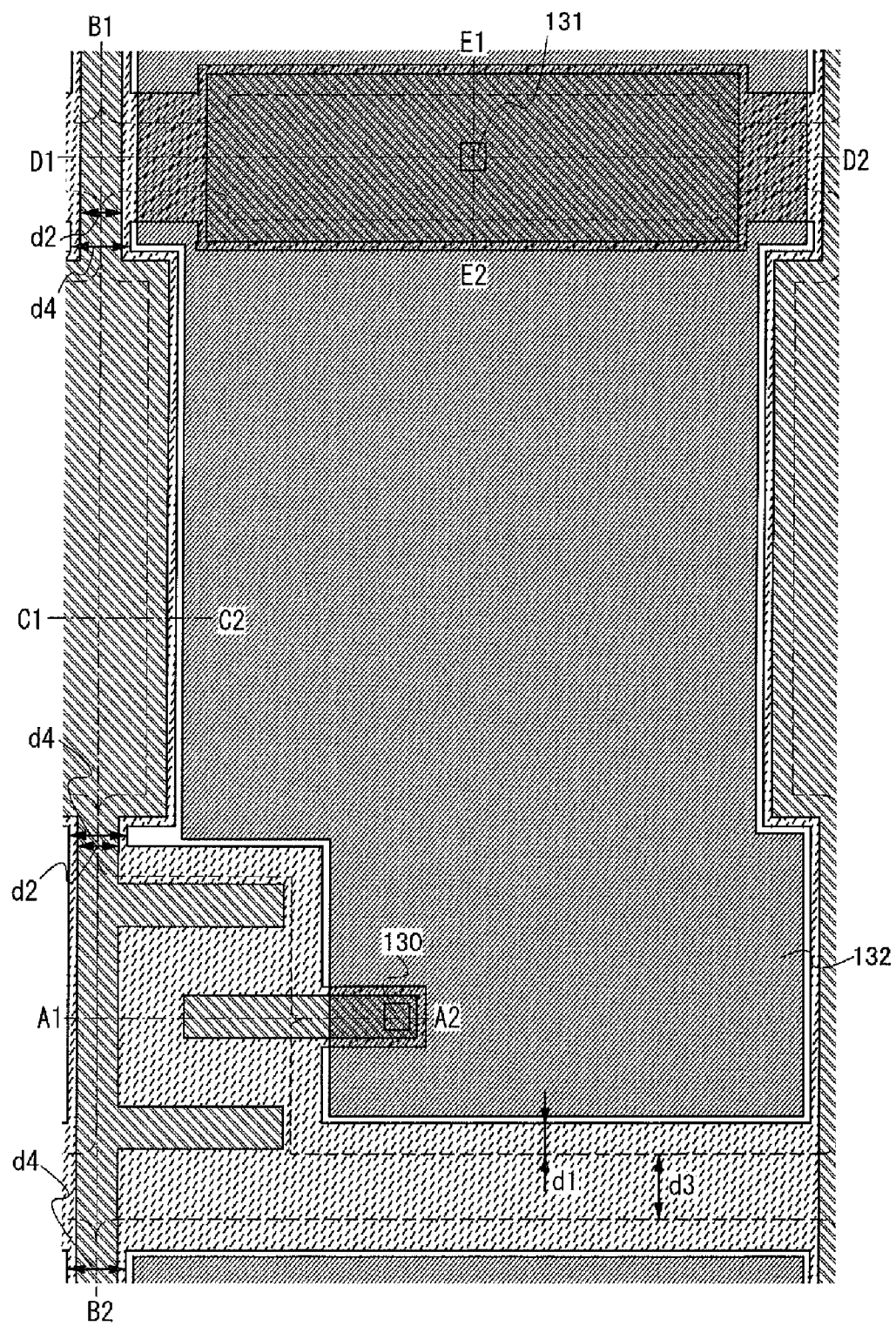
FIG. 25 illustrates an example of a method for manufacturing a thin film transistor and a display device.

FIG. 21, FIG. 22, FIG. 23, FIG. 24, and FIG. 25 are top views of thin film transistors of this embodiment. FIG. 25 is a completion drawing in the situation that formation of a pixel electrode is finished. FIGS. 1A to 1C, FIGS. 2A to 2C, FIGS. 3A to 3C, and FIGS. 4A and 4B are cross-sectional views taken along line A1-A2 in FIG. 21, FIG. 22, FIG. 23, FIG. 24, and FIG. 25. FIGS. 5A to 5C, FIGS. 6A to 6C, FIGS. 7A to 7C, and FIGS. 8A and 8B are cross-sectional views taken along line B1-B2 in FIG. 21, FIG. 22, FIG. 23, FIG. 24, and FIG. 25. FIGS. 9A to 9C, FIGS. 10A to 10C, FIGS. 11A to 11C, and FIGS. 12A and 12B are cross-sectional views taken along line C1-C2 in FIG. 21, FIG. 22, FIG. 23, FIG. 24, and FIG. 25. FIGS. 13A to 13C, FIGS. 14A to 14C, FIGS. 15A to 15C, and FIGS. 16A and 16B are cross-sectional views taken along line D1-D2 in FIG. 21, FIG. 22, FIG. 23, FIG. 24, and FIG. 25. FIGS. 17A to 17C, FIGS. 18A to 18C, FIGS. 19A to 19C, and FIGS. 20A and 20B are cross-sectional views taken along line E1-E2 in FIG. 21, FIG. 22, FIG. 23, FIG. 24, and FIG. 25.

First, a first conductive film 102, an insulating film 104, a semiconductor film 106, an impurity semiconductor film 108, and a second conductive film 110 are formed over a substrate 100. Each of these films may be a single layer or stacked layers including a plurality of films.

The substrate 100 is an insulating substrate. In the case where the present invention is applied to a display device, a glass substrate or a quartz substrate can be used as the substrate 100. In this embodiment, a glass substrate is used.

In the case of using a glass substrate as the substrate 100, it is preferred that a base film (preferably, a silicon nitride film or a silicon nitride oxide film) be provided over the substrate 100. The provision of the base film can prevent entry of an impurity metal element in the glass substrate 100 into a semiconductor layer. This phenomenon can be seen remarkably when the base film includes nitrogen. Further, it is preferred that the base film include halogen (fluorine, chlorine, or bromine) because the entry of the impurity metal element included in the glass substrate 100 into the semiconductor layer can be more effectively prevented. In order that the base film includes halogen, gas used in deposition may include a halogen gas or a gas with a halogen compound, and the base film can be formed as a single layer or stacked layers by a CVD method or a sputtering method.

The first conductive film 102 is formed using a conductive material. The first conductive film 102 can be formed using a conductive material such as a metal, e.g., molybdenum or tungsten, or an alloy including any of these metal materials as a main component. Note that a material which has such heat resistance as to withstand heat in a later step (e.g., formation of the insulating film 104) and be not unintentionally etched or eroded in a later step (e.g., etching of the second conductive film 110) needs to be selected. Only in these conditions, the material of the first conductive film 102 is not limited to a particular material.

In addition, the first conductive film 102 can be formed by, for example, a sputtering method, a CVD method (including a thermal CVD method, a plasma CVD method, and the like), or the like; however, the formation method of the first conductive film 102 is not limited to a particular method.

The insulating film 104 is formed using an insulating material. The insulating film 104 can be formed using, for example, a silicon oxide film, a silicon nitride film, a silicon oxynitride film, a silicon nitride oxide film, or the like. Note that, as in the case of the first conductive film 102, a material which has heat resistance and is not unintentionally etched or eroded in a later step has to be selected. Only in these conditions, the material of the insulating film 104 is not limited to a particular material.

In addition, the insulating film 104 can be formed by, for example, a CVD method (including a thermal CVD method, a plasma CVD method, and the like), a sputtering method, or the like; however, the formation method of the insulating film 104 is not limited to a particular method.

The insulating film 104 serves as a gate insulating film.

The semiconductor film 106 is formed using a semiconductor material. The semiconductor film 106 can be formed using, for example, amorphous silicon formed using a silane gas, or the like. Note that, as in the case of the first conductive film 102 and the like, a material which has heat resistance and is not unintentionally etched or eroded in a later step has to be selected. Only in these conditions, the material of the semiconductor film 106 is not limited to a particular material. For that reason, germanium may be used, for example. Note that the crystallinity of the semiconductor film 106 is not particularly limited either.

In addition, the semiconductor film 106 can be formed by, for example, a CVD method (including a thermal CVD method, a plasma CVD method, and the like), a sputtering method, or the like; however, the formation method of the semiconductor film 106 is not limited to a particular method.

The impurity semiconductor film 108 is a semiconductor film containing an impurity element imparting one conductivity type, and is formed using a semiconductor material gas to which the impurity element imparting one conductivity type is added or the like. For example, the impurity semiconductor film 108 is a silicon film containing phosphorus or boron, which is formed using a silane gas containing phosphine (chemical formula: $PH_3$) or diborane (chemical formula: $B_2H_6$). Note that, as in the case of the first conductive film 102 and the like, a material which has heat resistance and is not unintentionally etched or eroded in a later step has to be selected. Only in these conditions, the material of the impurity semiconductor film 108 is not limited to a particular material. Note that the crystallinity of the impurity semiconductor film 108 is not particularly limited either. In the case where a region capable of an ohmic contact with a source and drain electrode layer is provided in part of the semiconductor layer which is formed using the semiconductor film 106, by doping or the like, the impurity semiconductor film 108 need not be provided.

In the case of manufacturing an n-channel thin film transistor, phosphorus, arsenic, or the like may be used as the impurity element imparting one conductivity type. That is, a silane gas used for formation of the impurity semiconductor film 108 may contain phosphine, arsine (chemical formula: $AsH_3$), or the like at a predetermined concentration. Alternatively, in the case of manufacturing a p-channel thin film transistor, boron or the like may be used as the impurity element imparting one conductivity type. That is, a silane gas used for formation of the impurity semiconductor film 108 may contain diborane or the like at a predetermined concentration.

In addition, the impurity semiconductor film 108 can be formed by, for example, a CVD method (including a thermal CVD method, a plasma CVD method, and the like), or the like; however, the formation method of the impurity semiconductor film 108 is not limited to a particular method.

The second conductive film 110 is formed using a conductive material (a material mentioned as the material of the first conductive film 102, or the like) different from the material used for the first conductive film 102. Here, the "different material" means a material having a different main component. Specifically, a material which is not easily etched by second etching which is described later may be selected. Further, as in the case of the first conductive film 102 and the like, a material which has heat resistance and is not unintentionally etched or eroded in a later step has to be selected. Only in these conditions, the material of the second conductive film 110 is not limited to a particular material.

In addition, the second conductive film 110 can be formed by, for example, a sputtering method, a CVD method (including a thermal CVD method, a plasma CVD method, and the like), or the like. However, the formation method of the second conductive film 110 is not limited to a particular method.

Note that the required heat resistance of the first conductive film 102 is the highest, the required heat resistances of the insulating film 104, the semiconductor film 106, and the impurity semiconductor film 108 become lower in this order, and the required heat resistance of the second conductive film 110 is the lowest. For example, in the case where the semiconductor film 106 is an amorphous semiconductor film containing hydrogen, hydrogen in the semiconductor film 106 is desorbed at approximately 300° C. or more, which results in the change in its electric characteristics. For that reason, it is preferred that a step after the formation of the semiconductor film 106 be performed at a temperature which does not exceed 300° C., for example.

Next, a first resist mask 112 is formed over the second conductive film 110 (see FIG. 1A, FIG. 5A, FIG. 9A, FIG. 13A, and FIG. 17A).

Next, first etching is performed using the first resist mask 112. That is, the insulating film 104, the semiconductor film 106, the impurity semiconductor film 108, and the second conductive film 110 are etched to form a thin-film stack body 114 (see FIG. 1B, FIG. 5B, FIG. 9B, FIG. 13B, FIG. 17B, and FIG. 21). In this case, at least a surface of the first conductive film 102 may be exposed. This etching step is called "first etching." As the first etching, it is preferred that a highly anisotropic etching method (physical etching) be employed, and dry etching may be employed. This is because, by employing a highly anisotropic etching method as the first etching, processing precision of a pattern can be improved. Note that the first etching can be performed by one step when dry etching is employed as the first etching, while it is preferred that the first etching be performed by plural steps when wet etching is employed as the first etching. This is because, in wet etching, the etching rate varies depending on the kind of film to be etched and it is difficult to perform the etching by one step. For that reason, dry etching is preferred to be performed in the first etching.

In the case where a base film is provided between the first conductive film 102 and the substrate 100, the first conductive film 102 may be etched by the first etching. The provision of the base film can prevent unintentionally etching of the substrate 100 in the first etching, whereby an impurity metal element contained in the glass substrate 100 can be prevented from adhering to or entering a semiconductor layer.

Note that as the first etching, dry etching may be performed in three stages, for example. First, etching may be performed using a mixed gas of a $Cl_2$ gas, a $CF_4$ gas, and an $O_2$ gas. Then, etching may be performed using only a $Cl_2$ gas, and lastly, etching may be performed using only a $CHF_3$ gas.

After the first etching, the first resist mask 112 is removed, and oxidation treatment is performed on the thin-film stack body 114 and the first conductive film 102 (see FIG. 1C, FIG. 5C, FIG. 9C, FIG. 13C, and FIG. 17C). Note that the removal of the first resist mask 112 is not always necessary and the oxidation treatment may be performed with the first resist mask 112 provided.

Here, the oxidation treatment may be performed using a method by which a surface of the thin-film stack body 114 and a surface of the first conductive film 102 are oxidized, and the oxidation method is not limited to a particular method. This oxidation treatment can be plasma treatment with oxygen plasma or water plasma, treatment with ozone water, or thermal treatment.

In the case of performing plasma treatment with oxygen plasma or water plasma as the oxidation treatment, for example, a gas containing an oxygen gas or moisture can be introduced into a reaction chamber by an inductively-coupled plasma (ICP) method. An example of the conditions is as follows: the pressure of the reaction chamber is set at approximately 60 Pa, and an RF (13.56 MHz) power of 180 W is applied to the coil electrode and power is not applied to the substrate side so that plasma is generated. Note that there is no particular limitation on a method for generating plasma; in addition to an inductively-coupled plasma (ICP) method, a capacitively-coupled (parallel plate) plasma (CCP) method, an electron cyclotron resonance (ECR) method, a helicon method, or the like may also be employed. It is preferred that a method by which a surface to be oxidized is less damaged be employed.

In the case of performing the oxidation treatment with ozone water, the ozone water to be used is not particularly limited, but ozone water having a concentration with which oxidation treatment is performed may be used. It is preferred that ozone water having a concentration of 1 ppm or more and 20 ppm or less, more preferably, 5 ppm or more and 15 ppm or less be used.

In the case of performing thermal oxidation treatment, a gas containing an oxygen gas or moisture may be introduced into a reaction chamber so as to heat the substrate 100. Here, the temperature of the substrate 100 may be approximately 100° C. or more. In the case where the substrate 100 is a glass substrate, the temperature may be lower than or equal to its strain point.

Alternatively, without limitation to the above description, oxidation treatment may be performed with ozone which is generated by irradiating an oxygen atmosphere or the air with an ultra violet light.

After the above-described oxidation step, an oxidized surface of the first conductive film 102 is removed (see FIG. 2A, FIG. 6A, FIG. 10A, FIG. 14A, and FIG. 18A). This is because, by removing the oxidized surface of the first conductive film 102, variation of etching rates during the second etching can be prevented. For example, in the case where the first conductive film 102 is a tungsten film, the oxidized surface of the first conductive film 102 is mainly formed using tungsten oxide. Tungsten oxide can be removed by cleaning using a weakly acid chemical solution or an alkalescent chemical solution. Alternatively, the cleaning can be performed using pure water.

However, without limitation to the above description, the second etching may be performed without removal of the oxidized surface of the first conductive film 102. For example, in the case where the first conductive film 102 is formed using tungsten and the second etching is performed using chlorine trifluoride (chemical formula: $ClF_3$), the etching rate of tungsten oxide is higher than that of tungsten. Thus, by provision of a tungsten oxide film on a surface of the first conductive film 102, the initial etching rate of the second etching is higher and, when an etched surface reaches a tungsten film, the etching rate becomes lower. For that reason, the second etching can be performed with high controllability. Here, etching rates of tungsten and tungsten oxide in the case of using $ClF_3$ gas are compared.

Figure 30:
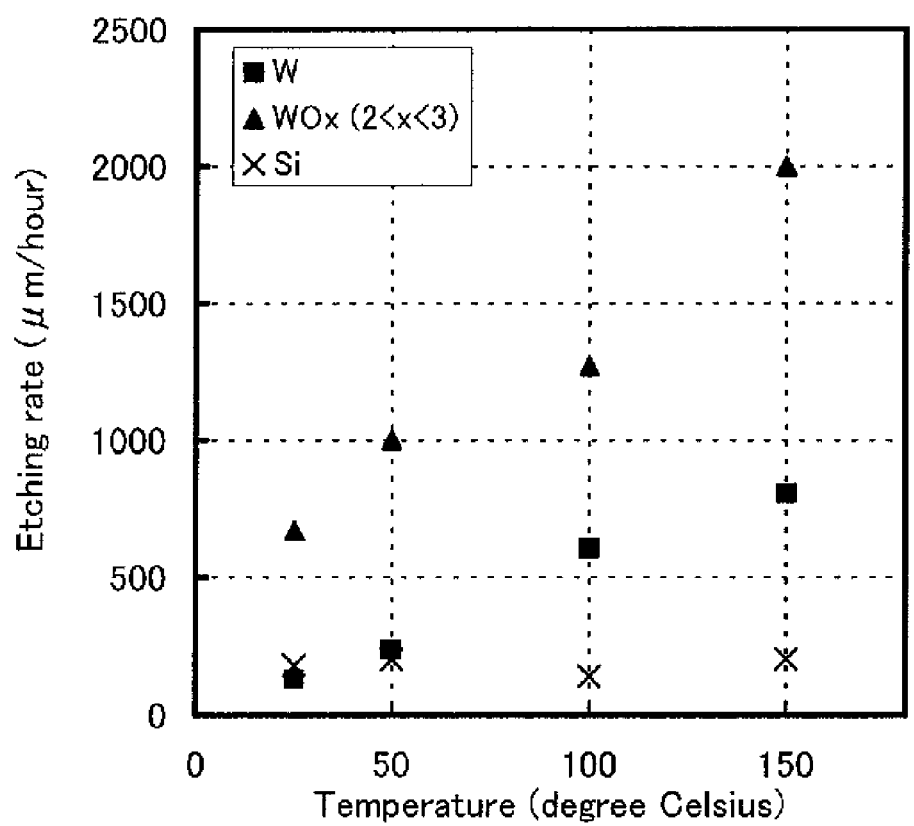
FIG. 30 shows a graph of temperature dependence of etching rates in the case of using a gas of $ClF_3$.

FIG. 30 shows a graph of temperature dependence of etching rates of tungsten and tungsten oxide in the case of using $ClF_3$ gas (see the vertical axis in FIG. 30). The temperatures of the glass substrates were approximately 25° C. (substantially room temperature), 50° C., 100° C., and 150° C. (see the horizontal axis in FIG. 30).

The films for measurement were formed over the glass substrates, and the etching rates were measured using the films. Here, tungsten was deposited by a sputtering method using a tungsten target under conditions where an argon gas (20 sccm) was introduced into a chamber, the pressure was 0.2 Pa, and the power was 1 kW. Tungsten oxide was deposited by a sputtering method using a tungsten target under conditions where an argon gas (80 sccm) and an oxygen gas (20 sccm) were introduced into a chamber, the pressure was 2.8 Pa, and the power was 1.96 kW.

These films were etched under the condition where the pressure inside the chamber was approximately 1200 Pa (approximately 9 Torr), using a mixed gas of a chlorine trifluoride gas (50 sccm) and a nitrogen gas (130 sccm) for 30 minutes. From the results, etching rates (μm/hour) were calculated. When the temperature was 25° C., the etching rate of the tungsten film was 131 μm/hour and the etching rate of the tungsten oxide film was 671 μm/hour. When the temperature was 50° C., the etching rate of the tungsten film was 237 μm/hour and the etching rate of the tungsten oxide film was 1003 μm/hour. When the temperature was 100° C., the etching rate of the tungsten film was 607 μm/hour and the etching rate of the tungsten oxide film was 1272 μm/hour. When the temperature was 150° C., the etching rate of the tungsten film was 807 μm/hour and the etching rate of the tungsten oxide film was 2000 μm/hour.

From the above results, the etching rate of a tungsten oxide film is higher than that of a tungsten film. For that reason, by provision of a tungsten oxide film on a surface of the first conductive film 102, the initial etching rate of the second etching is higher and when an etched surface reaches a tungsten film, the etching rate becomes lower. By oxidation treatment of the first conductive film, accordingly, the second etching can be performed with higher controllability.

In addition, etching rates of both the tungsten films and the tungsten oxide films are increased as the temperature is risen. At 100° C. or more, more preferably, 100° C. to 150° C., time for etching can be shortened, which results in improving throughput.

Note that FIG. 30 also shows the etching rates of silicon for reference. The etching rates of silicon are not increased very much even when a temperature is risen. In consideration of a case where oxidation treatment is not performed sufficiently, it is preferred that the second etching be performed at 100° C. or more, more preferably, 100° C. to 150° C.

Next, second etching is performed. That is, the first conductive film 102 is etched to form a gate electrode layer 116 (see FIG. 2B, FIG. 6B, FIG. 10B, FIG. 14B, FIG. 18B, and FIG. 22). This etching step is called "second etching."

Note that the gate electrode layer 116 forms a gate electrode, a gate wiring, one electrode of a capacitor, a capacitor wiring, and a supporting portion. When a gate electrode layer is referred to as a "gate electrode layer 116A", the gate electrode layer forms a gate wiring and a gate electrode of a thin film transistor. When a gate electrode layer is referred to as a "gate electrode layer 116B" or a "gate electrode layer 116D", the gate electrode layer forms a supporting portion. When a gate electrode layer is referred to as a "gate electrode layer 116C", the gate electrode layer forms a capacitor wiring and one electrode of a capacitor. These wirings and electrodes are collectively referred to as the gate electrode layer 116.

The second etching is performed under such etching conditions that a side surface of the gate electrode layer 116 formed with the first conductive film 102 is provided more on the inside than a side surface of the thin-film stack body 114. In other words, the second etching is performed so that the side surface of the gate electrode layer 116 is in contact with a bottom surface of the thin-film stack body 114 (the width of the gate electrode layer 116 is narrower than that of the thin-film stack body 114 in line A1-A2). Thus, the second etching is performed under such conditions that the etching rate to the first conductive film 102 is high and the etching rate to the other films is low. In particular, it is preferred that the second etching be performed under such conditions that the etching rate to the second conductive film 110 is low and the etching rate to the first conductive film 102 is high. In other words, the second etching may be performed under the conditions that the etching selectivity of the first conductive film 102 to the second conductive film 110 is high. By performing the second etching under such conditions, the gate electrode layer 116 can be formed.

Note that the shape of the side surface of the gate electrode layer 116 is not particularly limited. For example, the shape may be a tapered shape. The shape of the side surface of the gate electrode layer 116 is determined depending on the conditions such as an etching gas used in the second etching.

Here, the phrase "the conditions that the etching rate to the second conductive film 110 is low and the etching rate to the first conductive film 102 is high" or "the conditions that the etching selectivity of the first conductive film 102 to the second conductive film 110 is high" means conditions satisfying the following first requirement and second requirement.

Figure 2A:
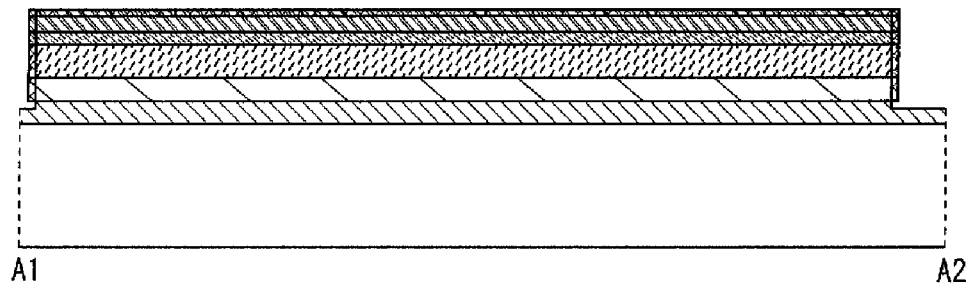
FIGS. 2A to 2C illustrate an example of a method for manufacturing a thin film transistor and a display device.
Figure 2B:
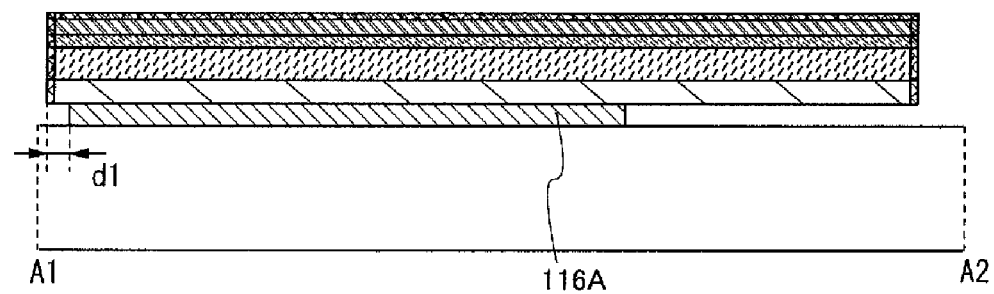

The first requirement is that the gate electrode layer 116 is left in a necessary place. The places necessarily provided with the gate electrode layer 116 are regions indicated by dotted lines in FIG. 22, FIG. 23, FIG. 24, and FIG. 25. That is, the gate electrode layer 116 may be left so as to form a gate wiring, a capacitor wiring, and a supporting portion after the second etching. In order that the gate electrode layer forms the gate wiring and the capacitor wiring, the second etching needs to be performed so as not to disconnect these wirings. As illustrated in FIG. 2B and FIG. 25 for example, the side surface of the gate electrode layer 116 is preferably more on the inside than the side surface of the thin-film stack body 114 by a distance $d_1$, and the distance $d_1$ may be set as appropriate by a practitioner depending on the layout.

The second requirement is that a minimum width $d_3$ of the gate wiring and the capacitor wiring formed with the gate electrode layer 116 and a minimum width $d_2$ of a source wiring formed by a source and drain electrode layer 120A have appropriate values (see FIG. 25). When the second conductive film 110 is etched by the second etching, the minimum width $d_2$ of the source wiring is reduced, and the current density of the source wiring becomes excessive, which result in degrading electric characteristics. For that reason, the second etching is performed under the conditions that the etching rate of the first conductive film 102 is not too high and the etching rate of the second conductive film 110 is as low as possible.

However, as described above, in the case where a surface of the second conductive film 110 is oxidized, the etching rate to the second conductive film 110 in the second etching is not necessarily considered but the etching rate to the oxide film formed over the surface of the second conductive film 110 should be considered.

It is acceptable as long as there is at least one portion where the width of the semiconductor layer overlapping with the source wiring is a minimum width $d_4$ between the gate wiring and the capacitor wiring which is adjacent to the gate wiring. It is preferred that the width of the semiconductor layer in a region in contact with the gate wiring (for example, a region between the gate wiring and the supporting portion) and a region in contact with the capacitor wiring (for example, a region between the capacitor wiring and the supporting portion) be the minimum width $d_4$ as illustrated in FIG. 25. Note that the minimum width $d_4$ of the semiconductor layer is set smaller than approximately twice the distance $d_1$. In other words, the distance $d_1$ is set larger than approximately half the minimum width $d_4$ of the semiconductor layer.

In addition, it is preferred that the width of the electrode in a portion electrically connected to a pixel electrode layer, which is formed of the source and drain electrode layer, be equal to the minimum width $d_2$ of the source wiring.

As described above, the second etching under the condition in which side-etching can be performed is very important. This is because, by the second etching in which the first conductive film 102 is side-etched, the gate wiring and capacitor wiring, which are adjacent to each other and are formed of the gate electrode layer 116, can be formed to be insulated from each other (see FIG. 22). Here, since the second etching includes side-etching, the second etching proceeds in a substantially isotropic manner.

Here, "side-etching" means etching in which a film is etched in not only a thickness direction of the film to be etched (a direction perpendicular to the substrate surface or a direction perpendicular to the surface of a base of the film to be etched) but also in a direction perpendicular to the thickness direction (a direction parallel to the substrate surface or a direction parallel to the surface of the base of the film to be etched). An end portion of the film subjected to side-etching can have various shapes depending on the etching rate of an etching gas or the like to the film to be etched. The end portion is formed with a curved surface in many cases.

By forming the gate electrode layer 116 employing side-etching, an additional photomask does not have to be used for formation of the gate electrode layer 116.

Figure 22:
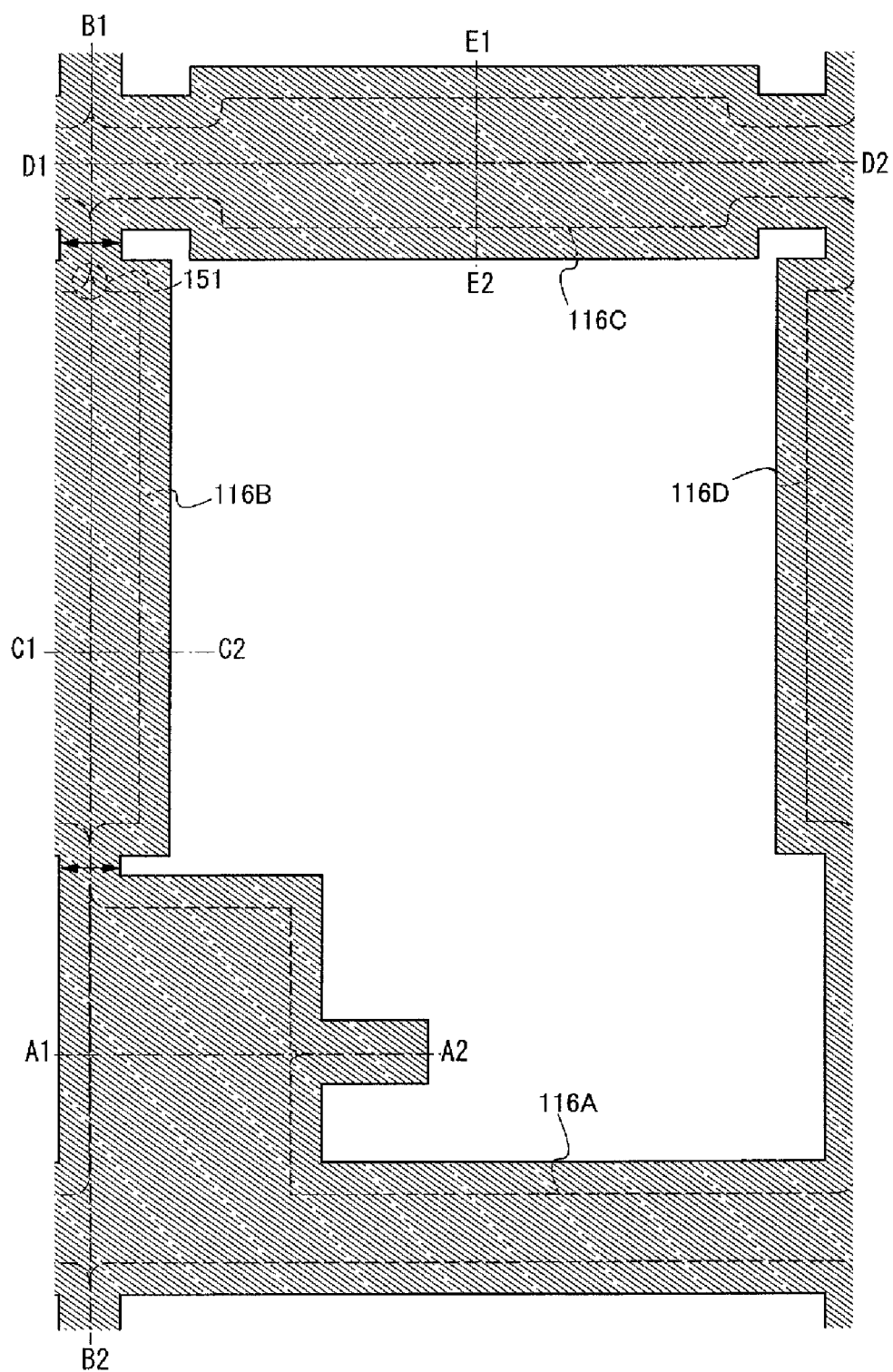
FIG. 22 illustrates an example of a method for manufacturing a thin film transistor and a display device.
Figure 23:
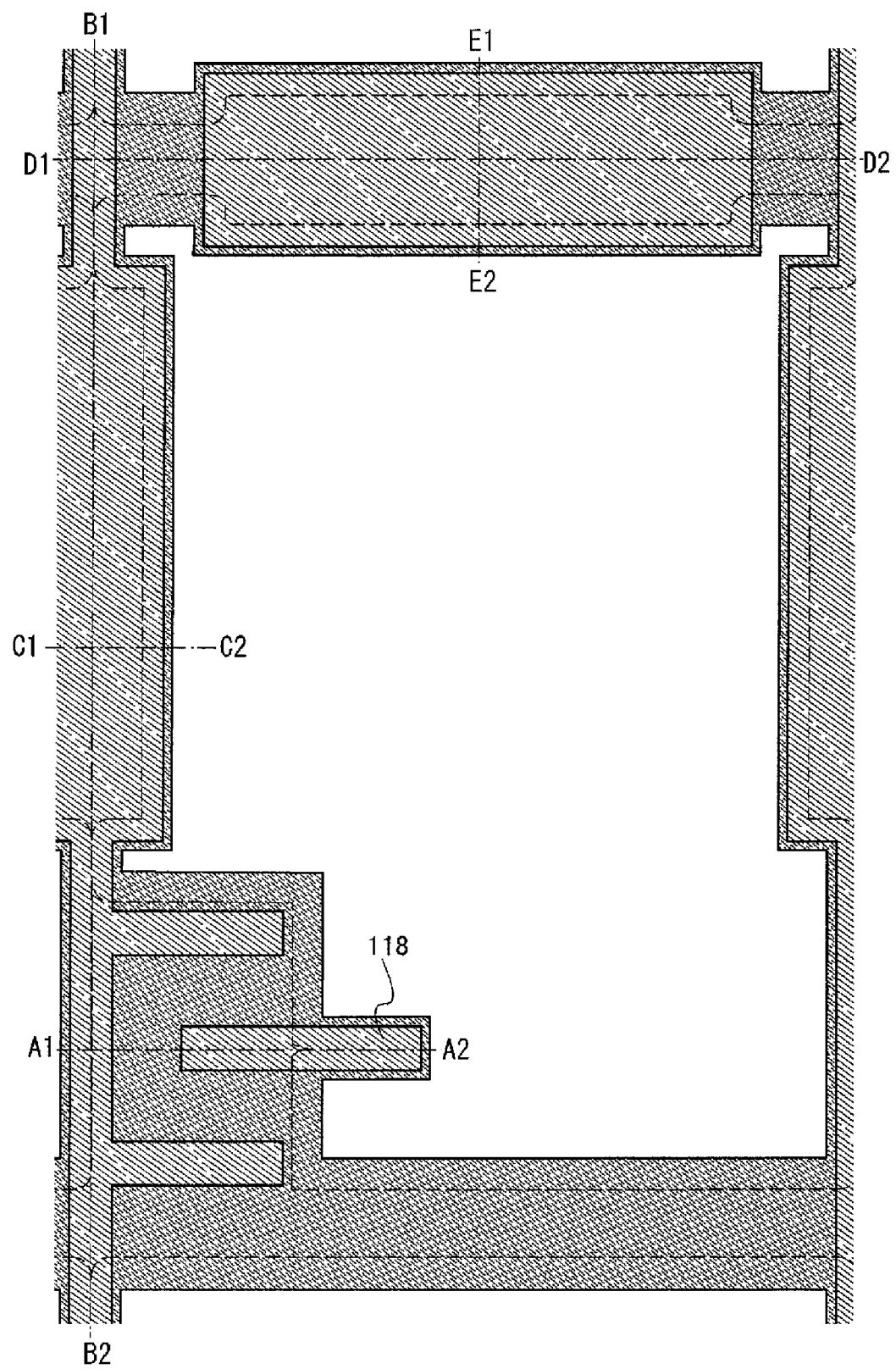
FIG. 23 illustrates an example of a method for manufacturing a thin film transistor and a display device.
Figure 24:
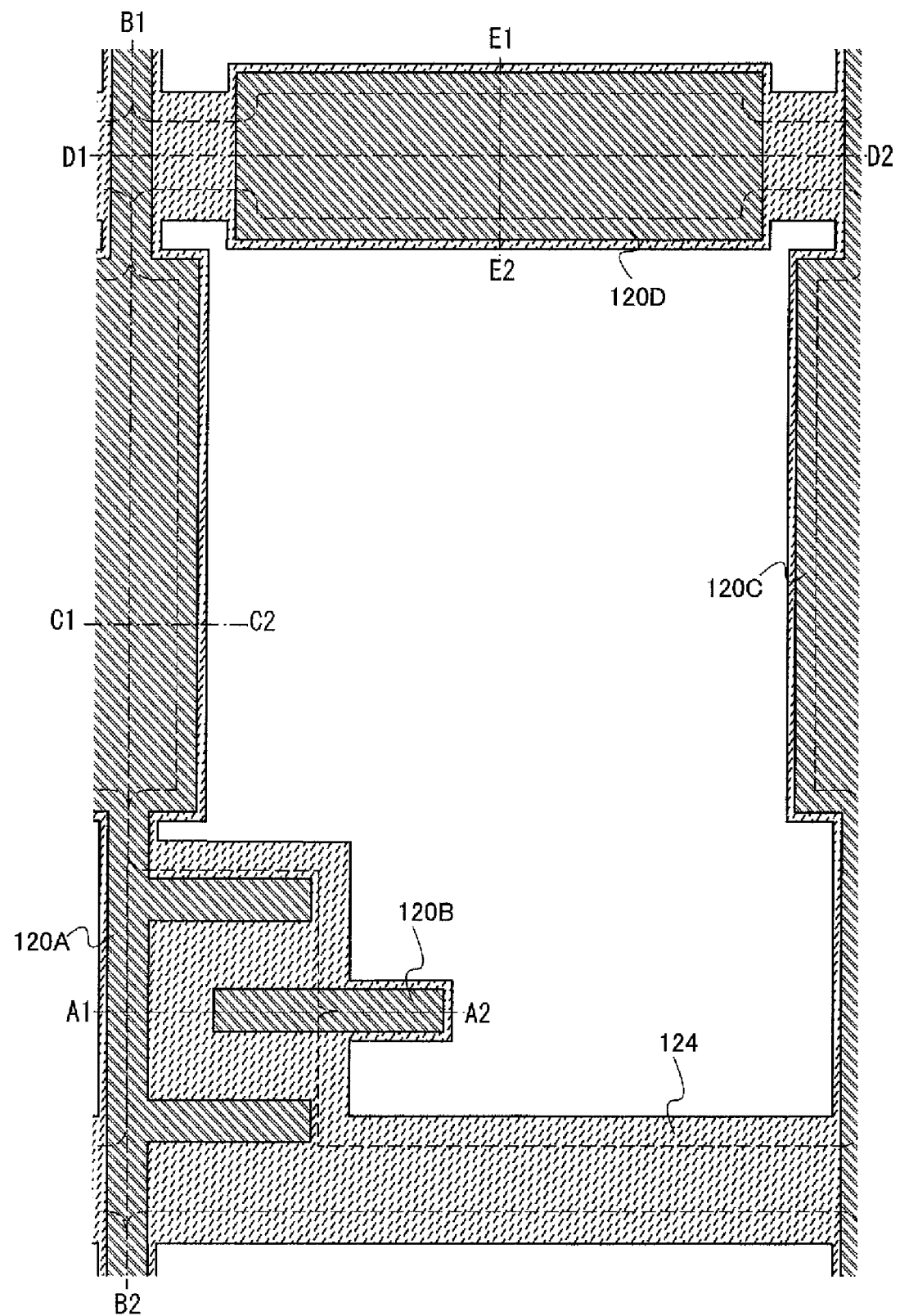
FIG. 24 illustrates an example of a method for manufacturing a thin film transistor and a display device.

As illustrated in FIG. 22, the thin-film stack body 114 formed by the first etching is designed to be thin in a portion in contact with a supporting portion which is formed by the gate electrode layer 116B and the gate electrode layer 116D (the portions indicated by the arrows in FIG. 22). With this structure, the gate electrode layer 116A and the gate electrode layer 116B or the gate electrode layer 116D can be disconnected to be insulated from each other by the second etching.

Figure 26:
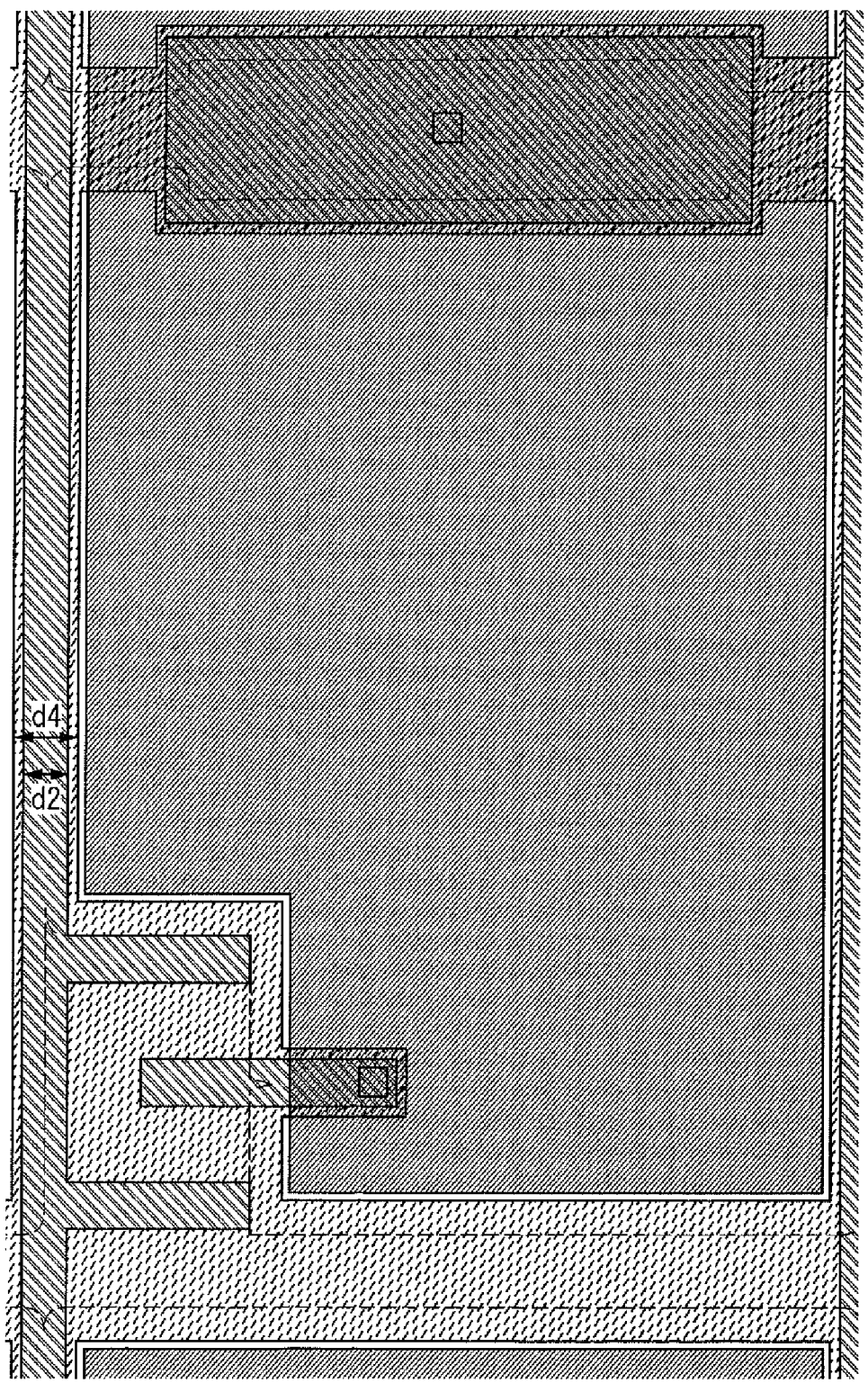
FIG. 26 illustrates an example of a method for manufacturing a thin film transistor and a display device.

The gate electrode layer 116B and the gate electrode layer 116D illustrated in FIG. 22 each serve as a supporting portion which supports the thin-film stack body 114. The existence of the supporting portion can prevent peeling of a film such as an insulating film 104 formed over the gate electrode layer. Further, by the existence of the supporting portion, a cavity region formed in contact with the gate electrode layer 116 by the second etching can be prevented from being larger than necessary. Furthermore, the existence of the supporting portion is preferred because it can prevent break or damage of the thin-film stack body 114 due to its own weight, and thus, yield is increased. However, the present invention is not limited to the mode with the supporting portion, and the supporting portion is not necessarily provided. An example of a top view of a mode without the supporting portion (corresponding to FIG. 25) is illustrated in FIG. 26.

The second etching is performed by dry etching. Here, for example, in the case where the dry etching is performed using $ClF_3$ gas, tungsten may be deposited for the first conductive film 102, as described above. Alternatively, molybdenum may be deposited for the first conductive film 102. In this case, the material which forms the second conductive film 110 is not particularly limited, and any material may be used as long as an oxide film of the material which forms the second conductive film 110 is not etched, or not easily etched, by $ClF_3$ gas. For example, aluminum, titanium, or the like may be deposited for the second conductive film 110. For example, in a case where aluminum is deposited as the second conductive film 110, a surface of aluminum is fluoridated by $ClF_3$ gas, and thus, etching does not easily proceed.

As described above, in the case of using $ClF_3$ gas as an etching gas, it is preferred that molybdenum or tungsten be deposited as the first conductive film 102, and aluminum or titanium be deposited as the second conductive film 110. An alloy of titanium and aluminum may also be deposited as the second conductive film 110. Alternatively, titanium nitride may be deposited as the first conductive film 102.

Note that titanium can be etched by $ClF_3$ gas at 150° C. or more. Thus, in the case of using titanium as the second conductive film 110, the second etching is performed in such a manner that the substrate temperature is lower than 150° C.

Instead of $ClF_3$, an etching gas used in the second etching can be $XeF_2$ which is a fluorine-based corrosive gas.

Note that the progress of etching can be facilitated by setting a high temperature inside the reaction chamber. In that manner, a material which is not easily etched at room temperature can be etched in some cases. Note that the etching selectivity is not high enough in some cases. Alternatively, the progress of etching can be facilitated by reducing a pressure in the reaction chamber. In that manner, a material which is not easily etched at room temperature can be etched in some cases.

Dry etching as the second etching makes a step of drying or the like unnecessary, which results in improving throughput.

As illustrated in FIG. 22, the gate electrode layer 116 has a horn (e.g., a horn 151) when seen from the above. This is because, since the second etching for forming the gate electrode layer 116 is substantially isotropic, etching is performed so that the distance $d_1$ between the side surface of the gate electrode layer 116 and the side surface of the thin-film stack body 114 is substantially uniform.

Next, a second resist mask 118 is formed. Note that the case where the second resist mask 118 is formed after the second etching has been described here; however, the present invention is not limited to this and the second etching may be performed after formation of the second resist mask 118. However, in that case, the second resist mask 118 is often made to recede (reduce); thus, it is preferred that the second resist mask 118 be formed after the second etching as described above.

Note that in the case where the second etching is performed after formation of the second resist mask 118, it is preferred that oxidation treatment be performed with ozone which is generated by irradiating an oxygen atmosphere or the air with an ultra violet light because the damage of the second resist mask 118 is small. In the case of performing thermal oxidation treatment, the substrate temperature may be approximately 100° C. to 200° C. Note that the shape of the resist can be curved.

Next, the second conductive film 110 in the thin-film stack body 114 is etched using the second resist mask 118, so that the source and drain electrode layer 120 is formed (see FIG. 2C, FIG. 6C, FIG. 10C, FIG. 14C, FIG. 18C, and FIG. 23). Here, as the etching conditions, the conditions by which films other than the second conductive film 110 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the source and drain electrode layer 120 forms a source electrode and a drain electrode of the thin film transistor, the source wiring, the electrode which electrically connects the thin film transistor and the pixel electrode to each other, and the other electrode of the capacitor functioning as a storage capacitor. When a source and drain electrode layer is referred to as the "source and drain electrode layer 120A" or a "source and drain electrode layer 120C", the source and drain electrode layer forms one of a source electrode and a drain electrode of a thin film transistor or a source wiring. When a source and drain electrode layer is referred to as a "source and drain electrode layer 120B", the source and drain electrode layer forms the other of the source electrode and the drain electrode of the thin film transistor and an electrode which electrically connects the thin film transistor and the pixel electrode to each other. When a source and drain electrode layer is referred to as a "source and drain electrode layer 120D", the source and drain electrode layer forms the other electrode of the capacitor. These source and drain electrode layers are collectively referred to as the source and drain electrode layer 120.

Note that although either wet etching or dry etching may be performed for etching the second conductive film 110 in the thin-film stack body 114, dry etching is preferred.

The impurity semiconductor film 108 and an upper portion of the semiconductor film 106 (back channel portion) in the thin-film stack body 114 are then etched to form a source and drain region 122 (see FIG. 3A, FIG. 7A, FIG. 11A, FIG. 15A, FIG. 19A, and FIG. 24). Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that although either dry etching or wet etching can be performed for etching the impurity semiconductor film 108 and the upper portion of the semiconductor film 106 (back channel portion) in the thin-film stack body 114, dry etching is preferred.

Figure 3A:
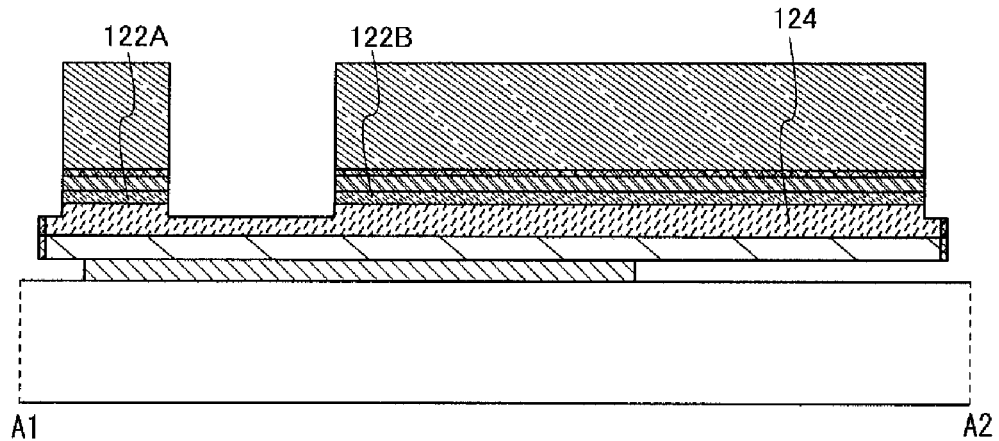
FIGS. 3A to 3C illustrate an example of a method for manufacturing a thin film transistor and a display device.
Figure 3B:
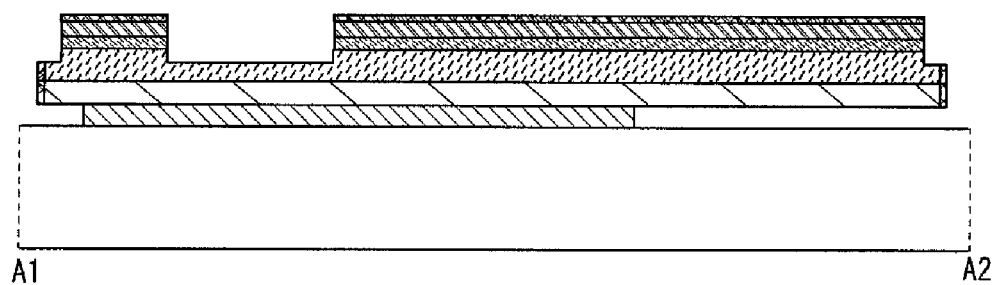
Figure 3C:
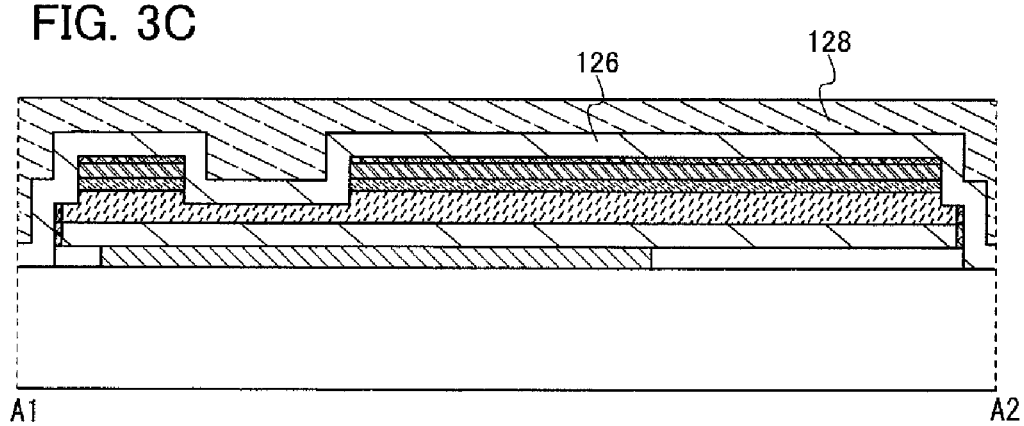

The second resist mask 118 is then removed (see FIG. 3B, FIG. 7B, FIG. 11B, FIG. 15B, and FIG. 19B), and a thin film transistor is thus completed (see FIG. 3B). As described above, the thin film transistor can be manufactured using two photomasks.

Figure 2C:
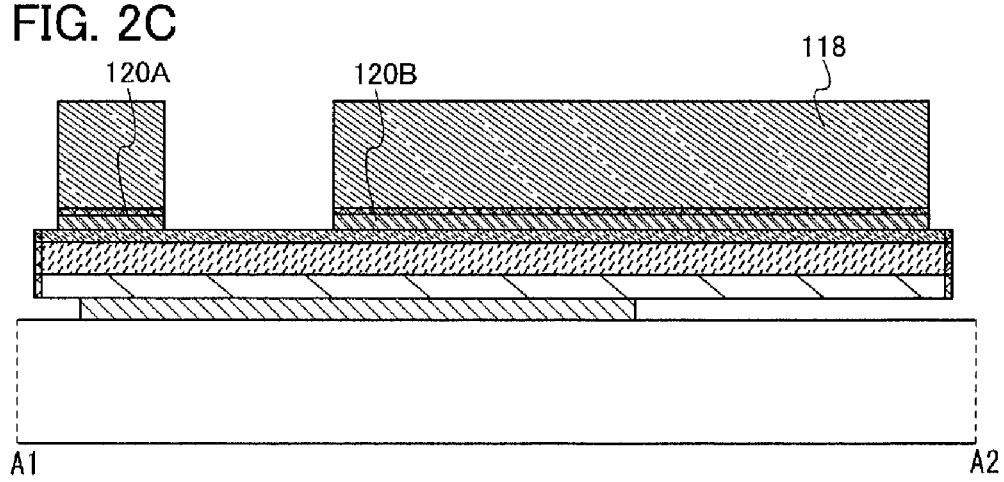

Note that, the steps described with reference to FIG. 2C and FIG. 3A are collectively referred to as "third etching." The third etching may be performed in separate steps as described above or may be performed in a single step.

A protective insulating film is formed so as to cover the thin film transistor which is formed in the above-described manner. Although the protective insulating film may be formed of only the first protective insulating film 126, the protective insulating film here is formed of the first protective insulating film 126 and a second protective film 128 (see FIG. 3C, FIG. 7C, FIG. 11C, FIG. 15C, and FIG. 19C). The first protective insulating film 126 may be formed in a manner similar to the insulating film 104.

The second protective insulating film 128 is formed by a method by which the surface thereof becomes substantially planar. This is because, when the surface of the second protective insulating film 128 is substantially planar, disconnection or the like of a pixel electrode layer 132 formed over the second protective insulating film 128 can be prevented. Note that the phrase "substantially planar" means planarity in such an extent that the aforementioned aim can be achieved, and does not mean that high planarity is required.

The second protective insulating film 128 can be formed, for example, by a spin coating method or the like using photosensitive polyimide, acrylic, epoxy resin, or the like. Note that the present invention is not limited to these materials and the formation method.

Next, a first opening 130 and a second opening 131 are formed in the protective insulating film (see FIG. 4A, FIG. 8A, FIG. 12A, FIG. 16A, and FIG. 20A). The first opening 130 and the second opening 131 are formed so as to reach at least the surface of the source and drain electrode layer 120. The formation method of the first opening 130 and the second opening 131 is not limited to a particular method and may be determined as appropriate by a practitioner in accordance with the diameter of the first opening 130 or the like. For example, the first opening 130 and the second opening 131 can be formed by dry etching using photolithography. Note that by formation of the first opening 130, even an oxide film provided on a surface of the source and drain electrode layer 120 is removed.

Note that in the case of forming the openings by photolithography, one photomask is used.

Next, the pixel electrode layer 132 is formed over the protective insulating film (see FIG. 4B, FIG. 8B, FIG. 12B, FIG. 16B, FIG. 20B, and FIG. 25). The pixel electrode layer 132 is formed so as to be electrically connected to the source and drain electrode layer 120 through the openings. Specifically, the pixel electrode layer 132 is formed so as to be electrically connected to the source and drain electrode layer 120B through the first opening 130 and electrically connected to the source and drain electrode layer 120D through the second opening 131. It is preferred that the pixel electrode layer 132 be formed of a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like can be given. The film of the conductive material having a light-transmitting property may be formed by a sputtering method, a CVD method, or the like; however, the present invention is not limited to a particular method. In addition, the pixel electrode layer 132 may have a single layer or stacked layers including a plurality of films.

In this embodiment, only the pixel electrode layer 132 is formed using the conductive material having a light-transmitting property; however, the present invention is not limited to this. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate in accordance with this embodiment (so-called array process) is completed. As described in this embodiment, the thin film transistor can be manufactured using two photomasks in such a manner that the gate electrode layer is formed utilizing side-etching.

Figure 4A:
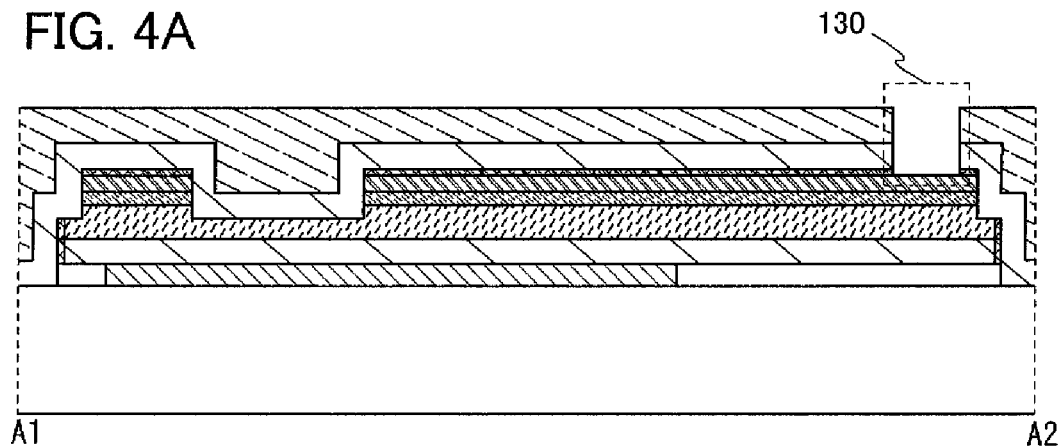
FIGS. 4A and 4B illustrate an example of a method for manufacturing a thin film transistor and a display device.
Figure 4B:
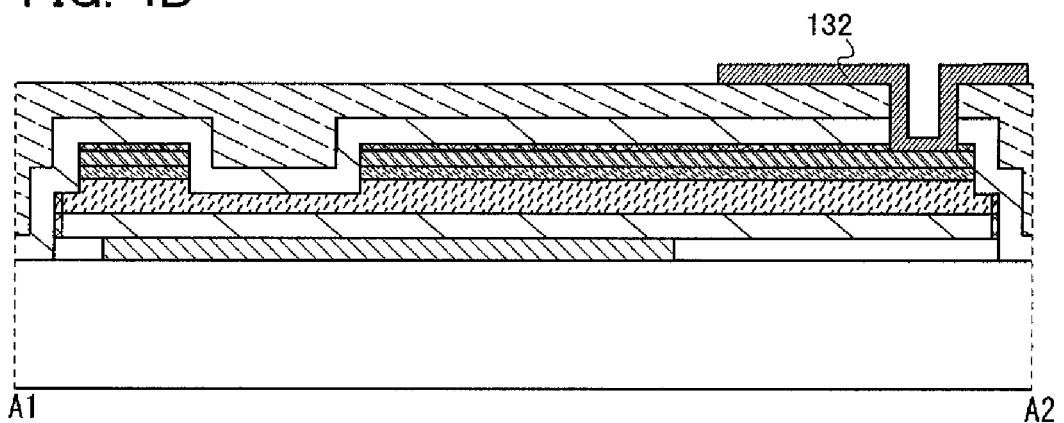
Figure 5A:
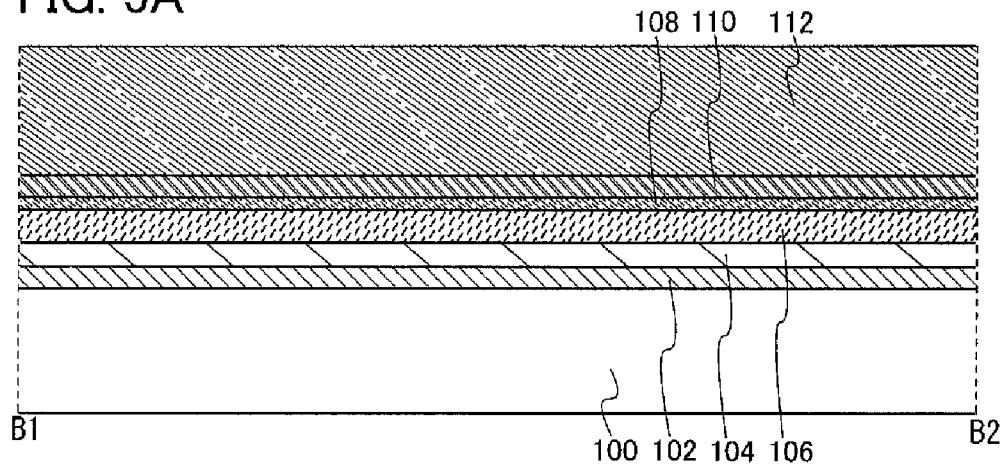
FIGS. 5A to 5C illustrate an example of a method for manufacturing a thin film transistor and a display device.
Figure 5B:
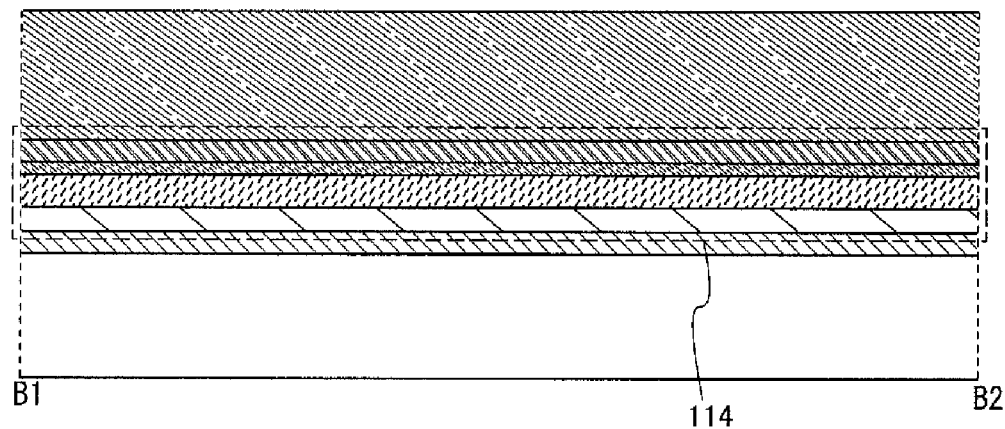
Figure 5C:
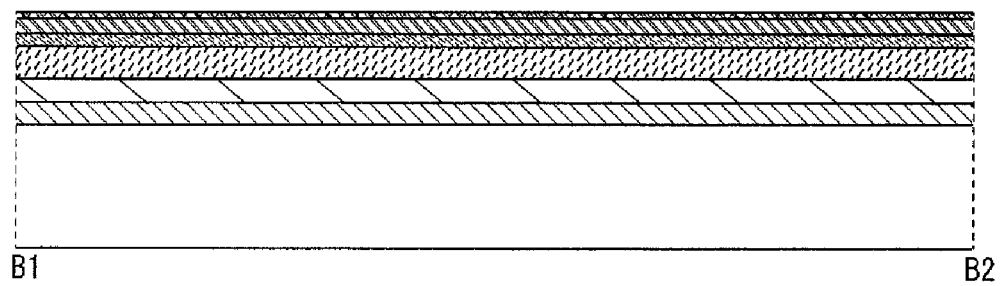
Figure 6A:
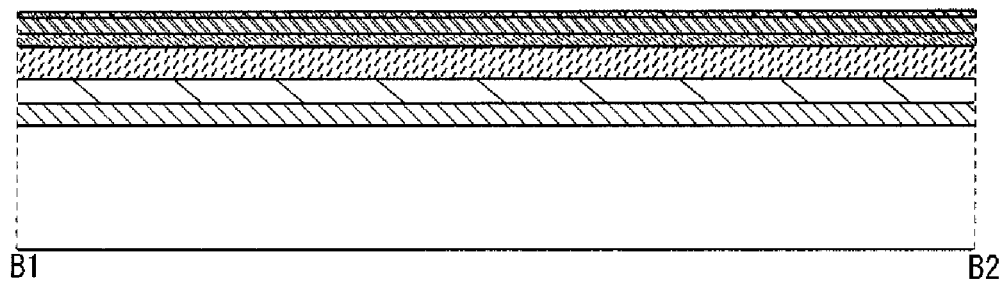
FIGS. 6A to 6C illustrate an example of a method for manufacturing a thin film transistor and a display device.
Figure 6B:
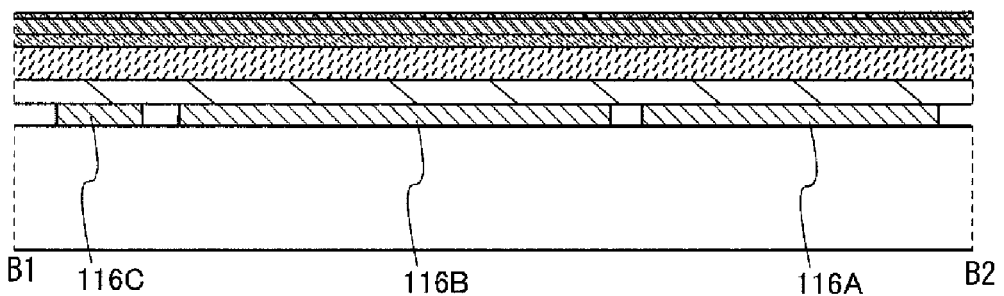
Figure 6C:
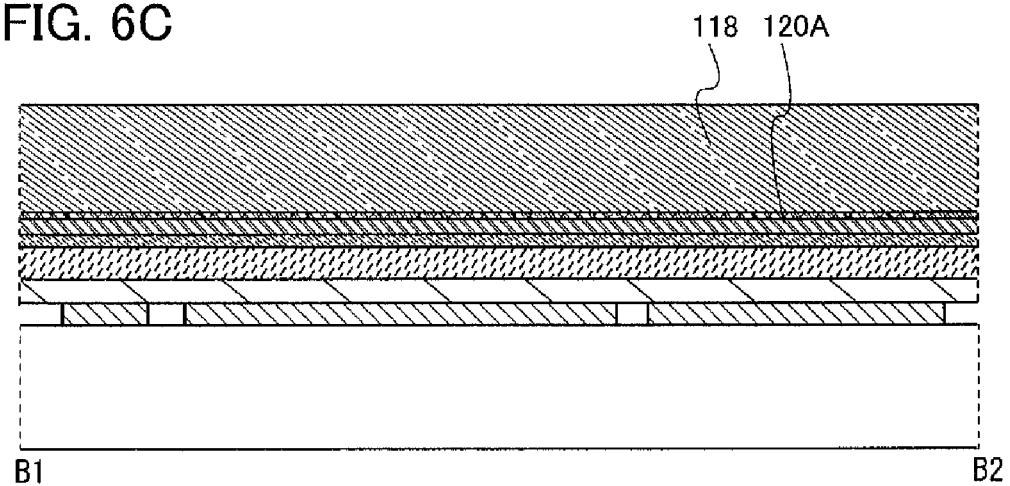
Figure 7A:
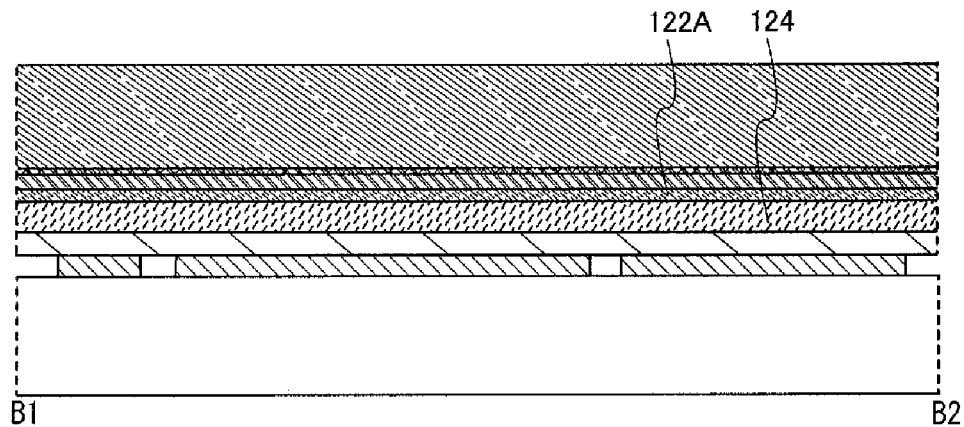
FIGS. 7A to 7C illustrate an example of a method for manufacturing a thin film transistor and a display device.
Figure 7B:
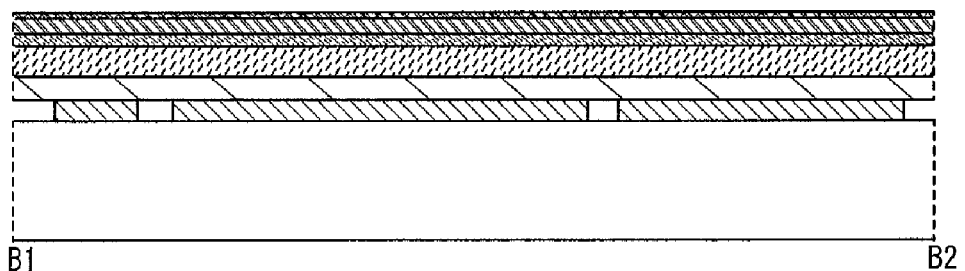
Figure 7C:
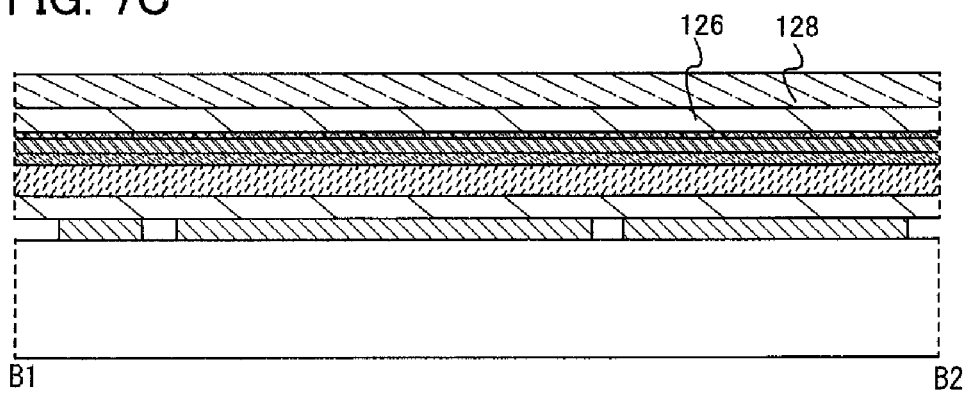
Figure 8A:
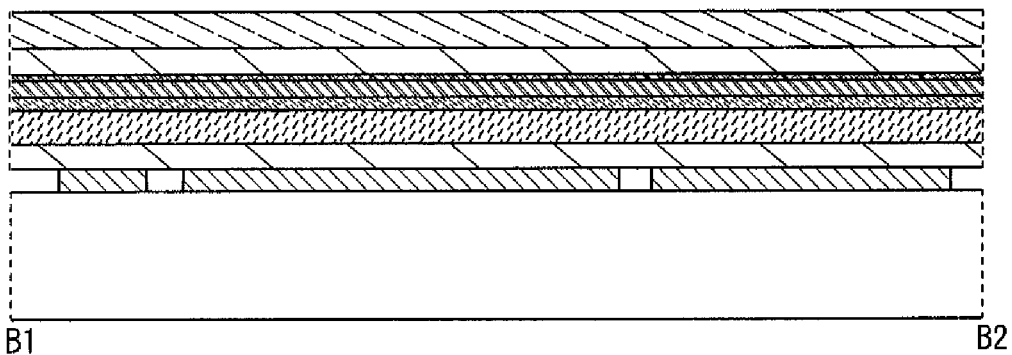
FIGS. 8A and 8B illustrate an example of a method for manufacturing a thin film transistor and a display device.
Figure 8B:
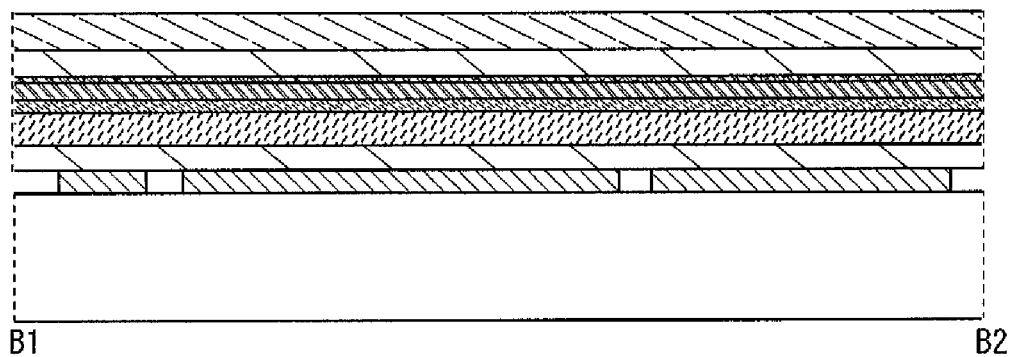
Figure 9A:
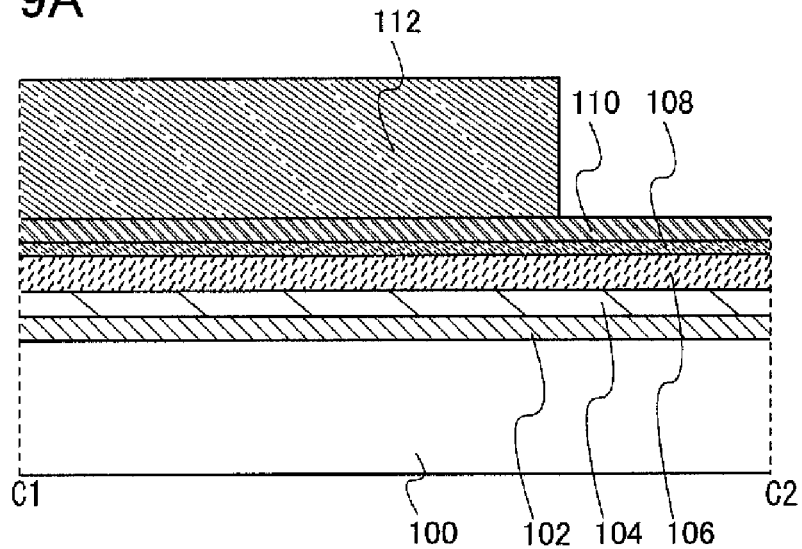
FIGS. 9A to 9C illustrate an example of a method for manufacturing a thin film transistor and a display device.
Figure 9B:
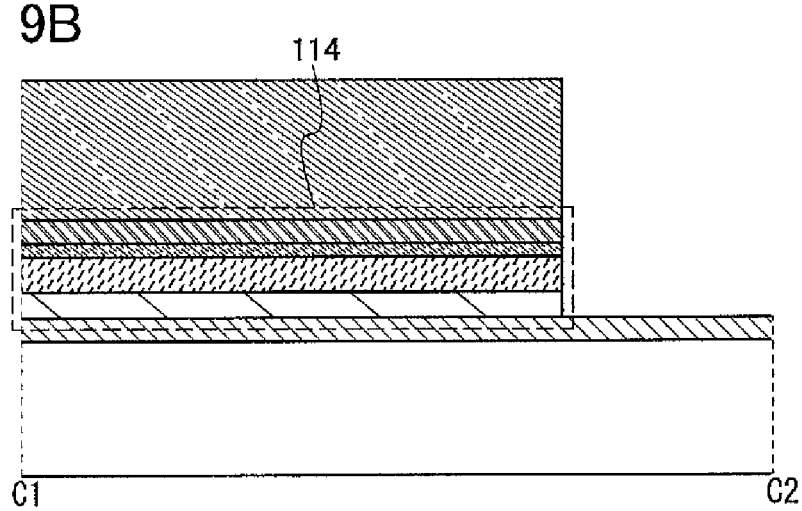
Figure 9C:
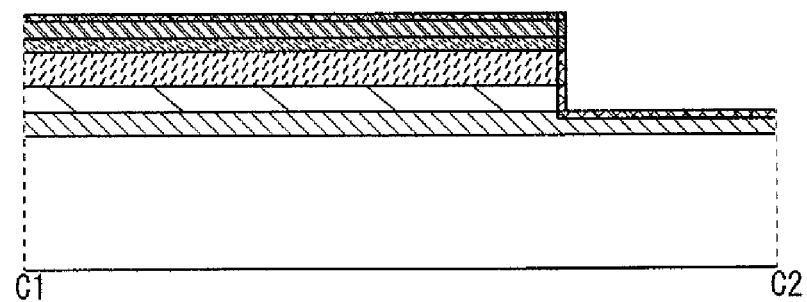
Figure 10A:
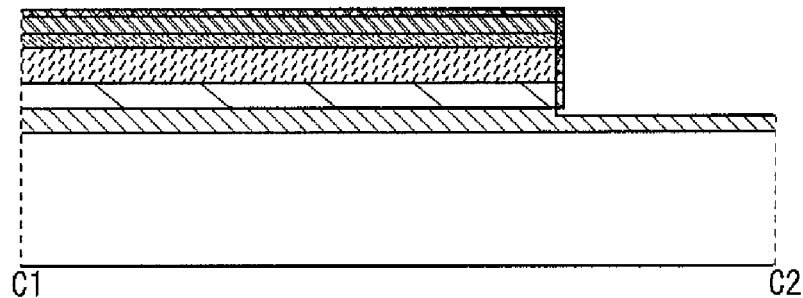
FIGS. 10A to 10C illustrate an example of a method for manufacturing a thin film transistor and a display device.
Figure 10B:
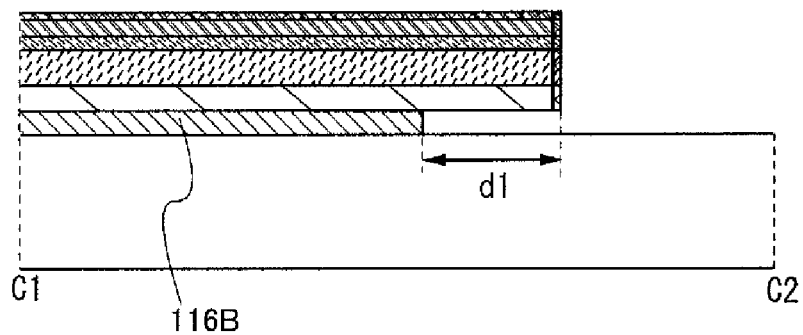
Figure 10C:
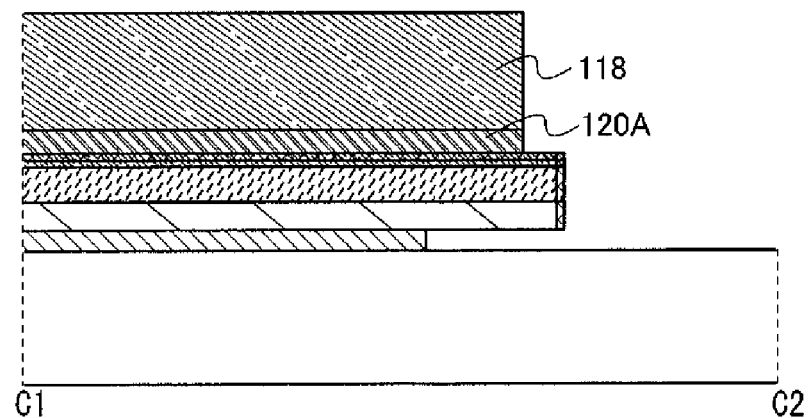
Figure 11A:
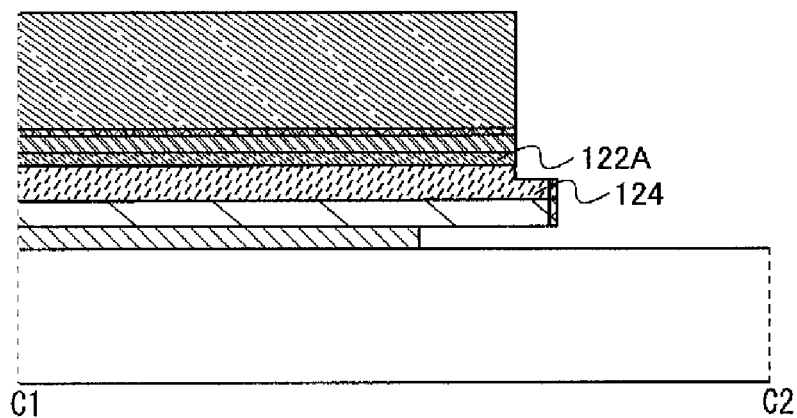
FIGS. 11A to 11C illustrate an example of a method for manufacturing a thin film transistor and a display device.
Figure 11B:
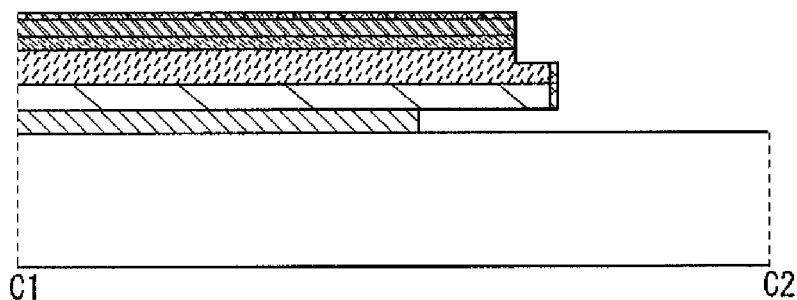
Figure 11C:
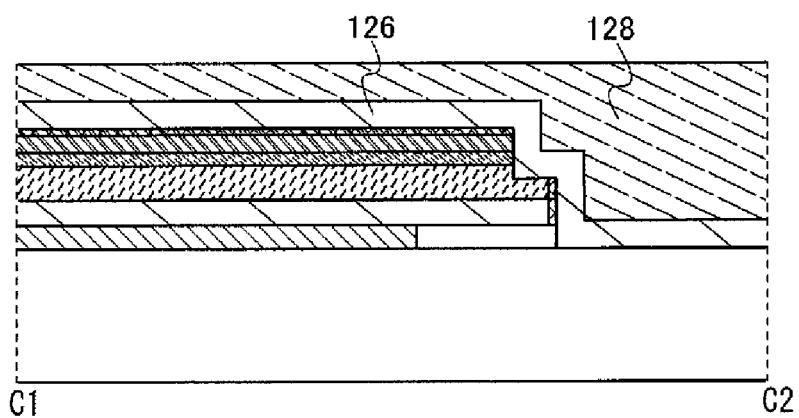
Figure 12A:
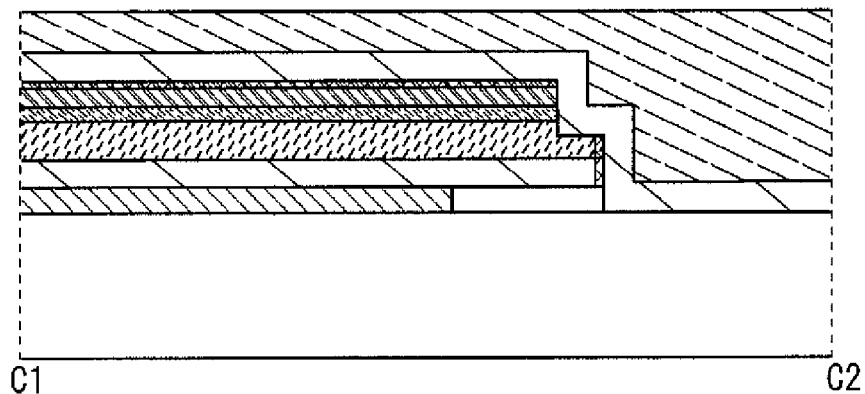
FIGS. 12A and 12B illustrate an example of a method for manufacturing a thin film transistor and a display device.
Figure 12B:
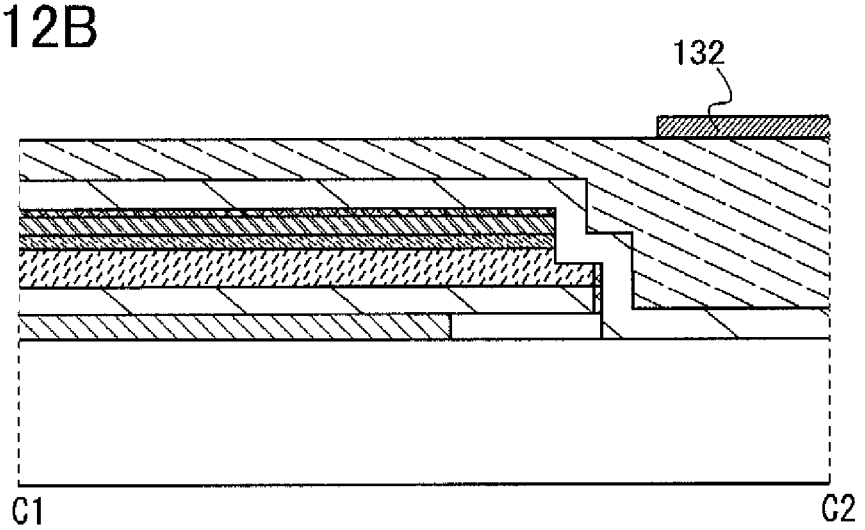
Figure 13A:
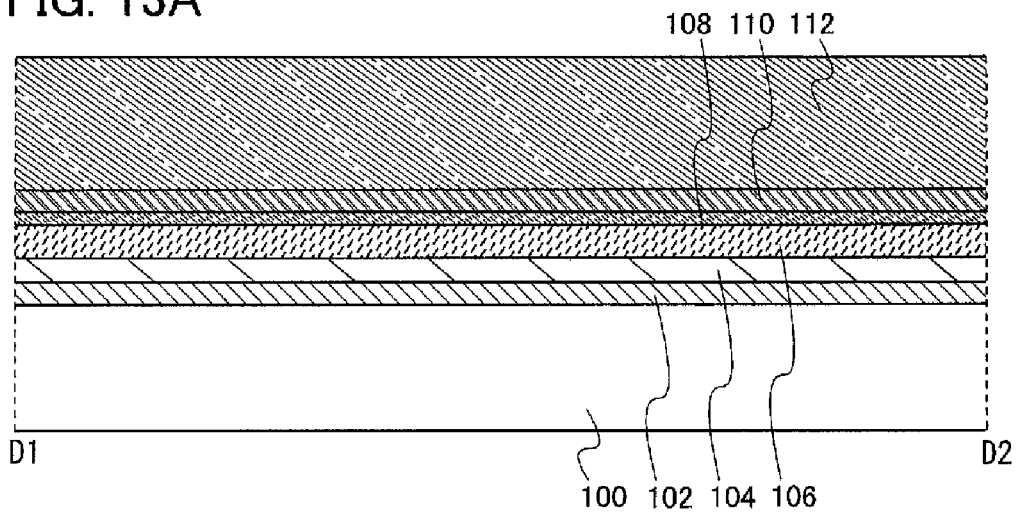
FIGS. 13A to 13C illustrate an example of a method for manufacturing a thin film transistor and a display device.
Figure 13B:
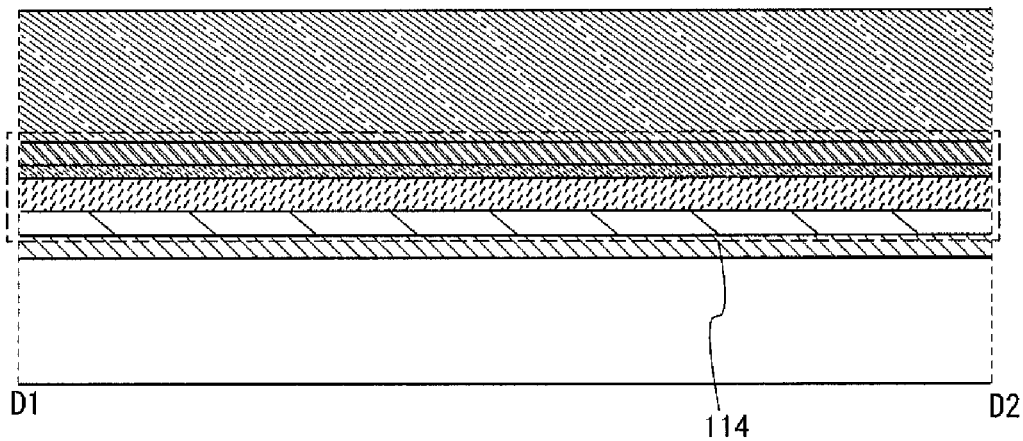
Figure 13C:
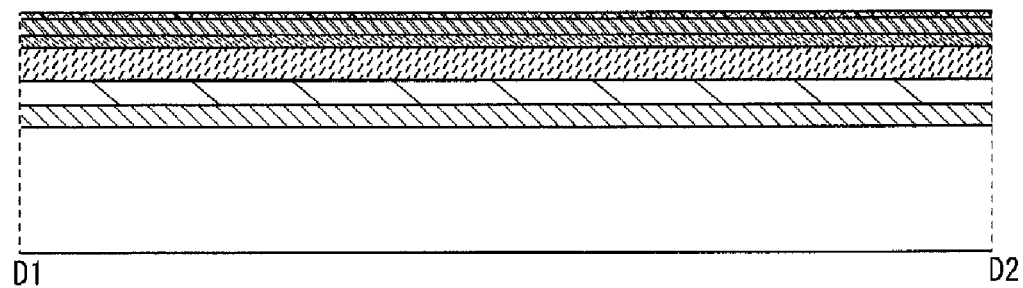
Figure 14A:
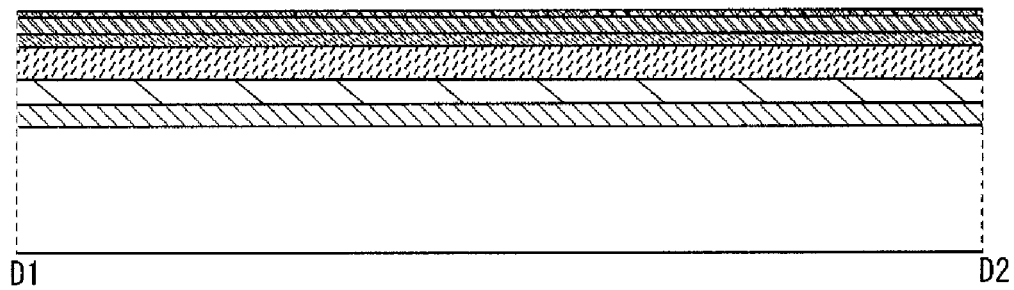
FIGS. 14A to 14C illustrate an example of a method for manufacturing a thin film transistor and a display device.
Figure 14B:
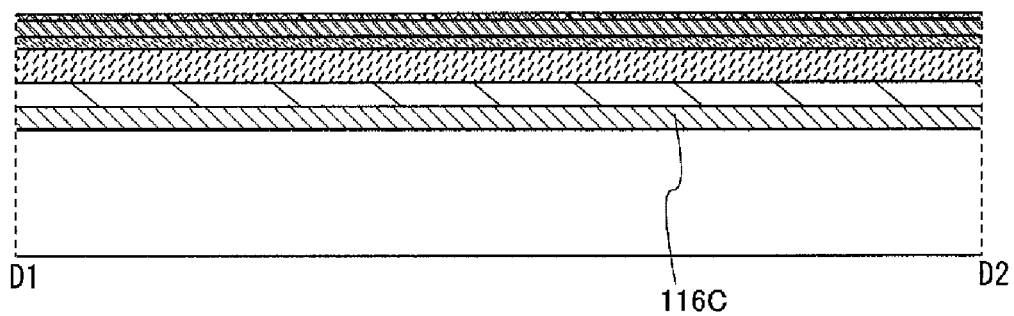
Figure 14C:
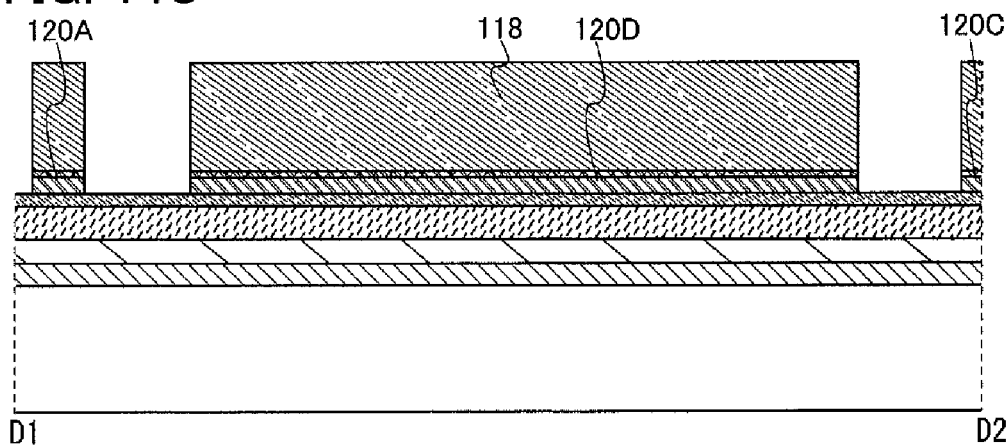
Figure 15A:
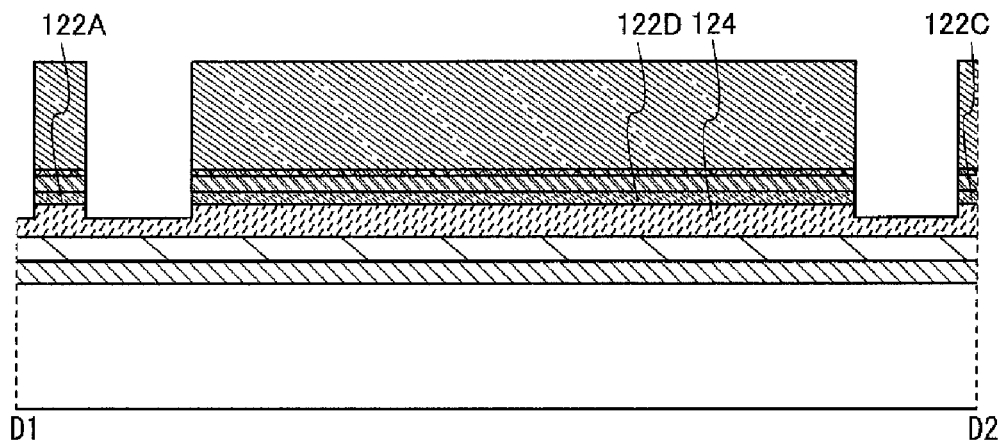
FIGS. 15A to 15C illustrate an example of a method for manufacturing a thin film transistor and a display device.
Figure 15B:
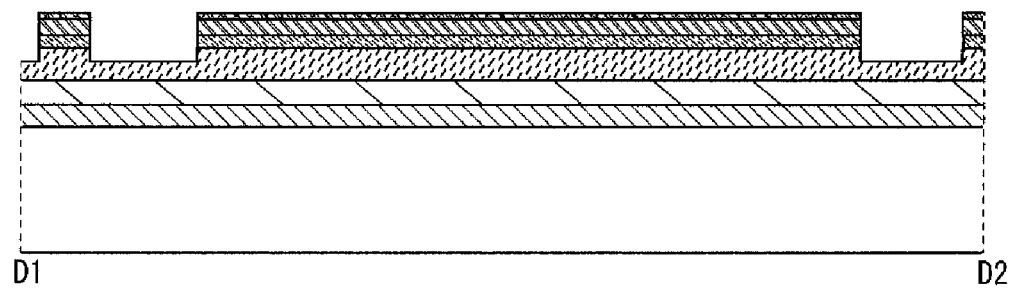
Figure 15C:
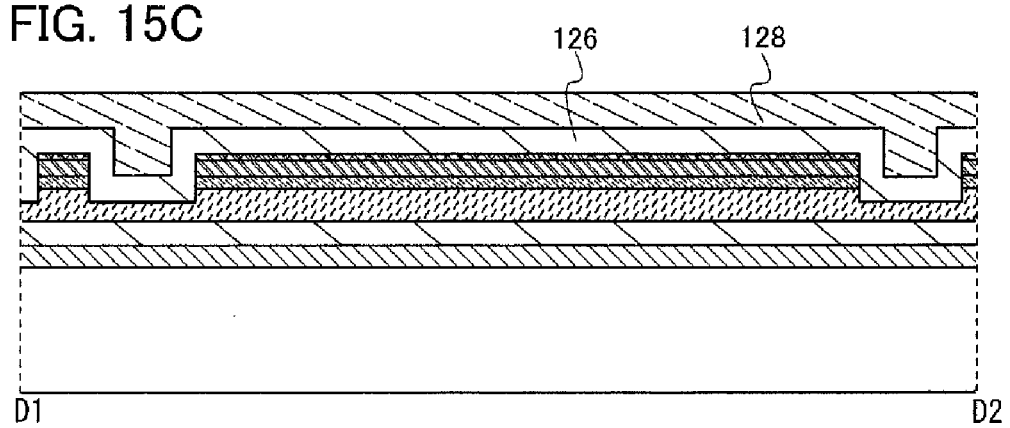
Figure 16A:
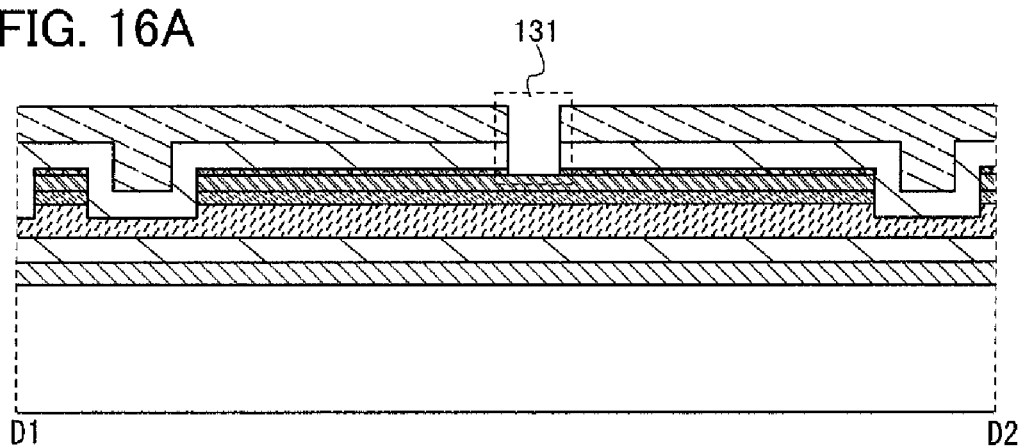
FIGS. 16A and 16B illustrate an example of a method for manufacturing a thin film transistor and a display device.
Figure 16B:
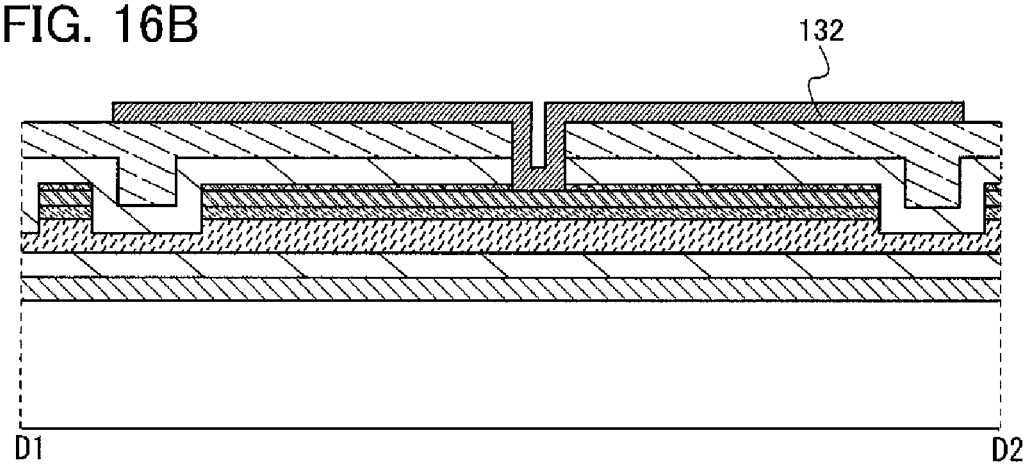
Figure 17A:
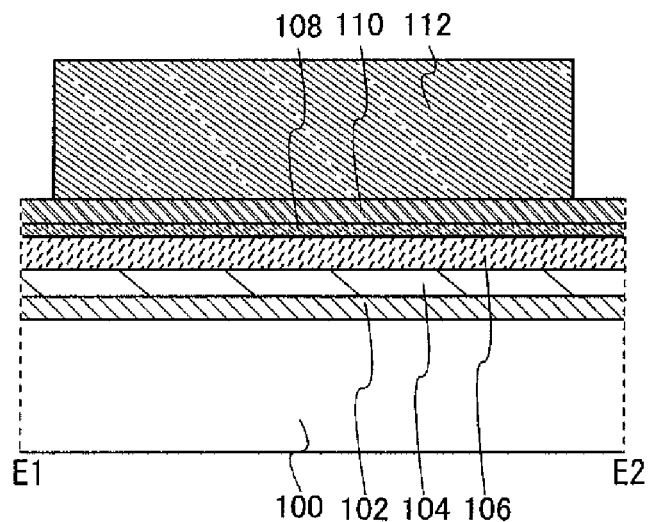
FIGS. 17A to 17C illustrate an example of a method for manufacturing a thin film transistor and a display device.
Figure 17B:
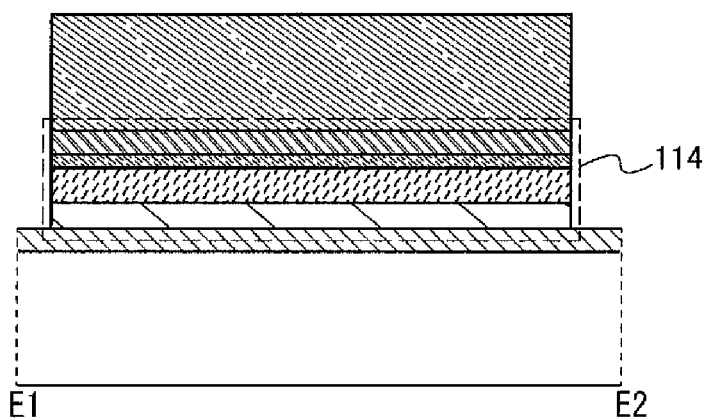
Figure 17C:
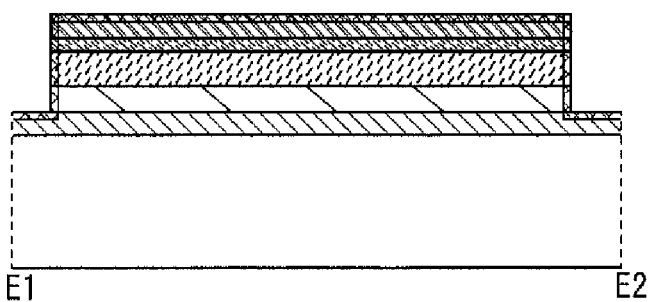
Figure 18A:
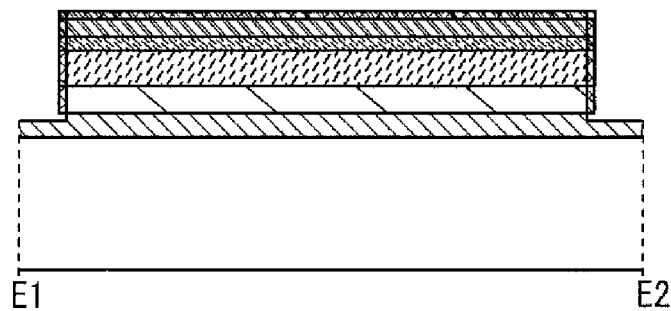
FIGS. 18A to 18C illustrate an example of a method for manufacturing a thin film transistor and a display device.
Figure 18B:
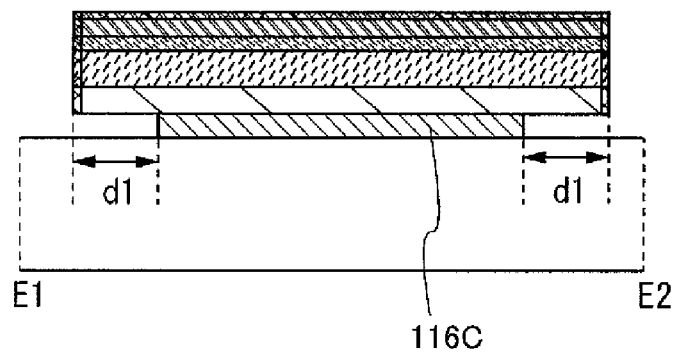
Figure 18C:
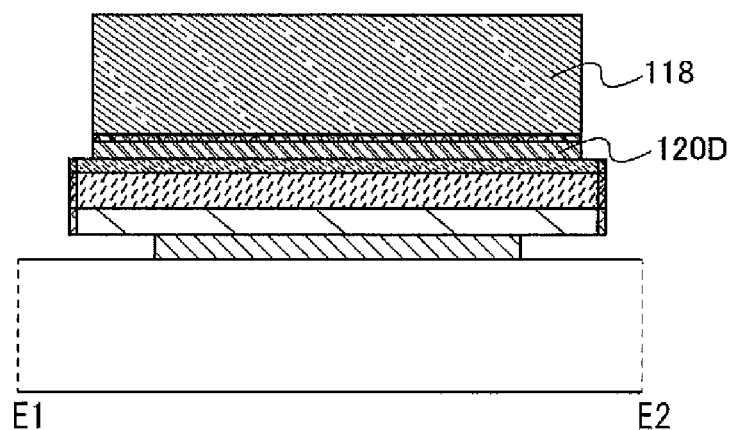
Figure 19A:
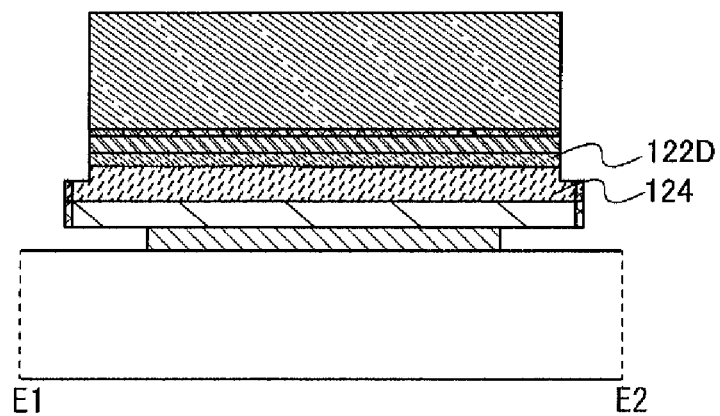
FIGS. 19A to 19C illustrate an example of a method for manufacturing a thin film transistor and a display device.
Figure 19B:
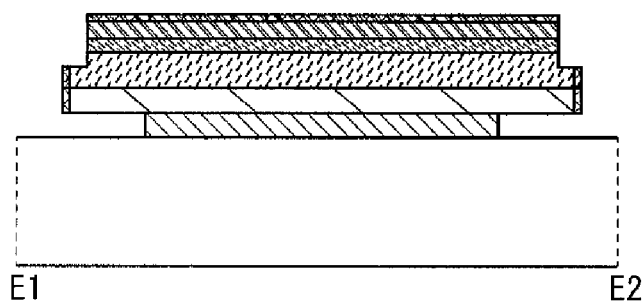
Figure 19C:
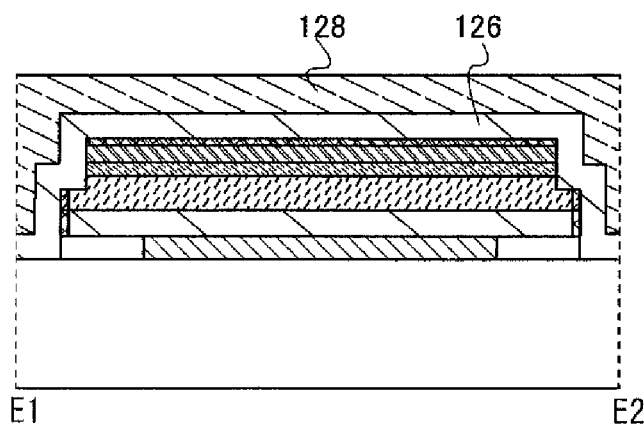
Figure 20A:
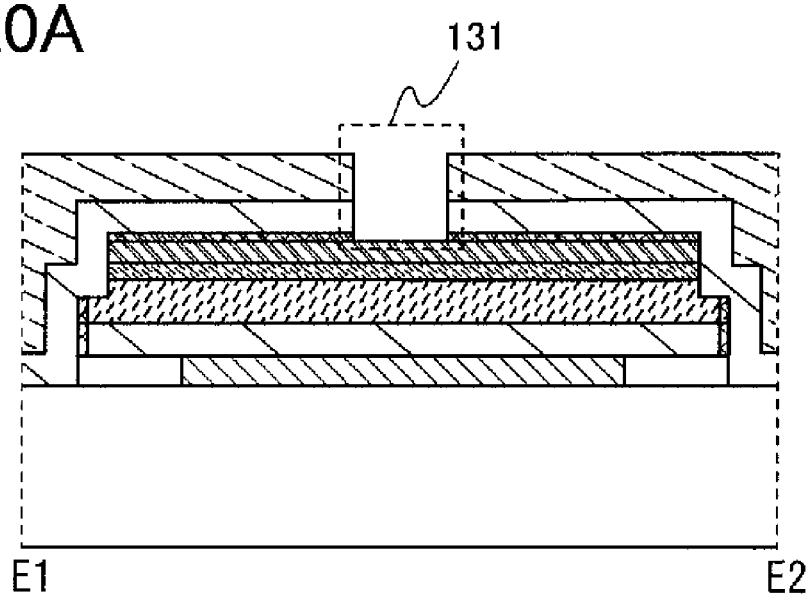
FIGS. 20A and 20B illustrate an example of a method for manufacturing a thin film transistor and a display device.
Figure 20B:
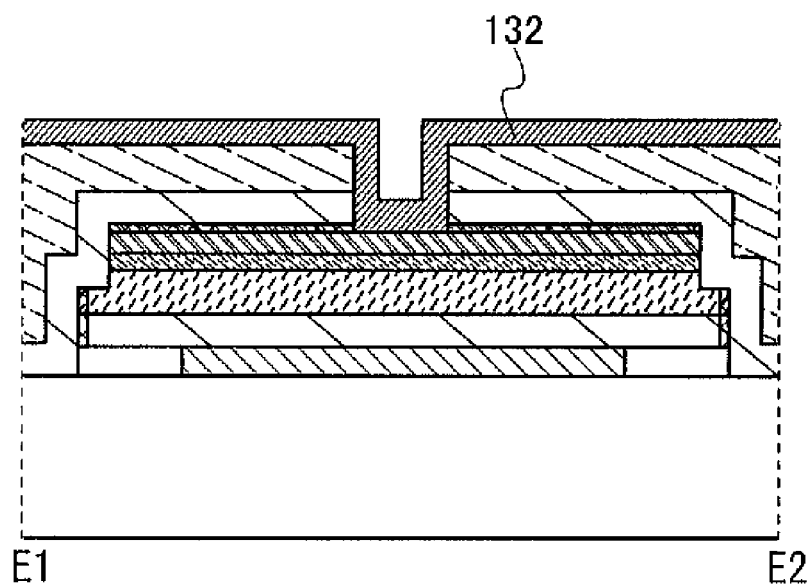
Figure 21:
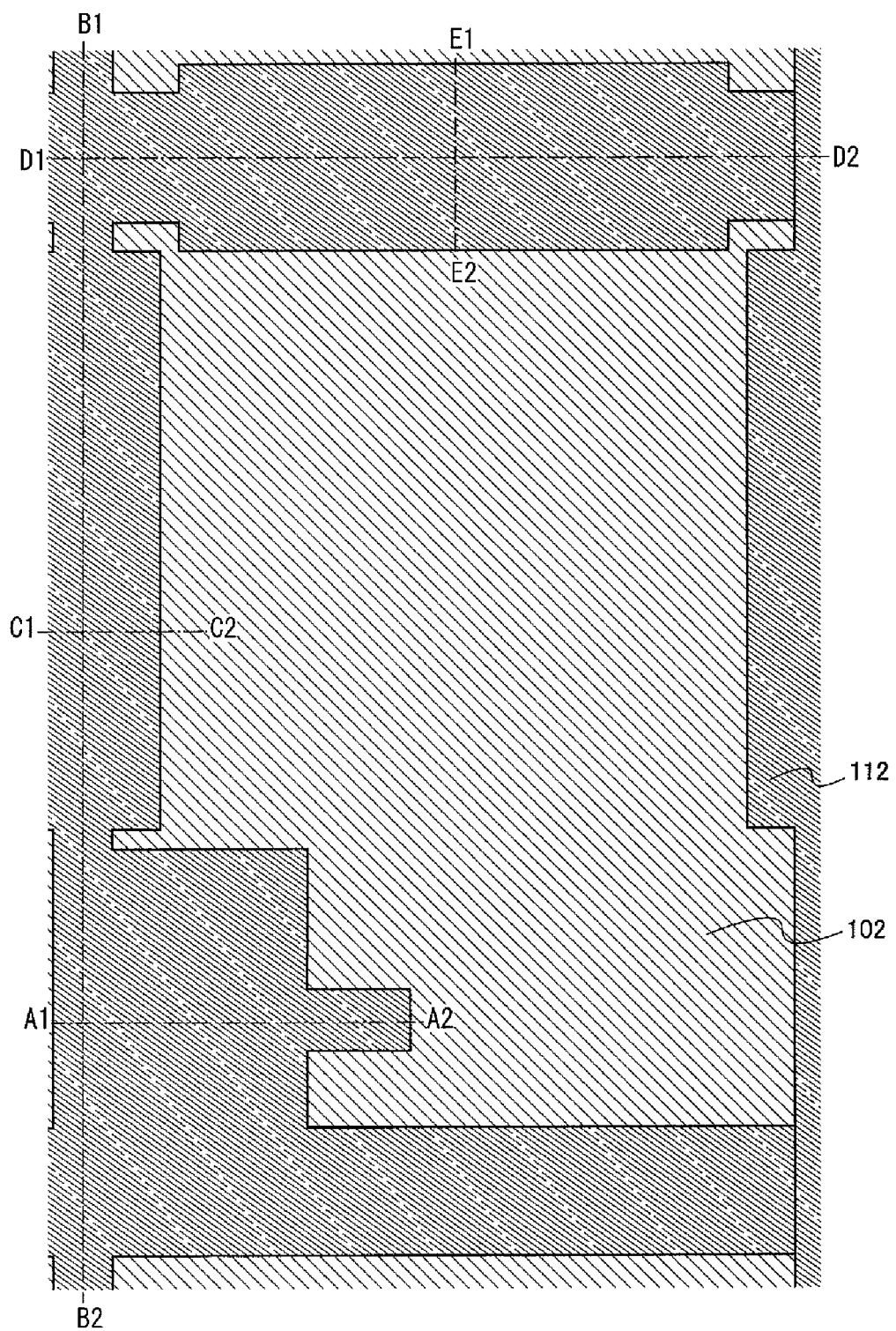
FIG. 21 illustrates an example of a method for manufacturing a thin film transistor and a display device.

The thin film transistor manufactured as described above has a structure including a gate insulating film over a gate electrode layer, a semiconductor layer over the gate insulating film, a source region and a drain region over the semiconductor layer, a source electrode and a drain electrode over the source region and the drain region, and a cavity in contact with a side surface of the gate electrode layer (see FIG. 4B). By the cavity formed in contact with the side surface of the gate electrode layer, a thin film transistor with low leakage current at an end portion of the gate electrode layer can be manufactured.

Here, a terminal connection portion of the active matrix substrate manufactured in the above-described steps will be described with reference to FIG. 27, FIG. 28, and FIGS. 29A to 29C.

Figure 27:
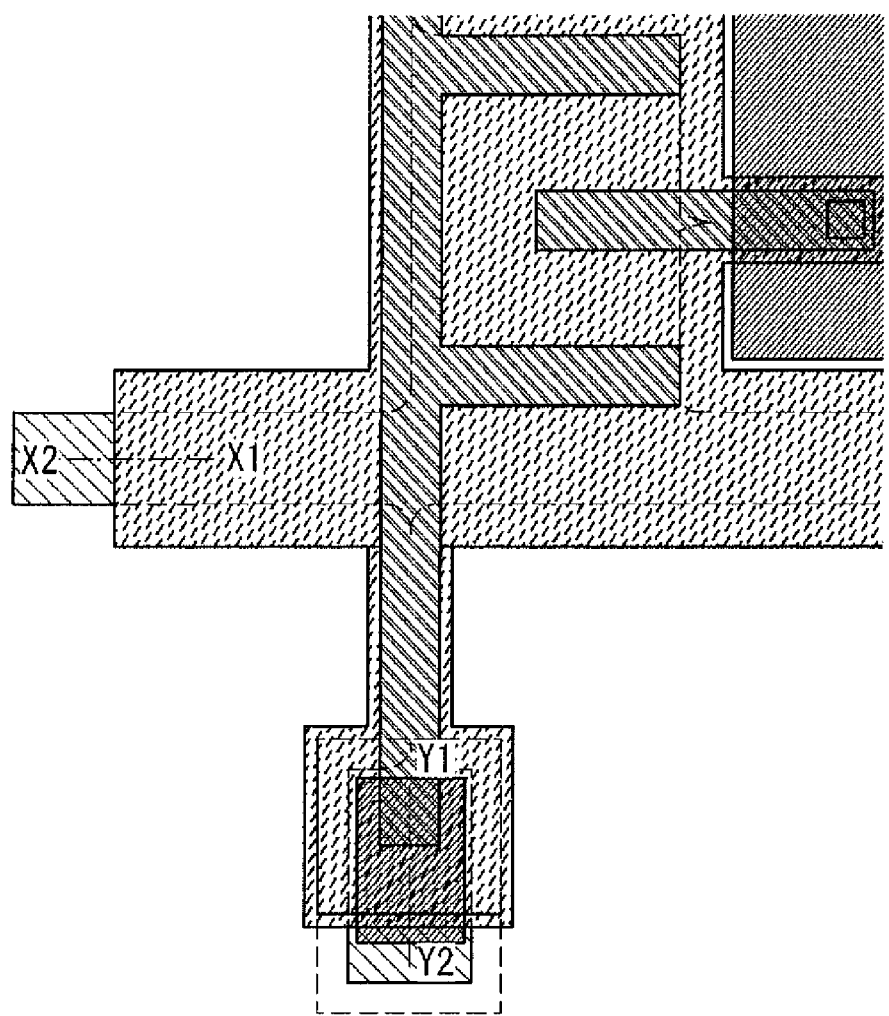
FIG. 27 illustrates a connection portion of an active matrix substrate.

FIG. 27 is a top view and FIG. 28 and FIGS. 29A to 29C are cross-sectional views of a terminal connection portion on the gate wiring side and a terminal connection portion on the source wiring side of the active matrix substrate manufactured in the above-described steps.

FIG. 27 is a top view of the gate wiring and the source wiring extended from the pixel portion, in the terminal connection portion on the gate wiring side and the terminal connection portion on the source wiring side.

Figure 28:
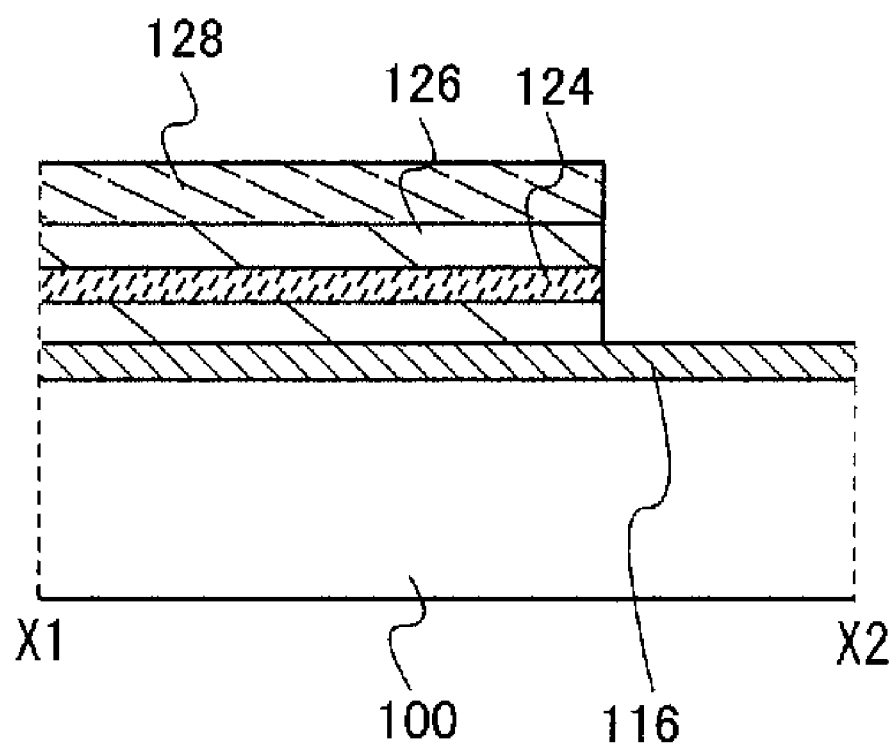
FIG. 28 illustrates a connection portion of an active matrix substrate.

FIG. 28 is a cross-sectional view taken along line X1-X2 in FIG. 27. That is, FIG. 28 is a cross-sectional view of the terminal connection portion on the gate wiring side. In FIG. 28, only the gate electrode layer 116 is exposed. A terminal portion of an external input terminal is electrically connected to the region in which the gate electrode layer 116 is exposed.

Figure 29A:
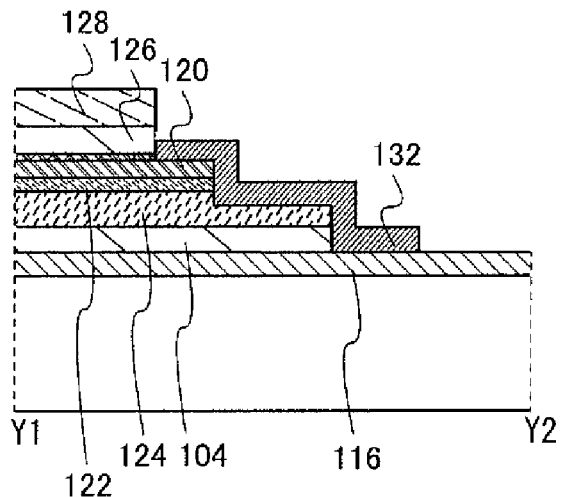
FIGS. 29A to 29C illustrate a connection portion of an active matrix substrate.
Figure 29B:
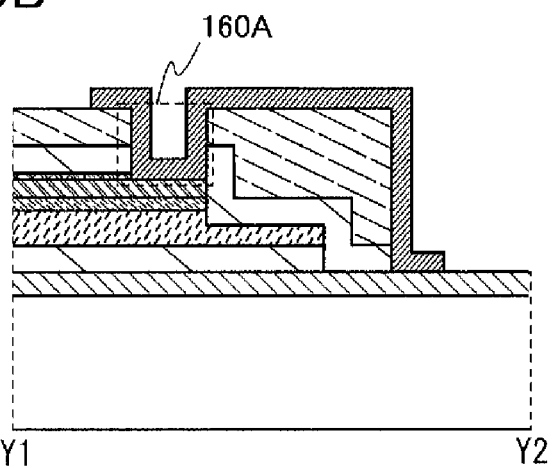
Figure 29C:
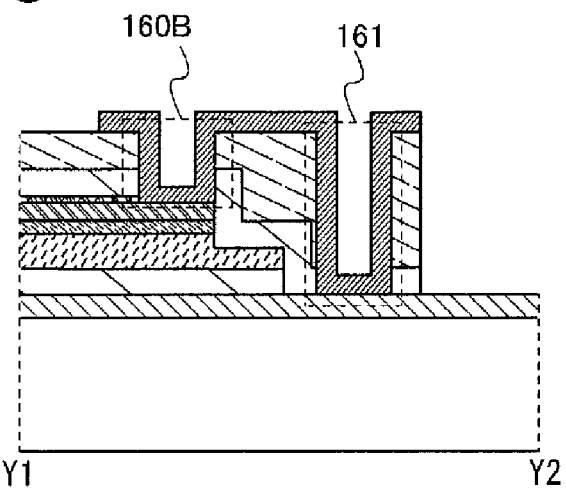

FIGS. 29A to 29C are cross-sectional views taken along line Y1-Y2 in FIG. 27. That is, FIGS. 29A to 29C are cross-sectional views of the terminal connection portion on the source wiring side. In the cross section along line Y1-Y2 illustrated in FIG. 27, the gate electrode layer 116 and the source and drain electrode layer 120 are electrically connected to each other through the pixel electrode layer 132. FIGS. 29A to 29C illustrate various connection modes between the gate electrode layer 116 and the source and drain electrode layer 120. Any of these modes or modes other than those illustrated in FIGS. 29A to 29C may be used for the terminal connection portion in a display device according to an embodiment of the present invention. With the structure in which the source and drain electrode layer 120 is electrically connected to the gate electrode layer 116, the height of the terminal connection portion can be made substantially uniform.

In FIG. 29A, electric connection is realized in such a manner that end portions of the first protective insulating film 126 and the second protective insulating film 128 are removed by etching or the like to expose the gate electrode layer 116 and the source and drain electrode layer 120, and the pixel electrode layer 132 is formed over the exposed region.

Note that the formation of the region in which the gate electrode layer 116 and the source and drain electrode layer 120 are exposed and the formation of the first opening 130 and the second opening 131 can be performed in the same step.

In FIG. 29B, electric connection is realized in such a manner that a third opening 160A is provided in the first protective insulating film 126 and the second protective insulating film 128, end portions of the first protective insulating film 126 and the second protective insulating film 128 are removed by etching or the like to expose the gate electrode layer 116 and the source and drain electrode layer 120, and the pixel electrode layer 132 is formed over the exposed region.

Note that the formation of the third opening 160A and the formation of the region in which the gate electrode layer 116 is exposed and the formation of the first opening 130 and the second opening 131 can be performed in the same step.

In FIG. 29C, electric connection is realized in such a manner that a third opening 160B and a fourth opening 161 are provided in the first protective insulating film 126 and the second protective insulating film 128 to expose the gate electrode layer 116 and the source and drain electrode layer 120, and the pixel electrode layer 132 is formed over the exposed region. Here, end portions of the first protective insulating film 126 and the second protective insulating film 128 are removed by etching or the like as in the case of FIGS. 29A and 29B, and this etched region is used as a terminal connection portion.

Note that the formation of the third opening 160B and the fourth opening 161 and the formation of the region in which the gate electrode layer 116 is exposed and the formation of the first opening 130 and the second opening 131 can be performed in the same step.

Note that the number of openings is not limited to those illustrated in FIGS. 29A to 29C. One terminal may have not only one opening but also a plurality of openings. In the case where a plurality of openings are provided for one terminal, even when any of the openings is not formed favorably due to insufficient etching for forming the opening, electric connection can be realized at the other opening. Further, even in the case where all the openings are formed without any problems, the contact area can be made larger and contact resistance can be reduced, which is preferable.

Next, a method for manufacturing a liquid crystal display device using the active matrix substrate for a display device, which is manufactured in the above-described steps, will be described. That is, a cell process and a module process will be described. Note that, in the method for manufacturing a display device in accordance with this embodiment, the cell process and the module process are not particularly limited to the description below.

In the cell process, the active matrix substrate manufactured in the above-described steps and a substrate opposite to the active matrix substrate (hereinafter referred to as an opposite substrate) are attached to each other and liquid crystal is injected therebetween. First, a method for manufacturing the opposite substrate will be briefly described below. Note that a film formed on the opposite substrate may have a single layer or stacked layers even when not mentioned.

First, a light-blocking layer is formed over a substrate; a color filter layer of any of red, green, and blue is formed over the light-blocking layer; a pixel electrode layer is selectively formed over the color filter layer; and then, a rib is formed over the pixel electrode layer. Note that the substrate used here may be one similar to the substrate 100. That is, a glass substrate may be used, for example.

As the light-blocking layer, a film of a material having a light-blocking property is selectively formed. As the material having a light-blocking property, for example, an organic resin containing a black resin (carbon black) can be used. Alternatively, a stacked film which includes a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, photolithography or the like is employed.

The color filter layer may be selectively formed using an organic resin film which transmits only light with any of red, green, and blue when white light from a backlight passes through the color filter layer. The color filter layer can be selectively formed by selective formation of color materials. The arrangement of the color filter may be a stripe arrangement, a delta arrangement, or a square arrangement.

The pixel electrode layer over the opposite substrate can be formed in a manner similar to the pixel electrode layer 132 included in the active matrix substrate. Note that since selective formation is unnecessary, the pixel electrode layer may be formed over the entire surface of the opposite substrate.

The rib formed over the pixel electrode is an organic resin film formed with a pattern for the purpose of widening the viewing angle. Note that the rib does not need to be formed when not particularly necessary.

As the method for manufacturing the opposite substrate, there are other various modes. For example, after formation of the color filter layer and before formation of the pixel electrode layer, an overcoat layer may be formed. By formation of the overcoat layer, planarity of a surface over which the pixel electrode is formed can be improved, thereby increasing yield. In addition, part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. The post spacer means a structural object formed at a regular interval on the opposite substrate in order to keep the gap between the active matrix substrate and the opposite substrate constant. In the case of using a bead spacer (spherical spacer), the post spacer need not be formed.

Next, an alignment film is formed on the active matrix substrate and the opposite substrate. The alignment film is formed, for example, in such a manner that a polyimide resin or the like is melted in an organic solvent; this solution is applied by a printing method, a spin coating method, or the like; and then the organic solvent is removed and the substrate is baked. In general, the thickness of the formed alignment film is greater than or equal to approximately 50 nm and less than or equal to approximately 100 nm. Rubbing treatment is performed on the alignment film to align liquid crystal molecules with a certain pretilt angle. The rubbing treatment is performed, for example, by rubbing an alignment film with a shaggy cloth of velvet or the like.

The active matrix substrate and the opposite substrate are then attached together with a sealant. In the case where a post spacer is not provided on the opposite substrate, a bead spacer may be dispersed in a desired region and attachment may be performed.

Next, a liquid crystal material is injected in a space between the active matrix substrate and the opposite substrate, which are attached to each other. After injection of the liquid crystal material, an inlet for injection is sealed with an ultraviolet curing resin or the like. Alternatively, after dropping a liquid crystal material, the active matrix substrate and the opposite substrate may be attached to each other.

Next, a polarizing plate is attached to both surfaces of a liquid crystal cell, which is formed by attachment of the active matrix substrate and the opposite substrate. The cell process is then finished.

Next, as the module process, a flexible printed circuit (FPC) is electrically connected to an input terminal (in FIGS. 29A to 29C, the exposed region of the gate electrode layer 116) of the terminal portion. The FPC has a wiring formed of a conductive film over an organic resin film of polyimide or the like, and is electrically connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal electrically connected to the wiring formed in the FPC, electric connection therebetween is achieved. Alternatively, after connection of the FPC, a polarizing plate may be attached to the active matrix substrate and the opposite substrate. In the above-described manner, a liquid crystal panel used for a display device can be manufactured.

As described above, the active matrix substrate including a pixel transistor, which is used for a display device, can be manufactured using four photomasks.

As a result, the number of steps for manufacturing a thin film transistor and a display device can be significantly reduced. Specifically, as described above, a thin film transistor can be manufactured using two photomasks. Further, an active matrix substrate including a pixel transistor can be manufactured using four photomasks. In this manner, because the number of photomasks to be used is reduced, the number of steps for manufacturing a thin film transistor and a display device can be significantly reduced.

In addition, unlike the conventional technique aiming at reducing the number of photomasks, a complicated step using backside light exposure, resist reflow, a lift-off method, or the like is unnecessary. As a result, the number of steps for manufacturing a display device can be significantly reduced without a complicated step. Further, the number of manufacturing steps of a display device can be significantly reduced without reducing yield.

Moreover, the number of steps for manufacturing a thin film transistor can be significantly reduced while electric characteristics of the thin film transistor are maintained.

Furthermore, by the aforementioned effects, manufacturing cost of a thin film transistor and a display device can be significantly reduced.

As described above, by oxidizing a side surface of a thin-film stack body, $ClF_3$ gas can be used for the second etching. In this manner, since dry etching can be employed as the second etching, a thin film transistor can be manufactured without a step of drying or the like after the second etching.

Alternatively, the thin film transistor manufactured in the above-described manner is characterized by including a gate electrode layer, a gate insulating layer covering the gate electrode layer, a semiconductor layer provided over the gate insulating layer, an impurity semiconductor layer provided over the semiconductor layer, a source and drain electrode layer provided over the impurity semiconductor layer, and a cavity in contact with a side surface of the gate electrode layer, in which a side surface of the semiconductor layer is oxidized. Since the side surface of the semiconductor layer is oxidized, in the manufacturing process, re-adhesion that is caused in the dry etching or the like on the semiconductor layer can be particularly prevented, which results in prevention of reduction in yield or the like. It is preferred that surfaces of the source and drain electrode layer also be oxidized. By oxidizing a surface of the source and the drain electrode layer, the second etching can be performed favorably.

Furthermore, because of the cavity in contact with the side surface of the gate electrode layer, a thin film transistor with low leakage current at an end portion of the gate electrode layer can be manufactured, and thus a display device with a high contrast ratio and high display quality can be obtained.

Note that the pixel structure of a liquid crystal display device is not limited to the description above, and various structures can be used.

Embodiment 2

In this embodiment, a method for manufacturing a thin film transistor and a method for manufacturing a display device, which are different from those of Embodiment 1, will be described. Specifically, a method for manufacturing a thin film transistor which is similar to that of Embodiment 1, using a multi-tone mask will be described with reference to FIGS. 31A and 31B, FIGS. 32A to 32C, FIGS. 33A to 33C, FIG. 34, FIG. 35, and FIG. 36.

Figure 32A:
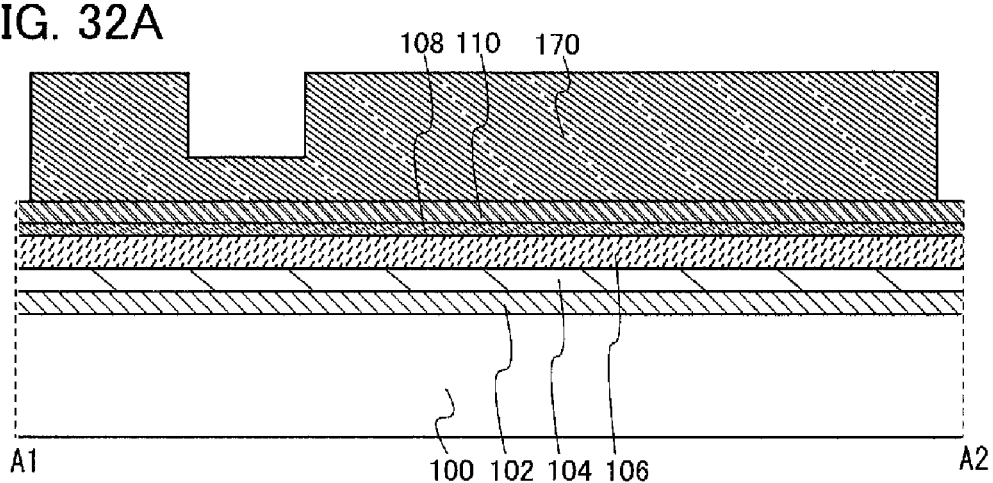
FIGS. 32A to 32C illustrate an example of a method for manufacturing a thin film transistor and a display device.
Figure 32B:
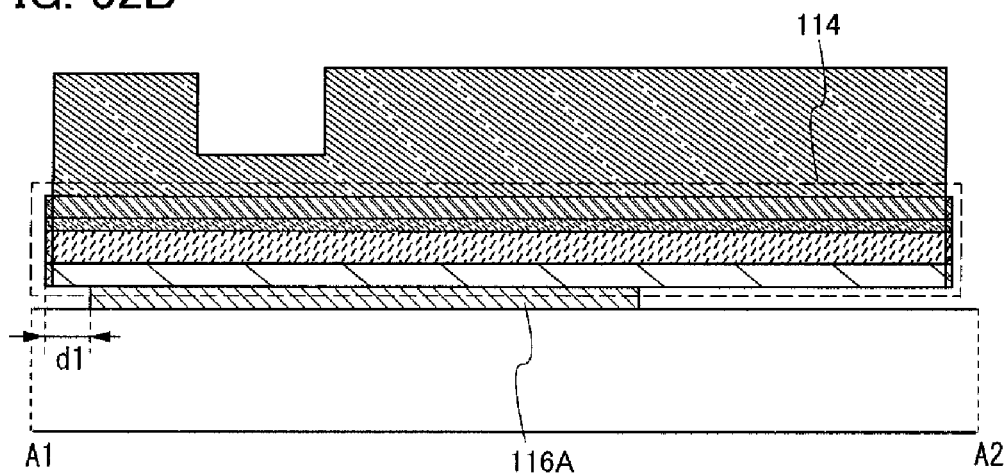
Figure 32C:
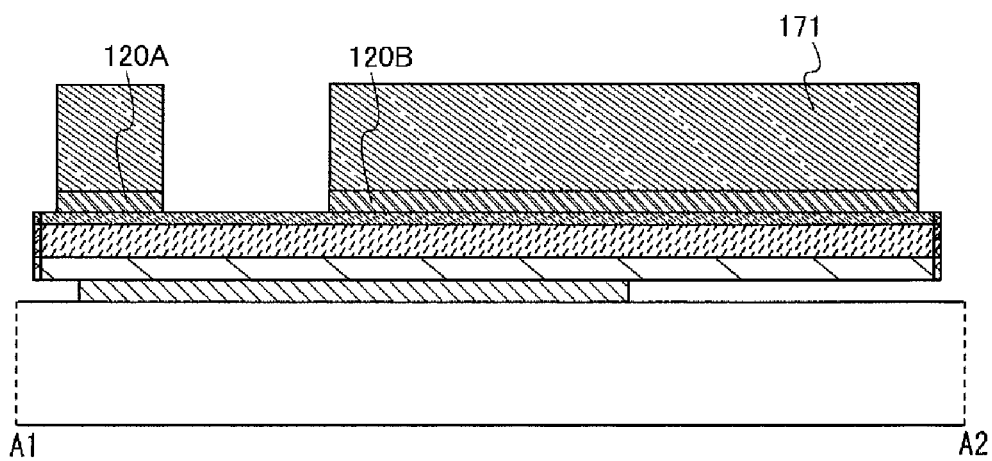
Figure 33A:
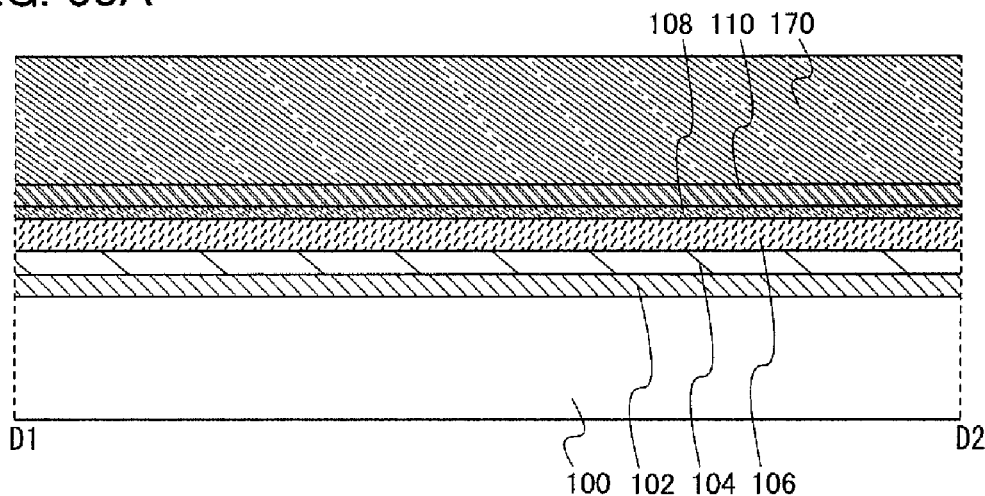
FIGS. 33A to 33C illustrate an example of a method for manufacturing a thin film transistor and a display device.
Figure 33B:
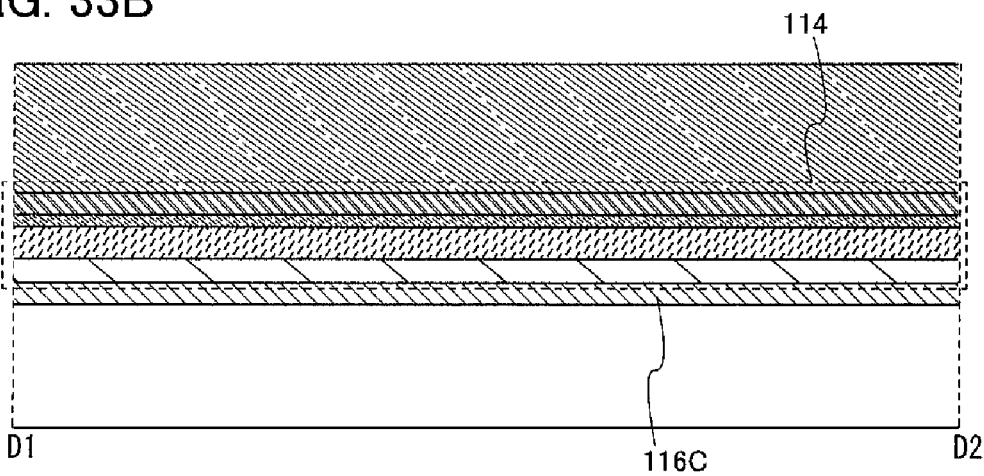
Figure 33C:
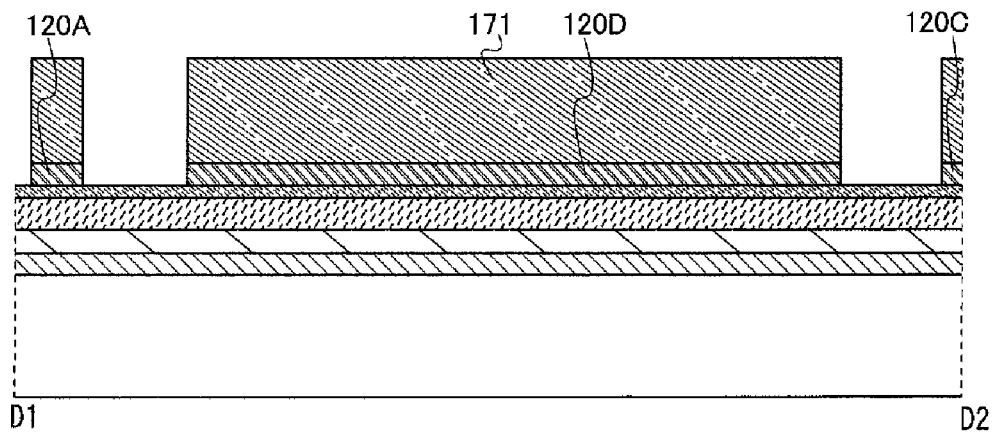
Figure 34:
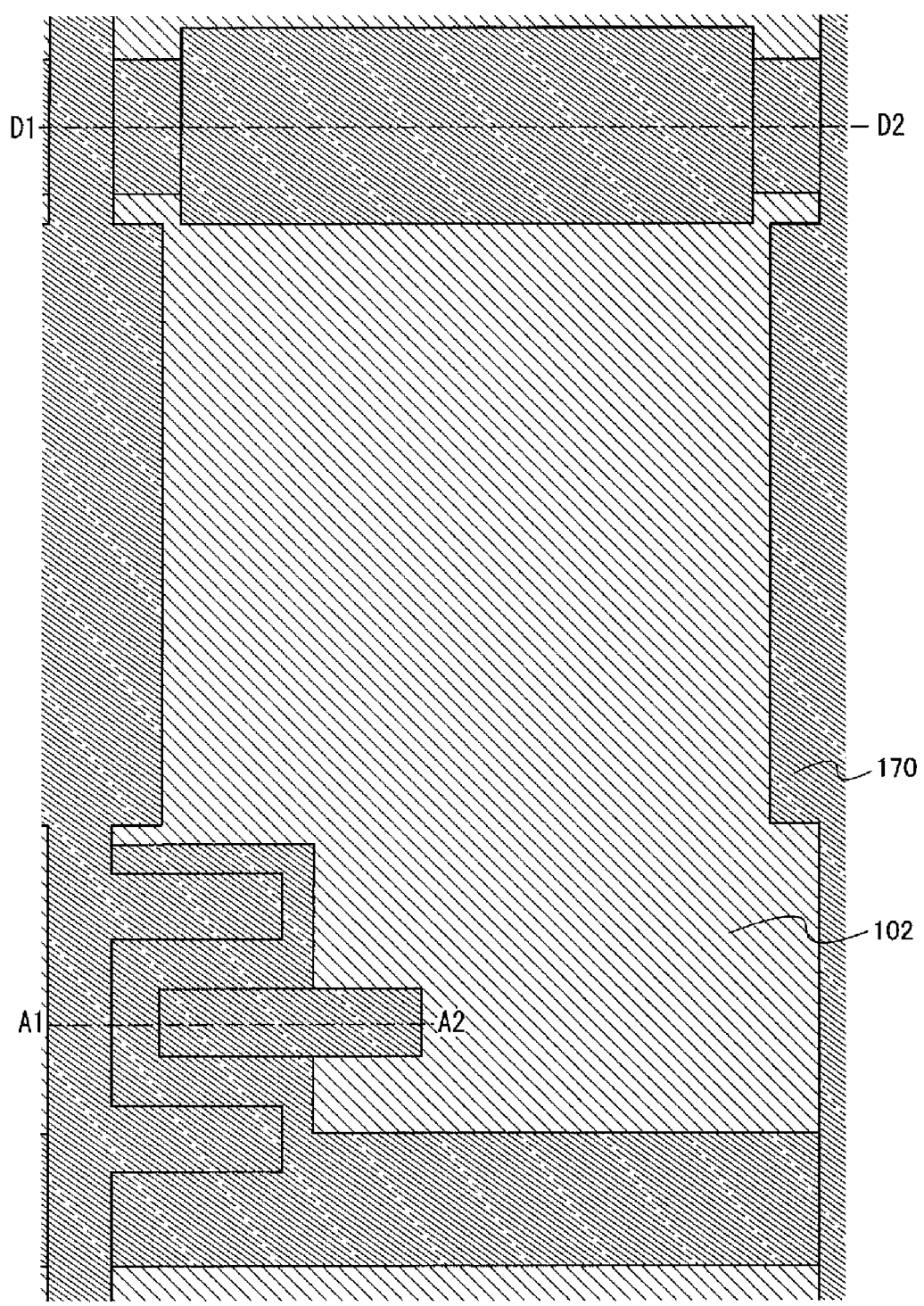
FIG. 34 illustrates an example of a method for manufacturing a thin film transistor and a display device.
Figure 35:
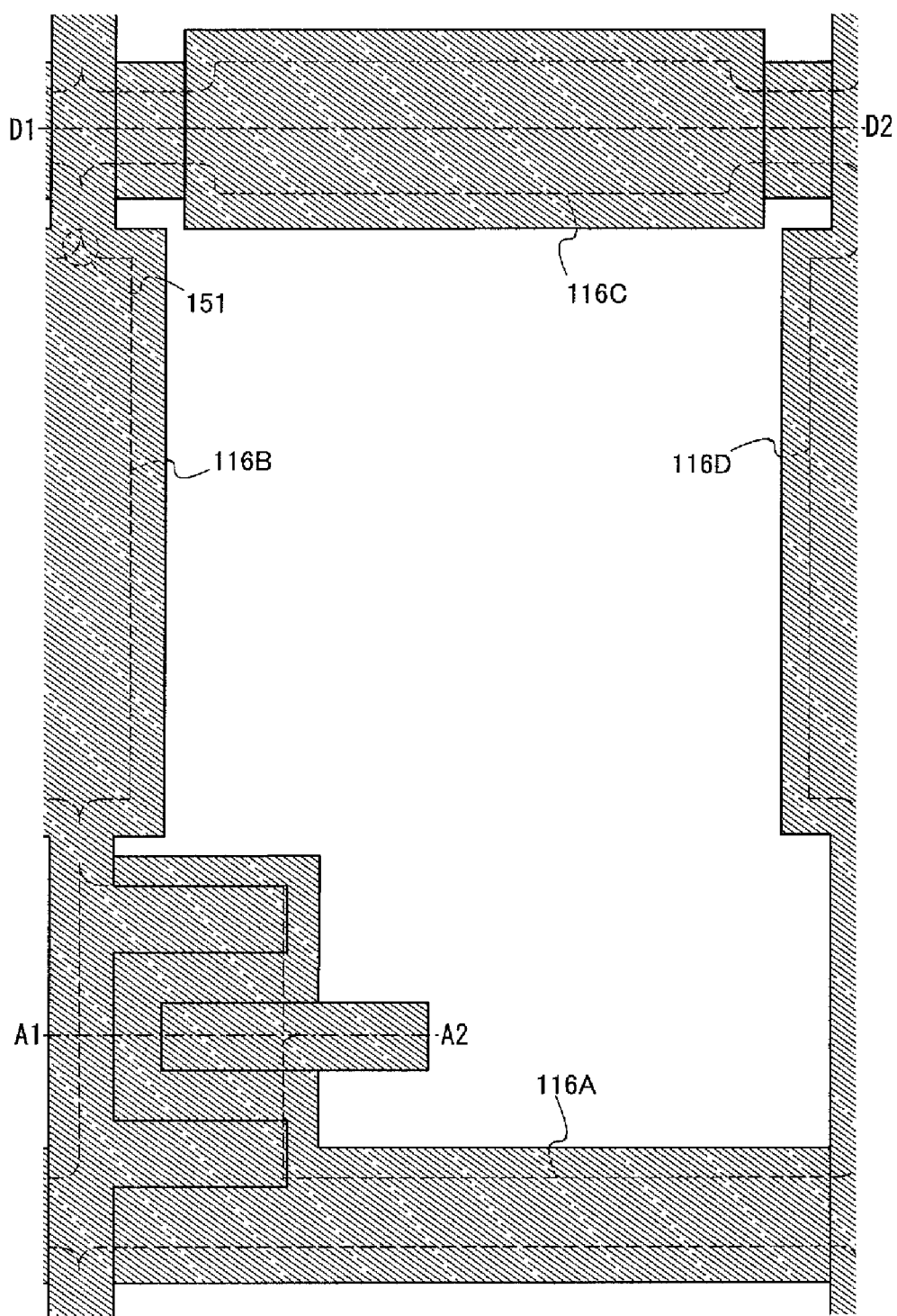
FIG. 35 illustrates an example of a method for manufacturing a thin film transistor and a display device.
Figure 36:
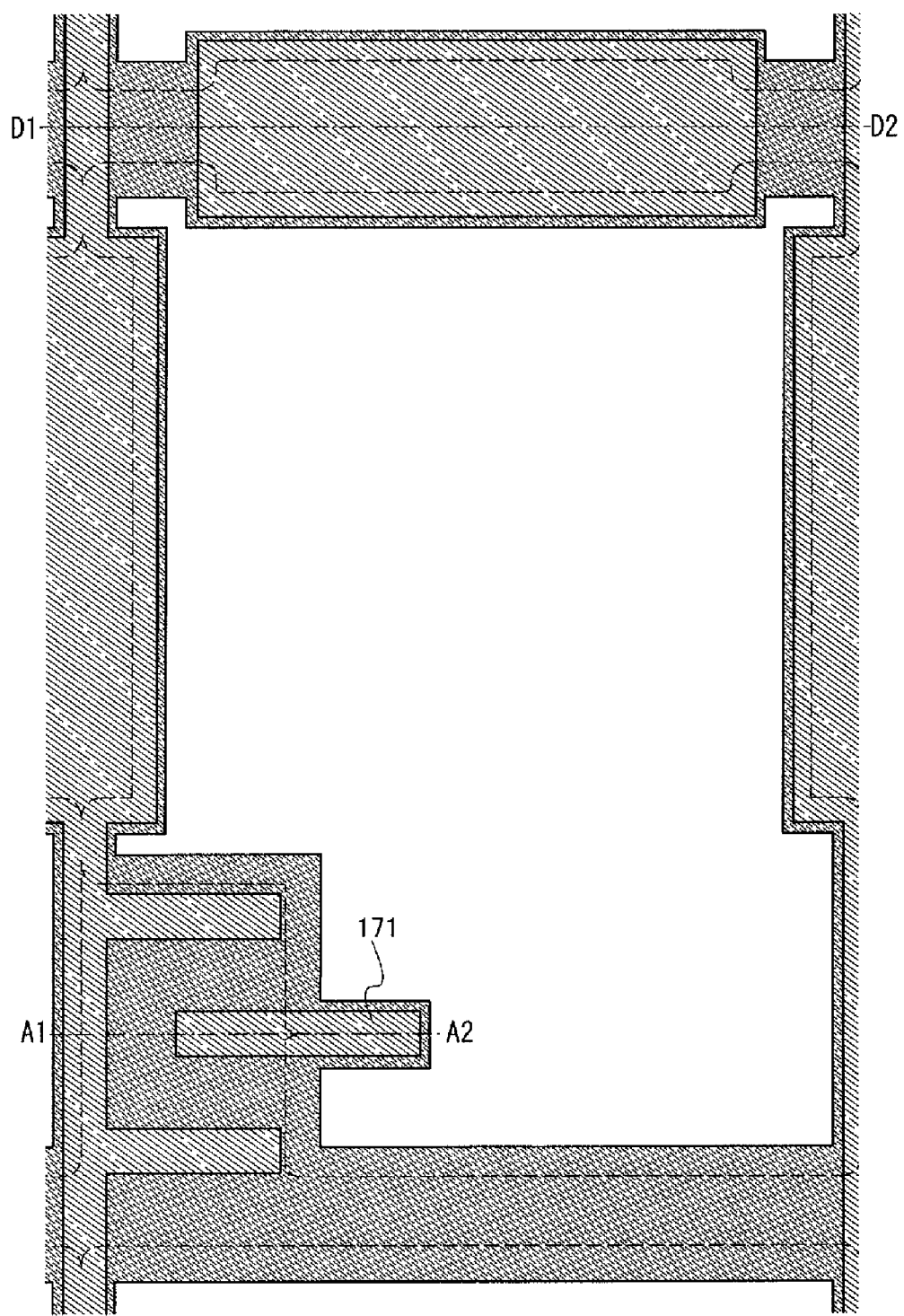
FIG. 36 illustrates an example of a method for manufacturing a thin film transistor and a display device.

FIGS. 32A to 32C correspond to FIGS. 1A to 1C, and FIGS. 2A to 2C of Embodiment 1. FIGS. 33A to 33C correspond to FIGS. 13A to 13C, and FIGS. 14A to 14C of Embodiment 1. FIG. 34, FIG. 35, and FIG. 36 correspond to FIG. 21, FIG. 22, and FIG. 23 of Embodiment 1. The cross-sectional views taken along line A1-A2 illustrated in FIG. 34, FIG. 35, and FIG. 36 correspond to FIGS. 32A to 32C, and the cross-sectional views taken along line D1-D2 illustrated in FIG. 34, FIG. 35, and FIG. 36 correspond to FIGS. 33A to 33C.

First, as in Embodiment 1, a first conductive film 102, an insulating film 104, a semiconductor film 106, an impurity semiconductor film 108, and a second conductive film 110 are formed over a substrate 100. Materials thereof and formation methods thereof are similar to those in Embodiment 1. In the case where a region capable of an ohmic contact with a source and drain electrode layer is provided in part of the semiconductor layer, which is formed using the semiconductor film 106, by doping or the like, the impurity semiconductor film 108 need not be provided.

A first resist mask 170 is then formed over the second conductive film 110 (see FIG. 32A and FIG. 33A). The first resist mask 170 is a resist mask having a depressed portion or a projected portion. In other words, the first resist mask 170 can also be referred to as a resist mask including a plurality of regions (here, two regions) having different thicknesses. In the first resist mask 170, the thick region is called a projected portion of the first resist mask 170 and the thin region is called a depressed portion of the first resist mask 170.

In the first resist mask 170, a projected portion is formed in a region where a source and drain electrode layer 120 is formed, and a depressed portion is formed in a region where a semiconductor layer 124 is exposed without existence of the source and drain electrode layer 120.

The first resist mask 170 can be formed using a multi-tone mask. Here, the multi-tone mask is described with reference to FIGS. 31A and 31B.

The multi-tone mask is a mask capable of light exposure with multi-level light intensity, and typically, light exposure is performed with three levels of light intensity to provide an exposed region, a half-exposed region, and an unexposed region. With use of the multi-tone mask, one-time light exposure and development process can form a resist mask with plural thicknesses (typically, two levels of thicknesses). As a result of the usage of a multi-tone mask, the number of photomasks can be reduced.

Figures 1, 31A:
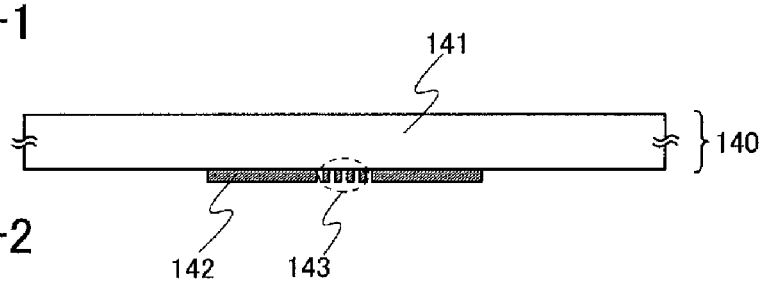
FIGS. 31A-1, 31A-2, 31B-1, and 31B-2 illustrate multi-tone masks.
Figures 2, 31A:
Figures 1, 31B:
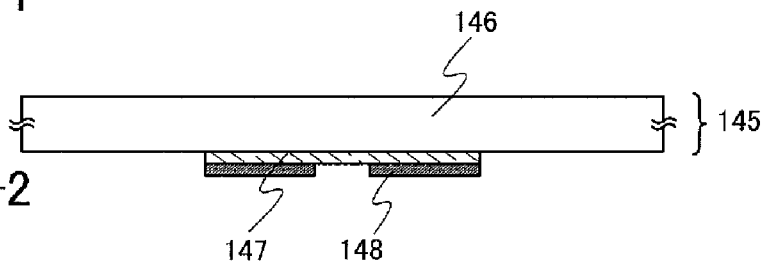
Figures 2, 31B:
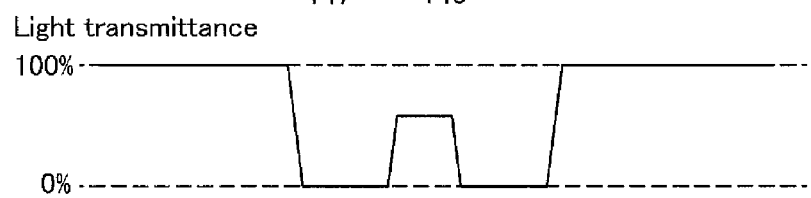

FIG. 31A-1 and FIG. 31B-1 are cross-sectional views of typical multi-tone masks. A gray-tone mask 140 is illustrated in FIG. 31A-1 and a half-tone mask 145 is illustrated in FIG. 31B-1.

The gray-tone mask 140 illustrated in FIG. 31A-1 includes a light-blocking portion 142 formed using a light-blocking film on a substrate 141 having a light-transmitting property, and a diffraction grating portion 143 provided with a pattern of the light-blocking film.

The transmittance of light is controlled at the diffraction grating portion 143 in such a manner that slits, dots, mesh, or the like are provided at an interval equal to or less than the resolution limit of light used for tight exposure. Note that the slits, dots, or mesh provided at the diffraction grating portion 143 may be provided periodically or nonperiodically.

As the substrate 141 having a light-transmitting property, quartz or the like can be used. The light-blocking film for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 31A-2, the transmittance in the region overlapping with the light-blocking portion 142 is 0%, and the transmittance in the region where neither the light-blocking portion 142 nor the diffraction grating portion 143 is provided is 100%. Further, the transmittance at the diffraction grating portion 143 is approximately 10% to 70%, which can be adjusted by the interval of slits, dots, or mesh of the diffraction grating, or the like.

The half-tone mask 145 illustrated in FIG. 31B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film in a manner similar to the light-blocking film of the gray-tone mask and preferably provided using chromium, chromium oxide, or the like.

In the case where the half-tone mask 145 is irradiated with light for light exposure, as illustrated in FIG. 31B-2, the transmittance in the region overlapping with the light-blocking portion 148 is 0%, and the transmittance in the region where neither the light-blocking portion 148 nor the semi-light-transmitting portion 147 is provided is 100%. Further, the transmittance in the semi-light-transmitting portion 147 is approximately 10% to 70% which can be adjusted by the control of the kind of the material, the thickness, or the like thereof.

By light exposure using the multi-tone mask and development, a first resist mask 170 which includes regions having different thicknesses can be formed.

Note that this embodiment is not limited to this, and the first resist mask 170 may be formed without using a multi-tone mask as described in Embodiment 1.

Next, first etching is performed using the first resist mask 170. That is, the insulating film 104, the semiconductor film 106, the impurity semiconductor film 108, and the second conductive film 110 are patterned by being etched to form a thin-film stack body 114 over the first conductive film 102.

Here, as in Embodiment 1, oxidation treatment is performed and then cleaning is preferred to be performed (see FIG. 32B, FIG. 33B, and FIG. 34).

Second etching is then performed in a manner similar to Embodiment 1, thereby forming a gate electrode layer 116 (see FIG. 32C, FIG. 33C, and FIG. 35).

Here, the conditions of the second etching are similar to those of the second etching in Embodiment 1.

Next, a second resist mask 171 is formed over the thin-film stack body 114, and a source and drain electrode layer 120 is formed using the second resist mask 171. The first resist mask 170 is made to recede (reduce) to form a second resist mask 171. An example of a means for forming the second resist mask 171 by recession (reduction) of the first resist mask 170 can be ashing using oxygen plasma. However, the means for forming the second resist mask 171 by recession (reduction) of the first resist mask 170 is not limited to this. The etching conditions or the like are similar to those of Embodiment 1. Note that the steps following this are similar to those of Embodiment 1.

Note that the second resist mask 171 may be formed by recession (reduction) of the first resist mask 170 by the oxidation treatment performed after the first etching. As described above, by formation of the second resist mask 171, oxidation treatment and formation of the second resist mask 171 can be performed in the same step, whereby a process can be simplified, which is preferred. Note that the oxidation treatment is preferred to be performed by oxygen plasma in this case.

Note that the case where the second resist mask 171 is formed after the second etching has been described here; however, the present invention is not limited to this and the second etching may be performed after formation of the second resist mask 171.

As described in this embodiment above, a thin film transistor can be manufactured using a multi-tone mask.

Note that the methods for manufacturing a thin film transistor and a display device according to this embodiment are similar to those of Embodiment 1 except for the point described above. As a result, effects similar to those of the methods of Embodiment 1 for manufacturing a thin film transistor and a display device can be naturally obtained, but the number of photomasks to be used is decreased by one. In other words, according to this embodiment, a thin film transistor can be manufactured using one photomask (a multi-tone mask). In addition, an active matrix substrate including a pixel transistor can be manufactured using three photomasks. In this manner, because the number of photomasks to be used is reduced, the number of steps for manufacturing a thin film transistor and a display device can be significantly reduced. Furthermore, the thin film transistor and the display device can be manufactured with high yield and low cost.

Further, the number of steps for manufacturing a thin film transistor can be significantly reduced without changing electric characteristics of a thin film transistor as in Embodiment 1.

Note that the thin film transistor manufactured using the manufacturing method of this embodiment has a structure including a gate insulating film over a gate electrode layer, a semiconductor layer over the gate insulating film, a source region and a drain region over the semiconductor layer, a source electrode and a drain electrode over the source region and the drain region, and a cavity in contact with a side surface of the gate electrode layer. By the formation of the cavity in contact with the side surface of the gate electrode layer, a thin film transistor with a low leakage current at an end portion of the gate electrode layer can be manufactured. As a result, a display device with a high contrast ratio and favorable display quality can be obtained.

As described above, since a side surface of the thin-film stack body is oxidized, a $ClF_3$ gas can be used in the second etching. In such a manner, because dry etching can be applied to the second etching, a thin film transistor can be manufactured without performing a dry step or the like after the second etching.

Further, the side surface of the thin-film stack body is oxidized by the oxidation step for formation of the second resist mask. Formation of the second resist mask and oxidation of the thin-film stack body can thus be performed in the same step.

Embodiment 3

In this embodiment, a method for manufacturing a thin film transistor and a method for manufacturing a display device according to the present invention, which are different from those of Embodiments 1 and 2, will be described. Specifically, a mode in which a first conductive film 102 is etched by the first etching which is described in Embodiments 1 and 2 will be described with reference to FIGS. 37A to 37C, FIGS. 38A to 38C, FIGS. 39A to 39C, FIGS. 40A to 40C, FIGS. 41A to 41C, and FIG. 42.

Figure 37A:
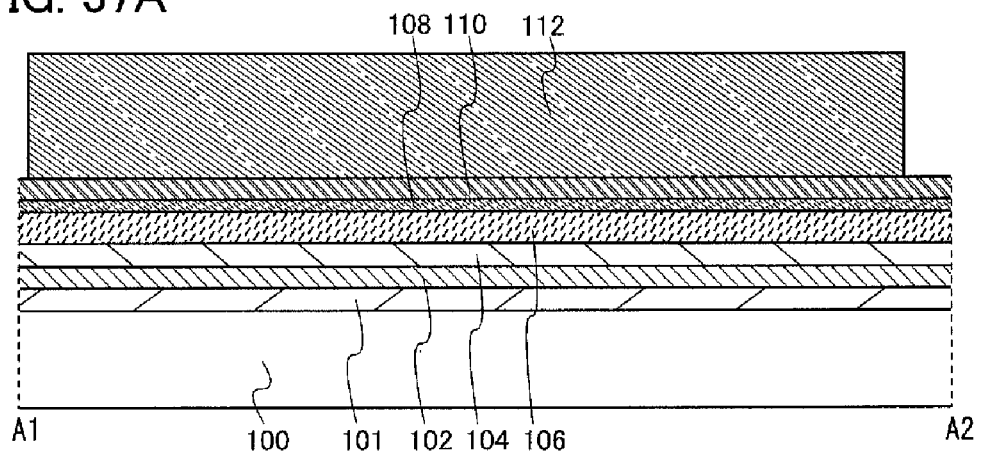
FIGS. 37A to 37C illustrate an example of a method for manufacturing a thin film transistor and a display device.
Figure 37B:
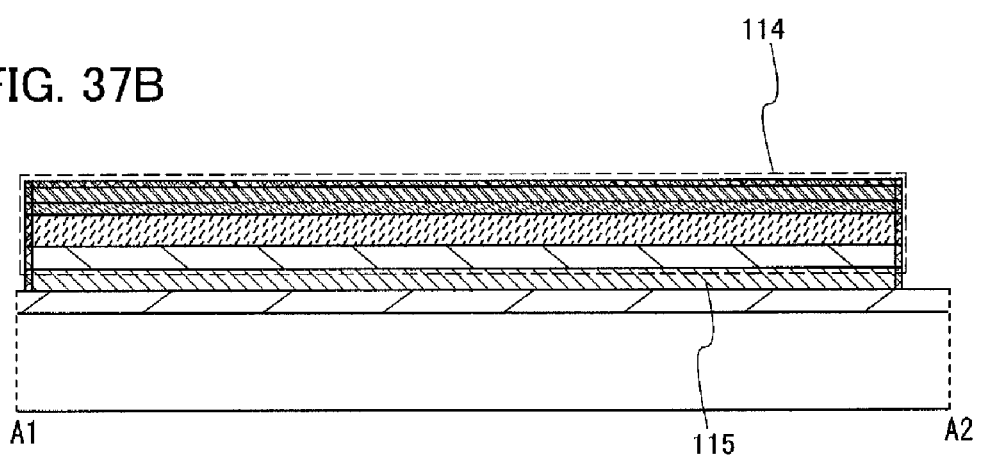
Figure 37C:
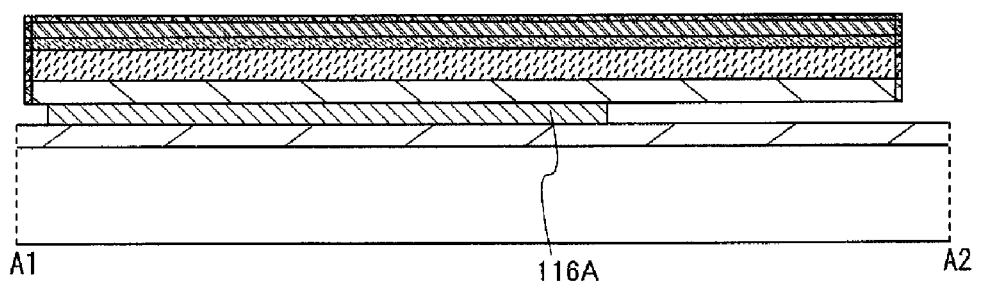
Figure 38A:
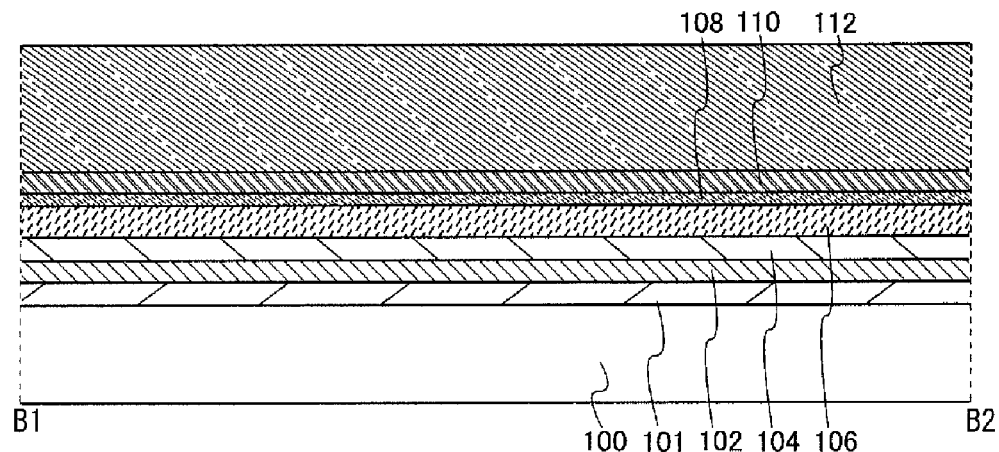
FIGS. 38A to 38C illustrate an example of a method for manufacturing a thin film transistor and a display device.
Figure 38B:
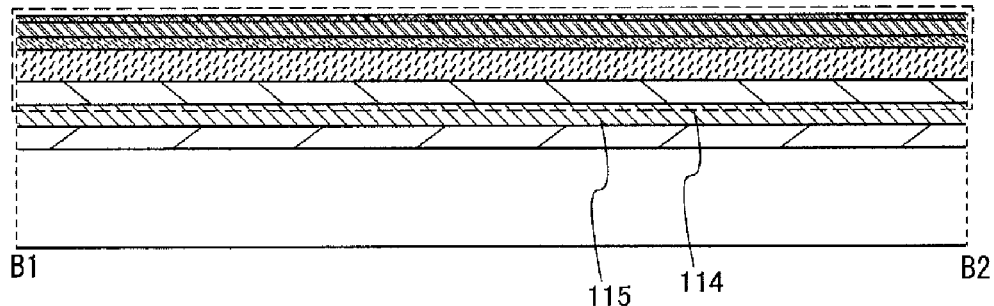
Figure 38C:
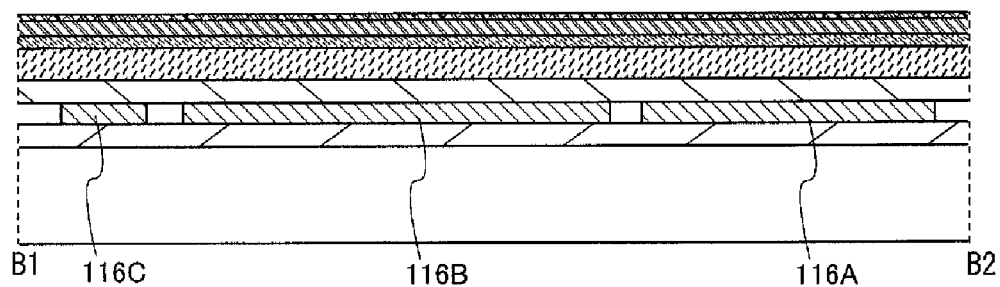
Figure 39A:
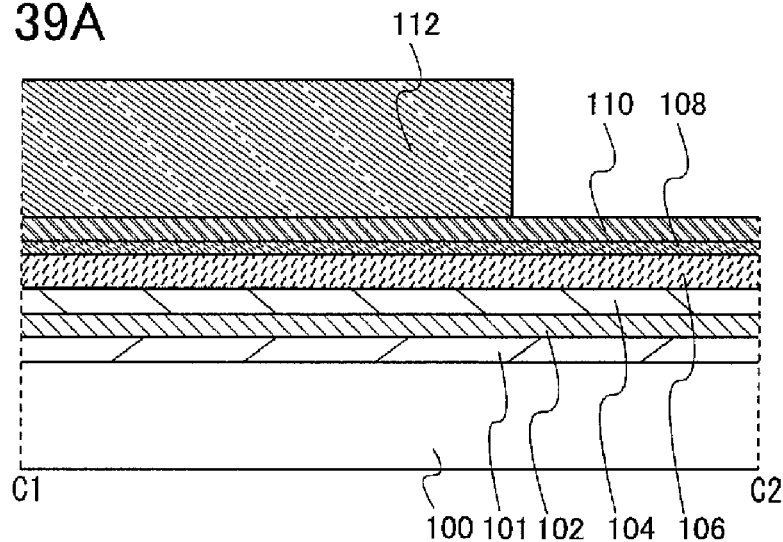
FIGS. 39A to 39C illustrate an example of a method for manufacturing a thin film transistor and a display device.
Figure 39B:
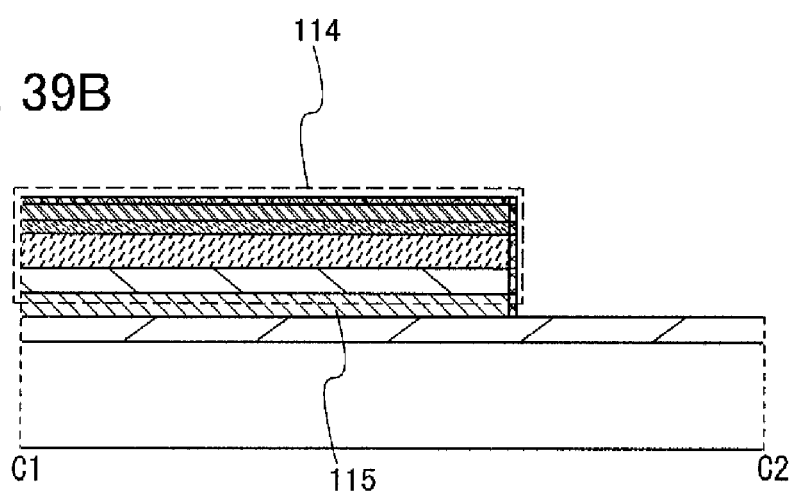
Figure 39C:
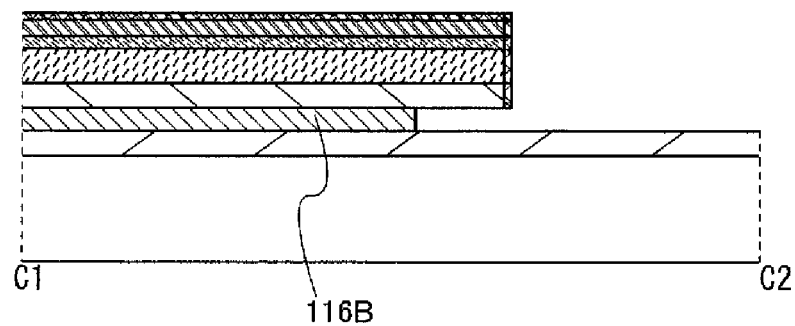
Figure 40A:
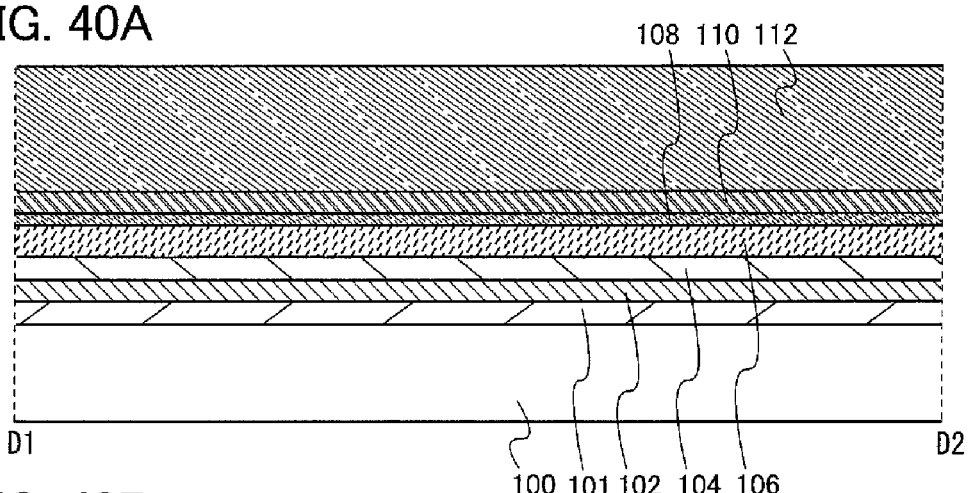
FIGS. 40A to 40C illustrate an example of a method for manufacturing a thin film transistor and a display device.
Figure 40B:
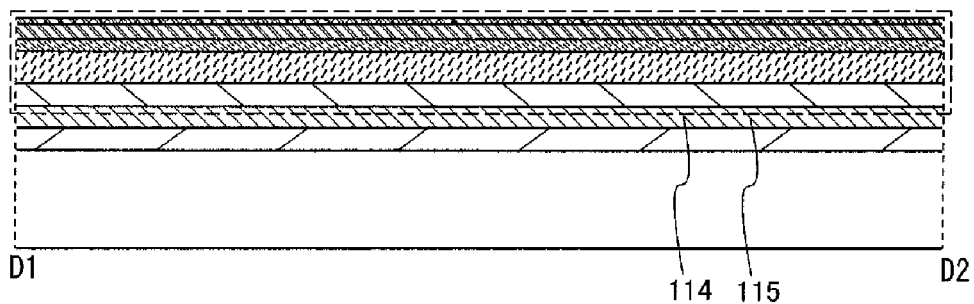
Figure 40C:
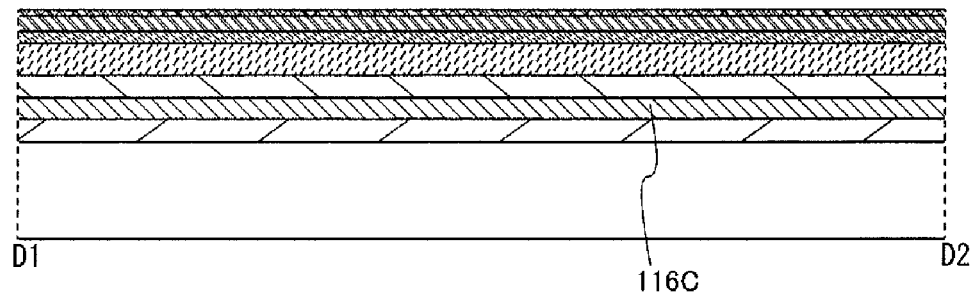
Figure 41A:
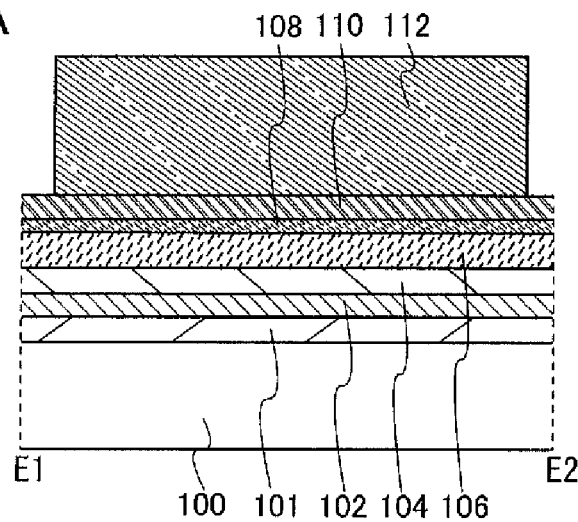
FIGS. 41A to 41C illustrate an example of a method for manufacturing a thin film transistor and a display device.
Figure 41B:
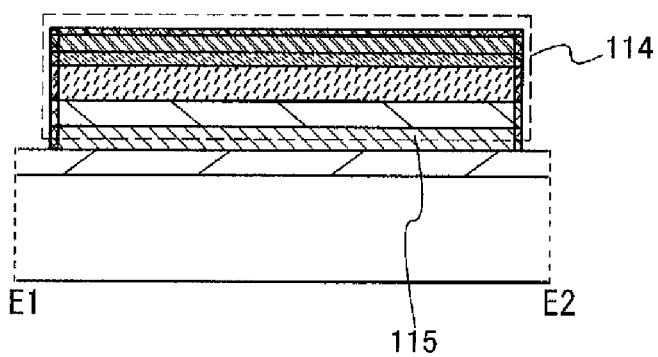
Figure 41C:
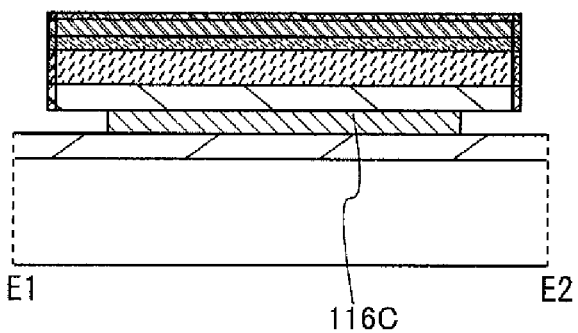
Figure 42:
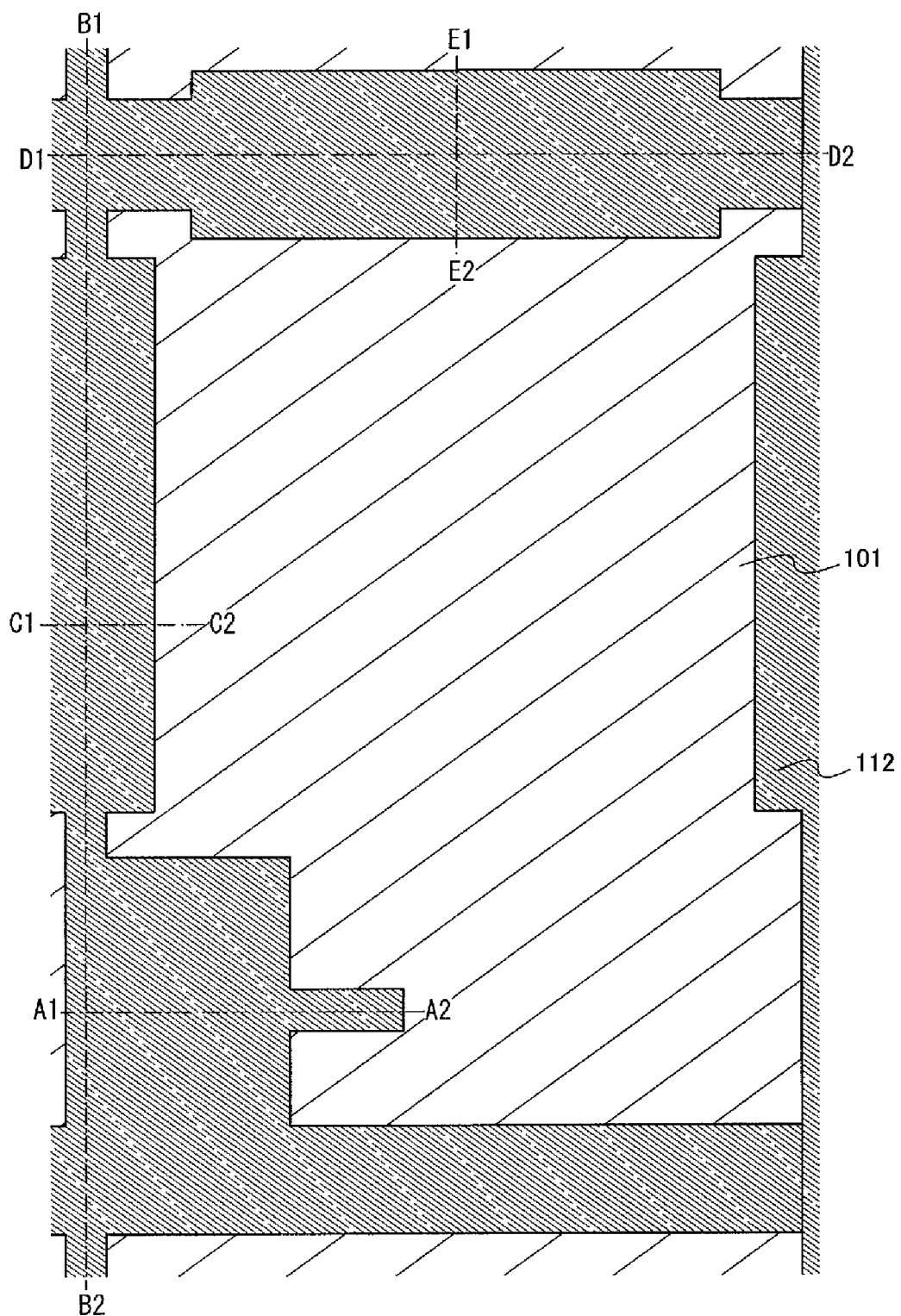
FIG. 42 illustrates an example of a method for manufacturing a thin film transistor and a display device.

Note that FIGS. 37A to 37C correspond to FIGS. 1A to 1C and FIGS. 2A to 2C of Embodiment 1. FIGS. 38A to 38C correspond to FIGS. 5A to 5C and FIGS. 6A to 6C of Embodiment 1. FIGS. 39A to 39C correspond to FIGS. 9A to 9C and FIGS. 10A to 10C of Embodiment 1. FIGS. 40A to 40C correspond to FIGS. 13A to 13C and FIGS. 14A to 14C of Embodiment 1. FIGS. 41A to 41C correspond to FIGS. 17A to 17C and FIGS. 18A to 18C of Embodiment 1. FIG. 42 corresponds to FIG. 21 of Embodiment 1.

First, a first conductive film 102, an insulating film 104, a semiconductor film 106, an impurity semiconductor film 108, and a second conductive film 110 are formed over a substrate 100. Materials thereof and formation methods thereof are similar to those in Embodiment 1.

Note that a mode in which a base film 101 is provided between the substrate 100 and the first conductive film 102 is described as a preferred mode in this embodiment. The base film 101 is preferred to be formed using a silicon nitride film or a silicon nitride oxide film. The provision of the base film 101 can prevent entry of an impurity metal element included in the substrate 100 into the semiconductor layer. This is particularly remarkable in the case where the base film 101 includes nitrogen. Further, it is preferred that the base film 101 include a halogen (fluorine, chlorine, or bromine). This is because an impurity metal element in the substrate 100 can be effectively prevented from entering the semiconductor layer. In order that a halogen is included in the base film 101, a gas used in formation thereof may include a halogen gas or a gas containing a halogen compound. In addition, the base film may be formed as a single layer or stacked layers by a CVD method or a sputtering method.

A first resist mask 112 is then formed over the second conductive film 110 (see FIG. 37A, FIG. 38A, FIG. 39A, FIG. 40A, and FIG. 41A). The features of the first resist mask 112 are similar to those of Embodiment 1.

Next, first etching is performed using the first resist mask 112. That is, the first conductive film 102, the insulating film 104, the semiconductor film 106, the impurity semiconductor film 108, and the second conductive film 110 are etched to form a thin-film stack body 114 and an etched first conductive film 115. After that, the first resist mask 112 is removed.

As described above, this embodiment is different from Embodiment 1 in that the first conductive film 102 is processed by the first etching so that the etched first conductive film 115 is formed. In such a manner, since the first conductive film 102 is processed by the first etching in this embodiment, it is particularly preferred that the base film 101 be provided.

Although not illustrated in this embodiment, the base film 101 may be etched by the first etching.

Here, as in Embodiment 1 or the like, oxidation treatment is performed, and then, cleaning is preferably performed (see FIG. 37B, FIG. 38B, FIG. 39B, FIG. 40B, FIG. 41B, and FIG. 42). Note that oxidation treatment may be performed without removing the first resist mask 112.

Next, by second etching, the etched first conductive film 115 is processed into a gate electrode layer 116 (see FIG. 37C, FIG. 38C, FIG. 39C, FIG. 40C, and FIG. 41C).

Here, the conditions and the like of the second etching are similar to those of the second etching of Embodiment 1, except for the following point.

In Embodiment 1, the region to be removed of the first conductive film 102 needs to be completely removed only by the second etching. Note that the region to be removed of the first conductive film 102 means a region other than the region where the gate electrode layer 116 is formed.

In Embodiment 1, the distance $d_1$ between the side surface of the thin-film stack body 114 and the side surface of the gate electrode layer 116 depends on the thickness of the first conductive film 102. The second etching includes side-etching and is substantially isotropic etching (so-called chemical etching). Hence, in the case where the distance $d_1$ is made smaller than the thickness of the first conductive film 102, it is difficult to completely remove the region to be removed of the first conductive film 102 by the method described in Embodiment 1.

As described above, the etched first conductive film 115 is formed by processing the first conductive film 102 by the first etching and the gate electrode layer 116 is formed by the second etching, whereby the distance $d_1$ can be made smaller than the thickness of the first conductive film 102. That is, the distance $d_1$ can be controlled independently of the thickness of the first conductive film 102, thereby increasing the freedom of layout design.

Note that the steps after the second etching are similar to those of Embodiment 1. That is, by combining the method described in Embodiment 1 with the method described in this embodiment, a thin film transistor can be manufactured using two photomasks in such a manner that a gate electrode layer is formed utilizing side-etching, and further, a source and drain electrode layer is formed.

As described above in this embodiment, the first conductive film 102 is processed by the first etching, whereby the distance $d_1$ between the side surface of the thin-film stack body 114 and the side surface of the gate electrode layer 116 can be designed independently of the thickness of the first conductive film 102, thereby increasing the freedom of layout design.

Note that the methods for manufacturing a thin film transistor and a display device according to this embodiment are similar to those of Embodiment 1 except for the point described above. As a result, effects similar to those of the methods for manufacturing a thin film transistor and a display device of Embodiment 1 can be naturally obtained.

This embodiment may be implemented in combination with Embodiment 2. That is, a resist mask may be formed using a multi-tone mask, and the first etching may be performed using the resist mask to form the etched first conductive film.

Embodiment 4

In this embodiment, a structure in which a light-blocking layer is provided overlapping with a thin film transistor will be described.

First, a light-blocking film is formed over a substrate and a resist mask is formed over the light-blocking film.

The light-blocking film may be formed using a film of a material which can block light, and the material of the light-blocking film is not limited to a particular material. As the film of a material which can block light, a film of a material containing chromium as its main component, a resin film containing carbon black, and the like can be given, for example, and a film of a material containing chromium as its main component is preferred in terms of heat resistance. An example of the material containing chromium as its main component can be chromium, chromium oxide, chromium nitride, chromium fluoride, or the like. In addition, the light-blocking film can be formed by, for example, a sputtering method, a CVD method (e.g., a thermal CVD method or a plasma CVD method), or the like. However, the formation method of the light-blocking film is not limited to a particular method.

A first resist mask is then formed over the light-blocking film and the light-blocking film is etched using the first resist mask, whereby a light-blocking layer is formed. Although either dry etching or wet etching may be employed for the etching, dry etching is preferred. This is because, when wet etching is employed, the light-blocking film might reduce and the light-blocking layer having an adequate area might not be formed. By employing dry etching, the light-blocking layer can have a shape which strongly reflects the pattern of the first resist mask. Further, in the above etching step for forming the light-blocking layer, the substrate might be etched. For that reason, it is preferred to provide an "insulating film serving as a base" in advance between the substrate and the light-blocking film. This "insulating film serving as a base" may be formed using a material and a formation method which are similar to those of a base film described below. With the "insulating film serving as a base" between the substrate and the light-blocking film, an impurity metal element included in the substrate can be prevented from attaching to and entering a semiconductor layer. This "insulating film serving as a base" is referred to as a first base film.

Next, the first resist mask is removed, and a second base film is formed over the light-blocking layer.

The second base film is formed using an insulating material. For example, the second base film can be formed using a silicon oxide film, a silicon nitride film, a silicon oxynitride film, a silicon nitride oxide film, or the like. Note that the material of the second base film needs to have such heat resistance as to withstand a subsequent step. In addition, a material which is not unintentionally etched or eroded in a subsequent step is selected.

In the case of using a glass substrate as the substrate, a silicon nitride film or a silicon nitride oxide film is preferred to be used as at least one of the first base film and the second base film. This is because, when the second base film includes nitrogen, an impurity metal element in the glass substrate can be effectively prevented from entering a semiconductor layer. Further, it is preferred that the second base film include a halogen (fluorine, chlorine, or bromine). In the case where a halogen is included in the second base film, an impurity metal element in the glass substrate can be effectively prevented from entering a semiconductor layer. In order that a halogen is included in the second base film, a gas used in formation may include a halogen gas or a gas formed using a halogen compound.

Note that the second base film can be formed by, for example, a CVD method (e.g., a thermal CVD method or a plasma CVD method), a sputtering method, or the like; however, the formation method of the second base film is not limited to a particular method. In addition, the second base film may be formed using a single layer structure or a stacked structure including a plurality of films.

Next, a first conductive film, an insulating film, a semiconductor film, an impurity semiconductor film, and a second conductive film are formed over the second base film. These films may each have a single layer structure or a stacked structure including a plurality of films.

Subsequent steps are similar to those described in Embodiments 1 to 3.

Since a thin film transistor thus manufactured includes a light-blocking layer overlapping with the thin film transistor, the amount of light leakage current is small.

The structure described in this embodiment can be implemented in combination with any of the other embodiments.

Embodiment 5

In this embodiment, a method for manufacturing a thin film transistor having high controllability of second etching is described.

As described in Embodiment 1 with reference to FIG. 22, a gate electrode layer 116 has a horn (e.g., a horn 151) when seen from the above. This is because, since the second etching for forming the gate electrode layer 116 is substantially isotropic, etching is performed so that the distance $d_1$ between the side surface of the gate electrode layer 116 and the side surface of a thin-film stack body 114 is substantially uniform.

Thus, an opening reaching to a first conductive film 102 is provided in a portion overlapping with this horn in a resist mask used in second etching.

It is not always necessary to provide this opening in the resist mask. For example, in the case where second etching is performed without any resist mask formed, the opening may be provided only in a thin-film stack body 114 including a source and drain electrode layer 120 and the like.

Furthermore, the provision of the opening described above can increase a contact area between a film to be etched and a gas used for the etching in the second etching. Thus, controllability of the second etching can be improved, and a thin film transistor with smaller parasitic capacitance can be manufactured compared to the case where an opening is not provided. Further, insufficient insulation between adjacent wirings formed using a gate electrode layer can be prevented and a thin film transistor can be manufactured with a high yield.

In addition, by increasing the contact area between the film to be etched and the gas used for the etching in the second etching, etching can be favorably performed even in the case where etching might be hindered by a residue or the like which is generated in a manufacturing step and is left on a plane to be etched.

Further, by provision of an opening, the layout is not determined depending on the side-etching amount of the second etching. Thus, without reducing the freedom of layout design, the number of steps for manufacturing a thin film transistor and a display device can be significantly reduced.

The structure described in this embodiment can be implemented in combination with any of the other embodiments.

Embodiment 6

In this embodiment, a method for manufacturing a thin film transistor with a small amount of light leakage current is described. The method for manufacturing a thin film transistor described in this embodiment is different from that of Embodiment 4. In this embodiment, the part of a semiconductor layer which does not overlap with a gate electrode layer is removed by etching as much as possible.

In the method for manufacturing a thin film transistor in this embodiment, first, a first conductive film is formed; a thin-film stack body in which an insulating film, a semiconductor film, an impurity semiconductor film, and a second conductive film are formed to be stacked in this order is formed over the first conductive film; a resist mask including three regions with different thicknesses (from a region with the smallest thickness, referred to as a first region, a second region, and a third region) is formed over the thin-film stack body; at least a surface of the first conductive film is exposed by first etching; the thin-film stack body is patterned; and the first conductive film is patterned by second etching. The resist mask is then made to recede (reduce) to remove the first region of the resist mask and to expose the second conductive film overlapping with the first region. Third etching is performed on the second conductive film which is exposed to remove the insulating film, the semiconductor film, the impurity semiconductor film, and the second conductive film which has overlapped with the first region. After the third etching, the resist mask is made to recede (reduce) to remove the second region of the resist mask and to expose the second conductive film which has overlapped with the second region. Fourth etching is performed on the second conductive film which is exposed to remove a part of the semiconductor film, the impurity semiconductor film, and the second conductive film which has overlapped with the second region.

Here, the first etching may be performed in a manner similar to that of the first etching in Embodiment 1. The second etching may be performed in a manner similar to that of the second etching in Embodiment 1. The third etching may be performed in a manner similar to the first etching so as not to etch a first conductive film 102. The fourth etching may be performed in a manner similar to that of the third etching described in Embodiment 1.

Note that the resist mask including three regions with different thicknesses can be formed using a four-tone photomask, for example. An example of such a four-tone photomask is described below.

The four-tone photomask is formed with a first semi-light-transmitting portion formed with a semi-light-transmitting film, a second semi-light-transmitting portion whose light transmittance is lower than that of the first semi-light-transmitting portion, and a light-blocking portion formed with a light-blocking film over a light-transmitting substrate.

As the light-transmitting substrate, quartz or the like can be used.

The first semi-light-transmitting portion can be formed using a film of MoSiN, MoSi, MoSiO, MoSiON, CrSi, or the like.

The light-blocking portion may be formed using a metal film, and preferably formed using chromium, chromium oxide, chromium nitride, or the like.

The second semi-light-transmitting portion may be formed with films having a lower light transmittance than the first semi-light-transmitting portion and a higher light transmittance than the light-shielding portions. The second semi-light-transmitting portion may thus be formed with a semi-light-transmitting film in a manner similar to that of the first semi-light-transmitting portion or the like, or may be formed with a metal film in a manner similar to that of the light-blocking portion. The light transmittance can be adjusted by the control of the thickness of the film, the kind of material thereof, or the like.

In the case where the four-tone mask is irradiated with light for light exposure, regions overlapping with the light-blocking portions have a light transmittance of approximately 0% and regions not provided with either the light-blocking portion or the semi-light-transmitting portions (the first semi-light-transmitting portion and the second semi-light-transmitting portion) have a light transmittance of approximately 100%. Further, the light transmittance of the semi-light-transmitting portion is approximately 10% to 70%, which can be adjusted by the control of the kind of material, the thickness, or the like thereof.

It is preferred that the first semi-light-transmitting portion and the second semi-light-transmitting portion have light transmittances which are in the above range and are significantly different from each other. This is because, by making the difference large in the thickness of resists to be formed between regions, a sufficient margin in a manufacturing process can be obtained. Thus, it is preferred that the first semi-light-transmitting portion have a light transmittance of approximately 10 to 20%, and that the second semi-light-transmitting portion have a light transmittance of approximately 60 to 70%. Note that, in the case where there are regions where the first semi-light-transmitting portion and the second semi-light-transmitting portion overlap with each other, it is preferred that the second semi-light-transmitting portion have a light transmittance of approximately 60 to 70% as a result of the overlap of the first semi-light-transmitting portion and the second semi-light-transmitting portion.

As described above, by light exposure using the multi-tone mask which is a four-tone mask, and development, the resist mask which includes three regions with different thicknesses can be formed.

Note that, the multi-tone mask which is a four-tone mask used in this embodiment is not limited to the above description, and the multi-tone mask which is a four-tone mask may be any photomask with which a resist mask including three regions with different thicknesses can be formed.

As described above, by formation of the resist mask including three regions with different thicknesses using the four-tone photomask, most of the semiconductor layer is light-blocked by the gate electrode layer. In particular, since the semiconductor layer included in the thin film transistor is light-blocked by the gate electrode layer, a thin film transistor with a small amount of light leakage current can be obtained.

Note that the method for forming the resist mask including three regions with different thicknesses is not limited to the method using the four-tone photomask described above. For example, a resist mask including two regions with different thicknesses may be formed using a three-tone photomask, and then, light exposure may be further performed using another photomask to form the resist mask including three regions with different thicknesses. Alternatively, a resist mask including two regions with different thicknesses may be formed using a three-tone photomask, and then, light exposure of a desired region may be performed by laser irradiation or the like to form the resist mask including three regions with different thicknesses.

The structure described in this embodiment can be implemented in combination with any of the other embodiments. For example, by oxidizing a side surface of a thin-film stack body by an oxidation step for forming a second resist mask, formation of the second resist mask and formation of the thin-film stack body can be performed in the same step.

Embodiment 7

In this embodiment, a preferred mode of a display device in which features of a thin film transistor manufactured according to Embodiment 1 are utilized is described.

Figure 43A:
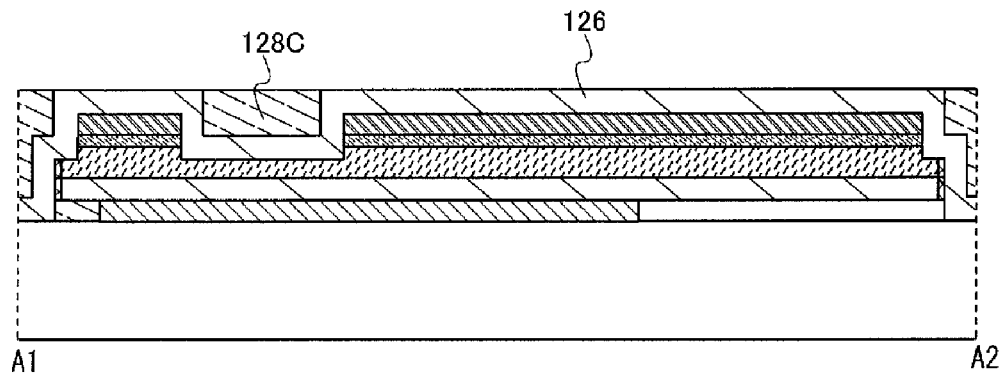
FIGS. 43A to 43C illustrate an example of a method for manufacturing a thin film transistor and a display device.

First, a thin film transistor is manufactured, for example, as in FIG. 3B in Embodiment 1. A first protective insulating film 126 and a second protective insulating film 128C are formed so as to cover this thin film transistor (see FIG. 43A). Here, the second protective insulating film 128C is formed using a color filter by a droplet discharging method (including a formation method using an inkjet), a printing method, or a photolithography method.

Figure 1B:
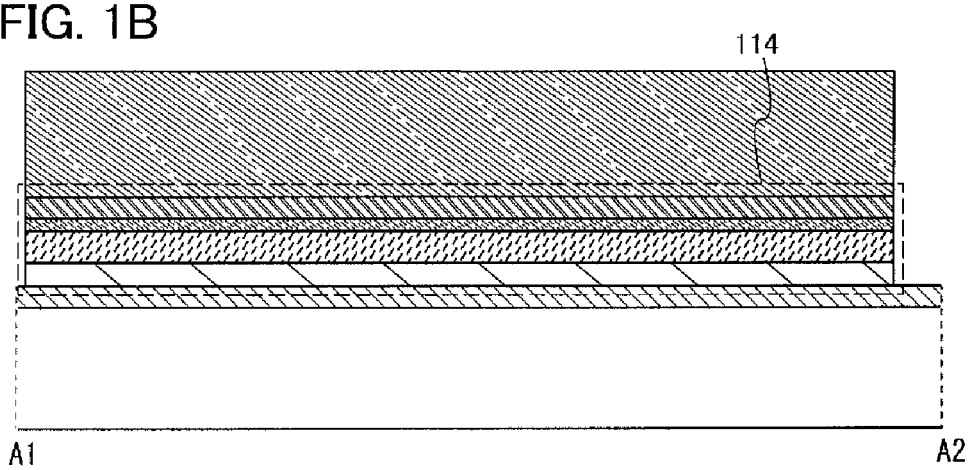
Figure 1C:
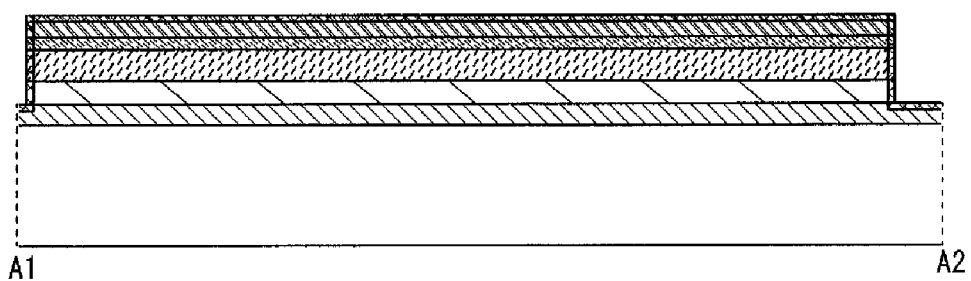
Figure 43B:
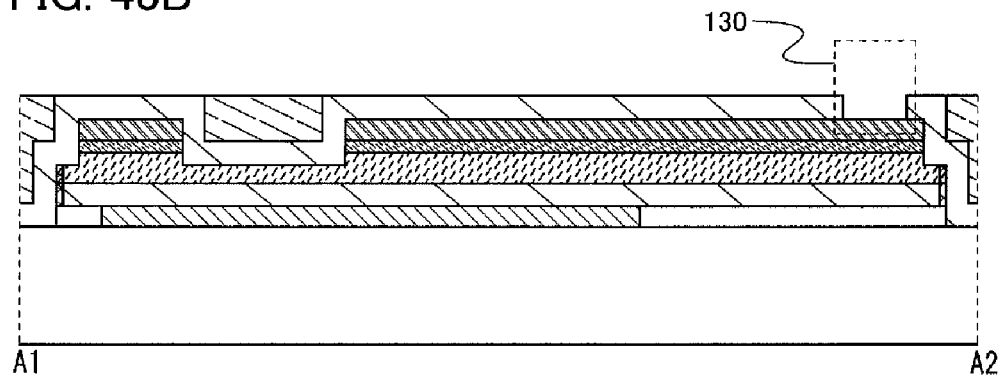
Figure 43C:
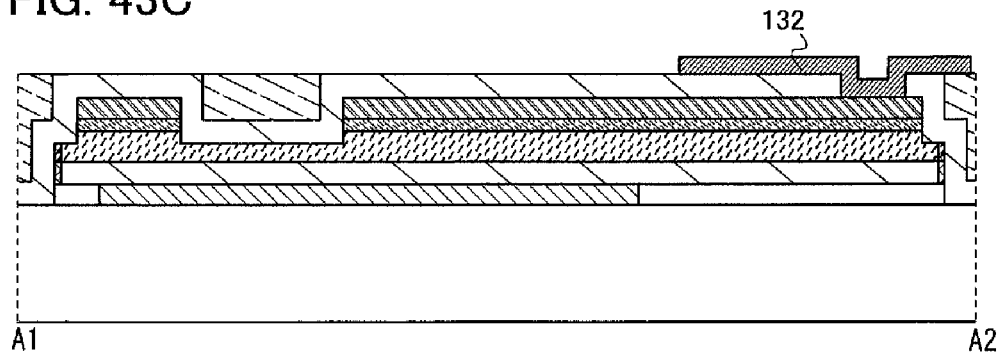

Here, unlike FIGS. 1A to 1C in Embodiment 1, the second protective insulating film 128C is formed so as to fill a depressed portion of the thin film transistor covered with the first protective insulating film 126, whereby the first protective insulating film 126 over a source and drain electrode layer 120, which is the highest region, is exposed. By forming the first protective insulating film 126 in this manner, the second protective insulating film 128C between adjacent pixels is separated with a source wiring as a boundary. Thus, the color filter films can be separately formed by forming the second protective insulating film 128C between adjacent pixels using a material to be the color filters of different colors. As in Embodiment 1, a first opening 130 is then formed (see FIG. 43B), and through the first opening 130, a pixel electrode layer 132 is formed so as to be electrically connected to the source and drain electrode layer 120 (see FIG. 43C).

Figure 44:
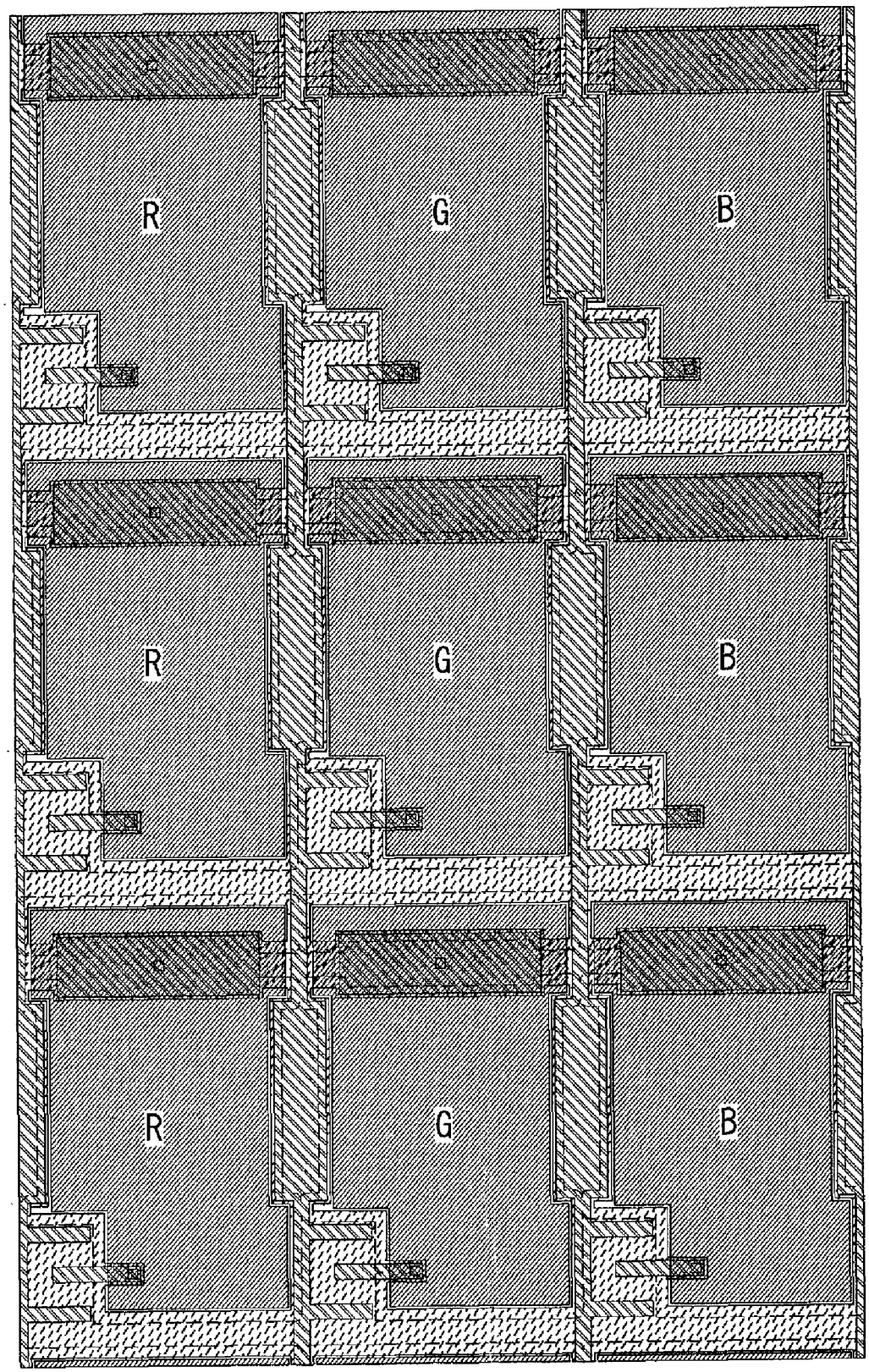
FIG. 44 illustrates an example of a method for manufacturing a thin film transistor and a display device.

A display device of this embodiment in the case of arranging nine pixels is illustrated in FIG. 44. The character R represents a pixel where a red color filter is arranged, the character G represents a pixel where a green color filter is arranged, and the character B represents a pixel where a blue color filter is arranged. By selectively forming the color filter films in this manner, the color filters can be arranged in stripes. Note that when the second protective insulating film 128C is formed thinner, the color filter films between adjacent pixels can be separately formed with a gate wiring as a boundary; thus, it is possible to employ a delta arrangement, a stripe arrangement, a square arrangement, and the like.

As described above, a display device having a color-filter-on-array (COA) structure can be manufactured.

In a liquid crystal display device described in this embodiment, disordered alignment of liquid crystals is suppressed by the second protective insulating film 128C. In addition, by separately forming the second protective insulating film 128C including a material to be a color filter utilizing a height difference of the thin film transistor, the color filters can be formed favorably.

The structure described in this embodiment can be implemented in combination with any of the other embodiments.

Embodiment 8

In this embodiment, a thin film transistor which is mechanically stable is described.

In a position which overlaps with a first opening 130 in FIG. 25 which is referred to in Embodiment 1, a large cavity is formed in contact with a gate electrode layer 116. Such a cavity makes the thin film transistor mechanically less stabilized, whereby this portion might be damaged or destroyed; as a result, reduction in yield and reliability is caused.

For that reason, in this embodiment, a gate electrode layer 116 is formed in a position of the first opening 130. The reduction in yield and reliability can thus be suppressed.

For provision of the gate electrode layer 116 in the first opening 130, for example, the region where the first opening 130 is provided may be large; specifically, an edge of a thin-film stack body 114 may be formed apart form an edge of the first opening 130 by a distance $d_1$.

In accordance with this embodiment, the thin film transistor (in particular, a thin film transistor included in a display device) can be mechanically stable, whereby reduction in yield and reliability can be suppressed.

The structure described in this embodiment can be implemented in combination with any of the other embodiments Embodiment 9

In this embodiment, an example of a method for manufacturing a thin film transistor and a method for manufacturing an EL display device in which the thin film transistors are arranged in a matrix form will be described with reference to FIG. 45, FIG. 46, FIG. 47, FIG. 48, FIG. 49, FIG. 50, FIGS. 51A to 51C, FIGS. 52A to 52C, FIGS. 53A to 53C, FIGS. 54A and 54B, and FIGS. 55A to 55C. Note that in this embodiment, a structure in which a base film is provided under a gate electrode layer is described.

Figure 45:
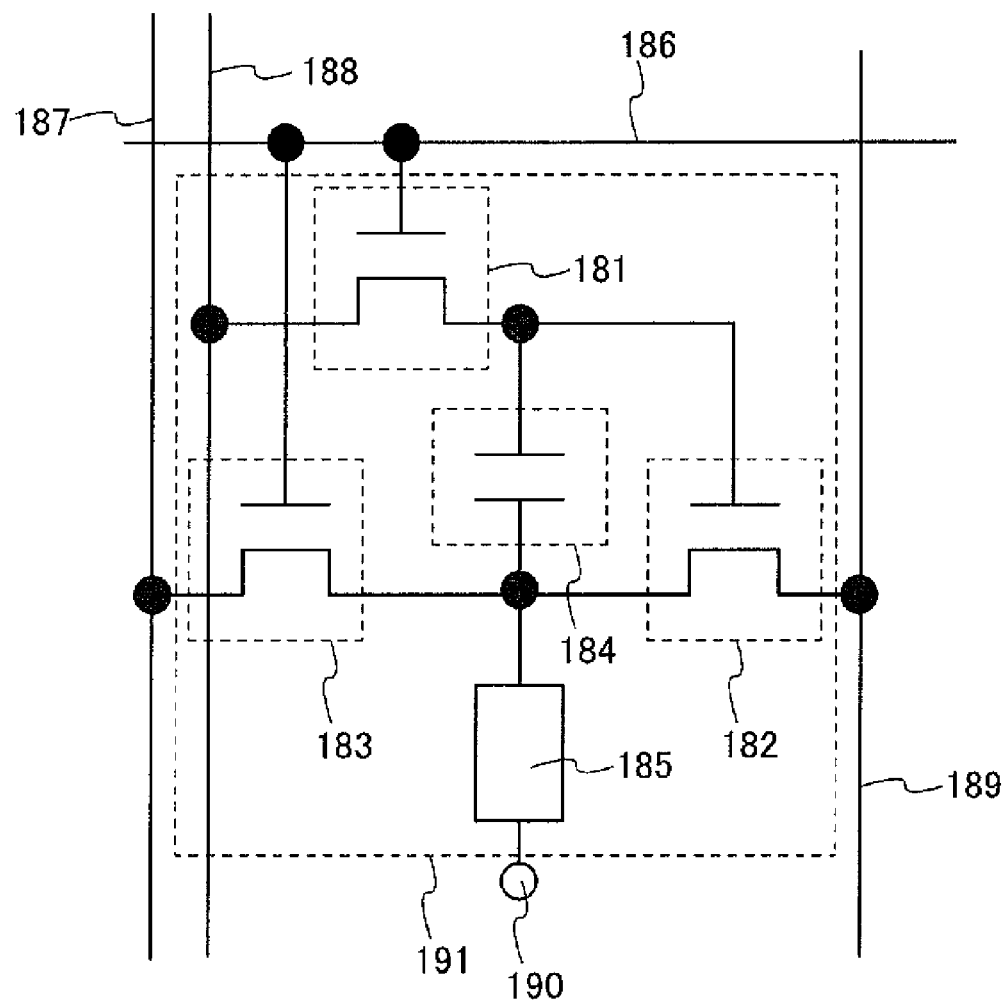
FIG. 45 illustrates an example of a pixel circuit of an EL display device.
Figure 46:
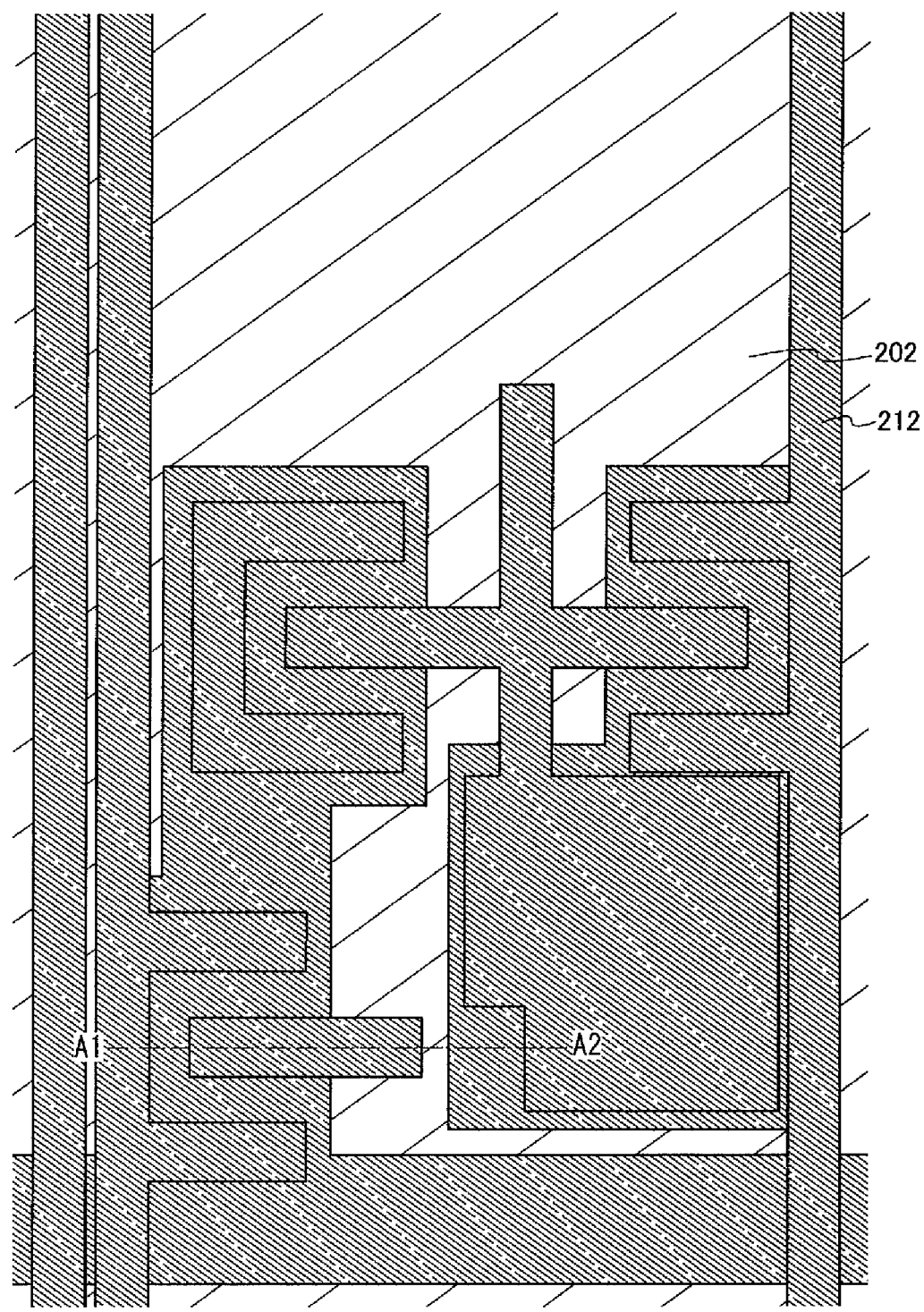
FIG. 46 illustrates an example of a method for manufacturing a thin film transistor and a display device.

Various pixel circuits for EL display devices (active EL display devices) which use thin film transistors as switching elements are considered. In this embodiment, an example of a simple pixel circuit is illustrated in FIG. 45 and a method for forming a pixel structure to which this pixel circuit is applied is described. Note that the pixel circuit of the EL display device is not limited to the one having the structure illustrated in FIG. 45.

In the pixel structure of the EL display device illustrated in FIG. 45, a pixel 191 includes a first transistor 181, a second transistor 182, a third transistor 183, a capacitor 184, and a light-emitting element 185. The first, second, and third transistors are n-channel transistors. A gate electrode of the first transistor 181 is electrically connected to a gate wiring 186, one of a source electrode and a drain electrode (referred to as a first electrode) of the first transistor 181 is electrically connected to a source wiring 188, and the other of the source electrode and the drain electrode (referred to as a second electrode) of the first transistor 181 is electrically connected to a gate electrode of the second transistor 182 and one electrode (referred to as a first electrode) of the capacitor 184. The other electrode (referred to as a second electrode) of the capacitor 184 is electrically connected to one of a source electrode and a drain electrode (referred to as a first electrode) of the second transistor 182, one of a source electrode and a drain electrode (referred to as a first electrode) of the third transistor 183, and one electrode (referred to as a first electrode) of the light-emitting element 185. The other of the source electrode and the drain electrode (referred to as a second electrode) of the second transistor 182 is electrically connected to a second power supply line 189. The other of the source electrode and the drain electrode (referred to as a second electrode) of the third transistor 183 is electrically connected to a first power supply line 187, and a gate electrode of the third transistor 183 is electrically connected to the gate wiring 186. The other electrode (referred to as a second electrode) of the light-emitting element 185 is electrically connected to a common electrode 190. Note that the potential of the first power supply line 187 is different from that of the second power supply line 189.

The operation of the pixel 191 will be described. When the third transistor 183 is turned on by a signal input to the gate wiring 186, the first electrode of the second transistor 182, the first electrode of the light-emitting element 185, and the second electrode of the capacitor 184 each have a potential equal to that of the first power supply line 187 ($V_{187}$). Here, since the potential ($V_{187}$) of the first power supply line 187 is constant, the potential of the first electrode of the second transistor 182 and the like is constant ($V_{187}$).

When the first transistor 181 is selected and turned on by the signal input to the gate wiring 186, the potential of the signal from the source wiring 188 ($V_{188}$) is input to the gate electrode of the second transistor 182 through the first transistor 181. At this time, when the potential of the second power supply line 189 ($V_{189}$) is higher than the potential of the first power supply line 187 ($V_{187}$), the relation, $V_{gs}=V_{188}-V_{187}$, is obtained. When $V_{gs}$ is higher than the threshold voltage of the second transistor 182, the second transistor 182 is turned on.

In the case of operating the second transistor 182 in a linear region, the potential of the source wiring 188 ($V_{188}$) is changed (e.g., binary values) so as to control on and off of the second transistor 182. That is, it can be controlled whether voltage is applied to the EL layer included in the light-emitting element 185.

In the case of operating the second transistor 182 in a saturation region, the potential of the source wiring 188 ($V_{188}$) is changed, so that the amount of current flowing through the light-emitting element 185 can be controlled.

In the above-described manner, in the case of operating the second transistor 182 in a linear region, it can be controlled whether voltage is applied to the light-emitting element 185. The light-emitting state and the non-light-emitting state of the light-emitting element 185 can thus be controlled. The driving method like this can be used for digital time grayscale driving, for example. The digital time grayscale driving is a driving method in which one frame is divided into a plurality of subframes and the light-emitting state and the non-light-emitting state of the light-emitting element 185 are controlled in each subframe. In addition, in the case of operating the second transistor 182 in a saturation region, the amount of current flowing through the light-emitting element 185 can be controlled and luminance of the light-emitting element 185 can be adjusted.

Figure 55A:
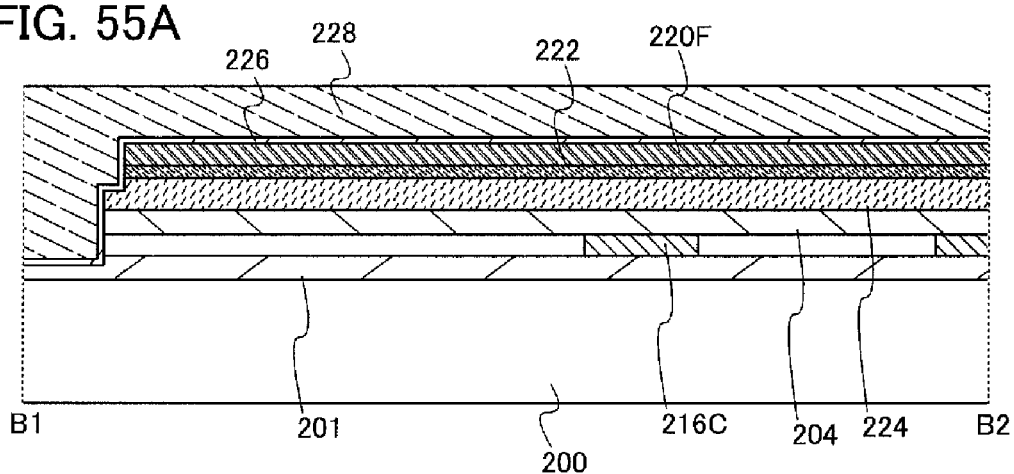
FIGS. 55A to 55C illustrate an example of a method for manufacturing a thin film transistor and a display device.
Figure 55B:
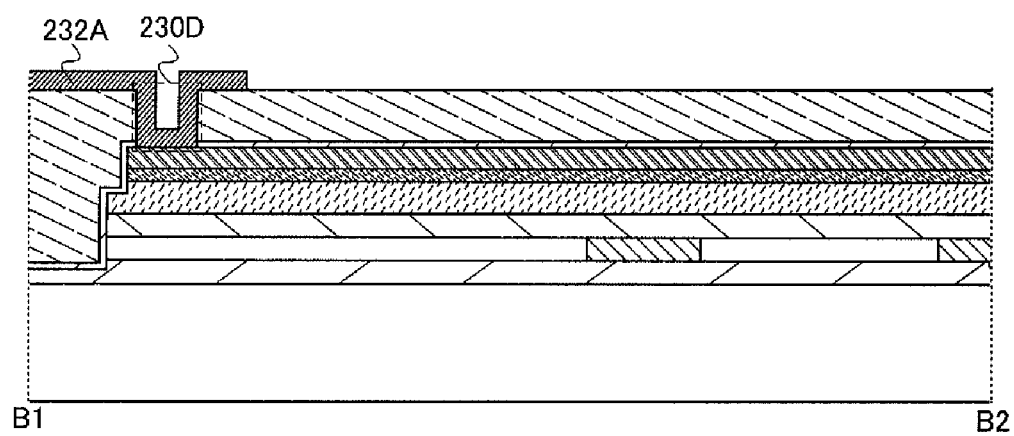
Figure 55C:
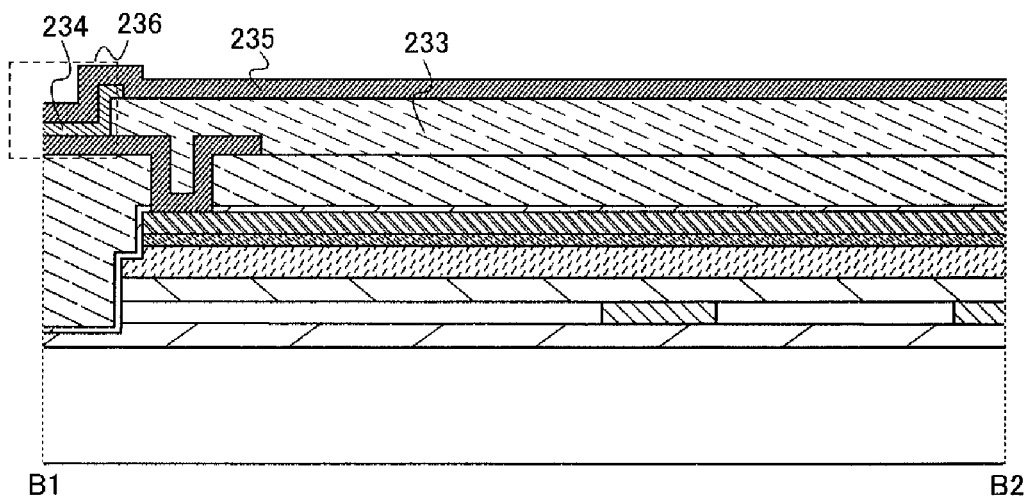

Next, a pixel structure to which the pixel circuit illustrated in FIG. 45 is applied and a manufacturing method thereof will be described below. FIGS. 55A to 55C are cross-sectional views taken along line B1-B2 in FIG. 50.

Figure 48:
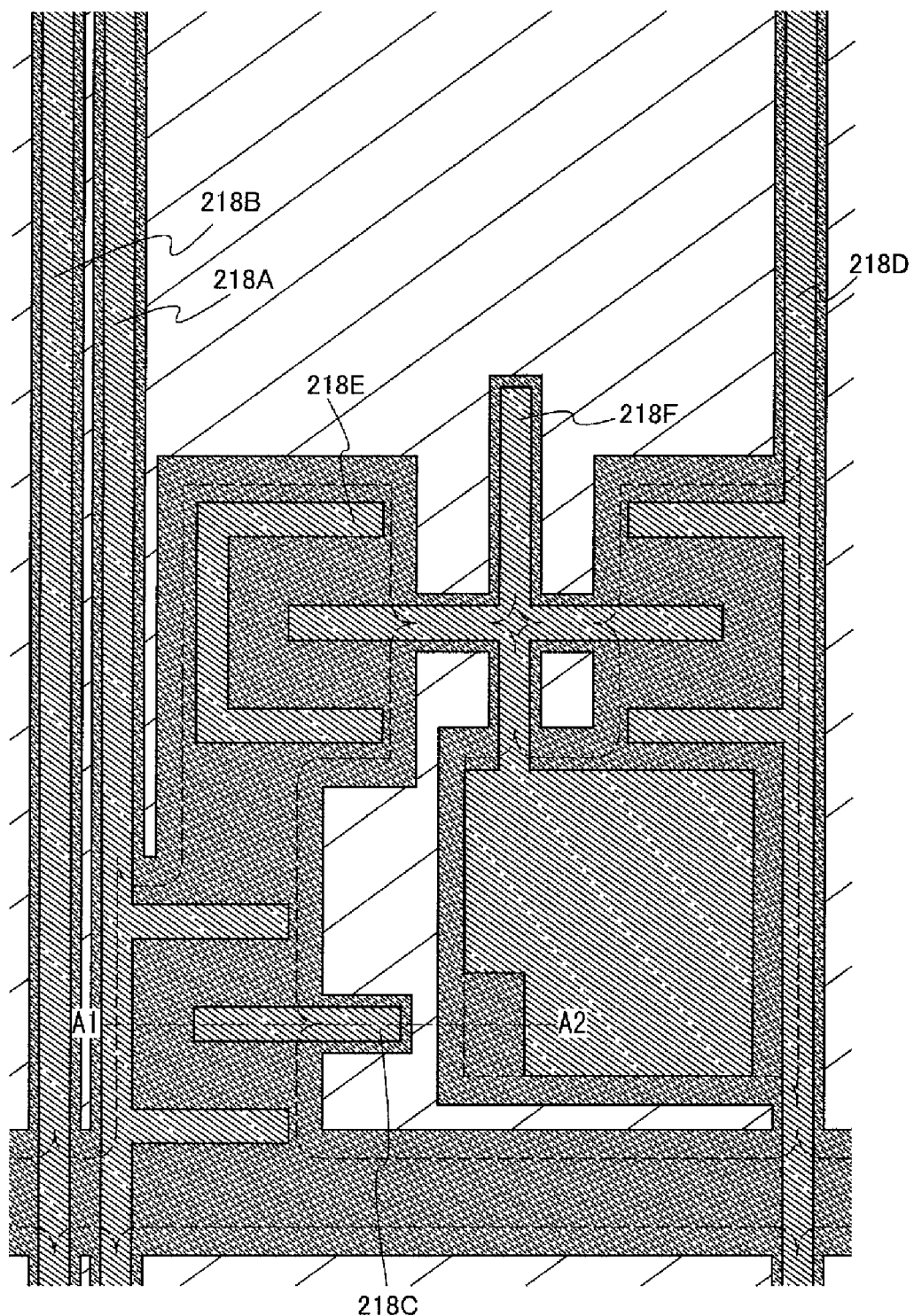
FIG. 48 illustrates an example of a method for manufacturing a thin film transistor and a display device.
Figure 49:
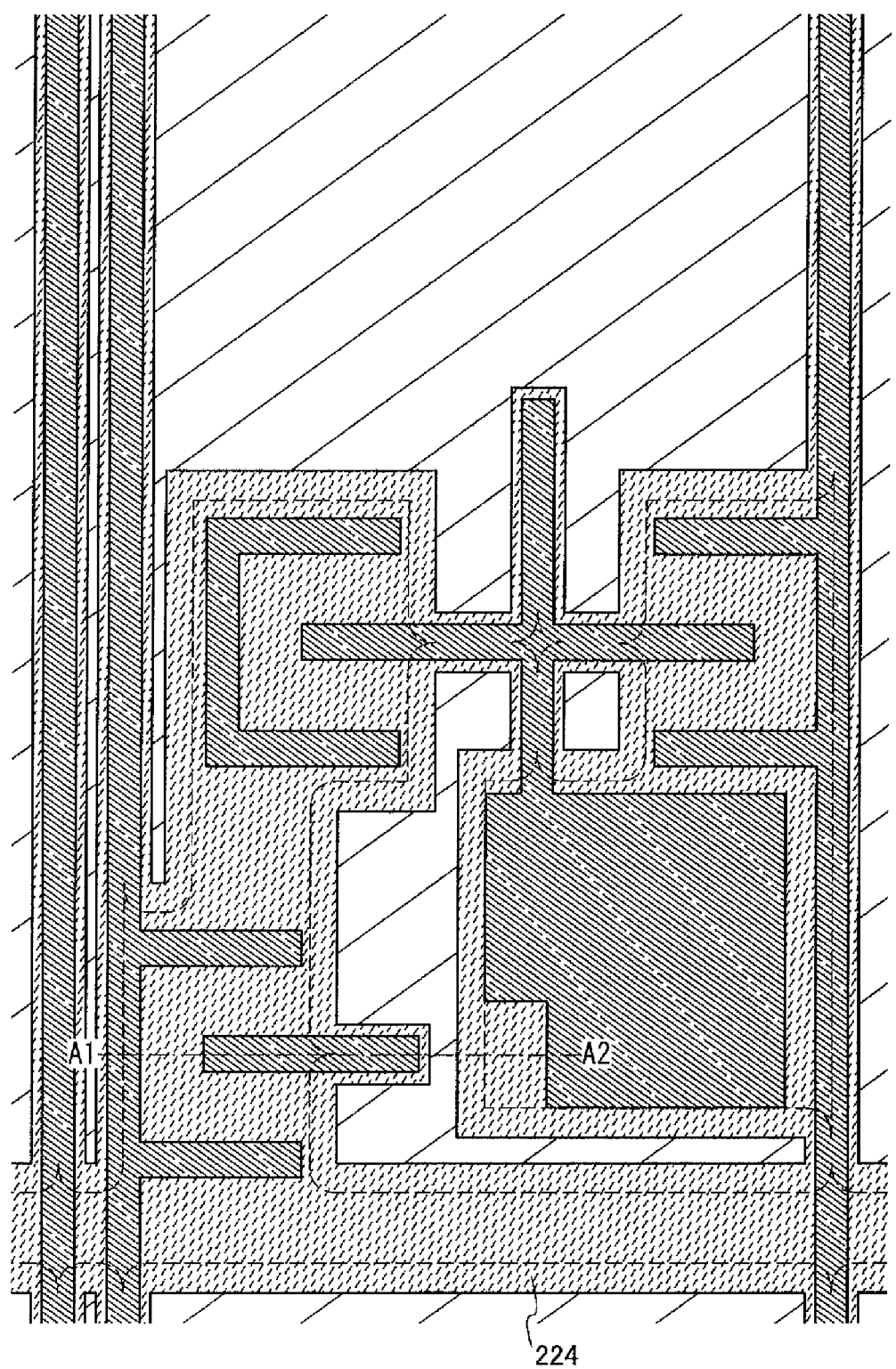
FIG. 49 illustrates an example of a method for manufacturing a thin film transistor and a display device.
Figure 50:
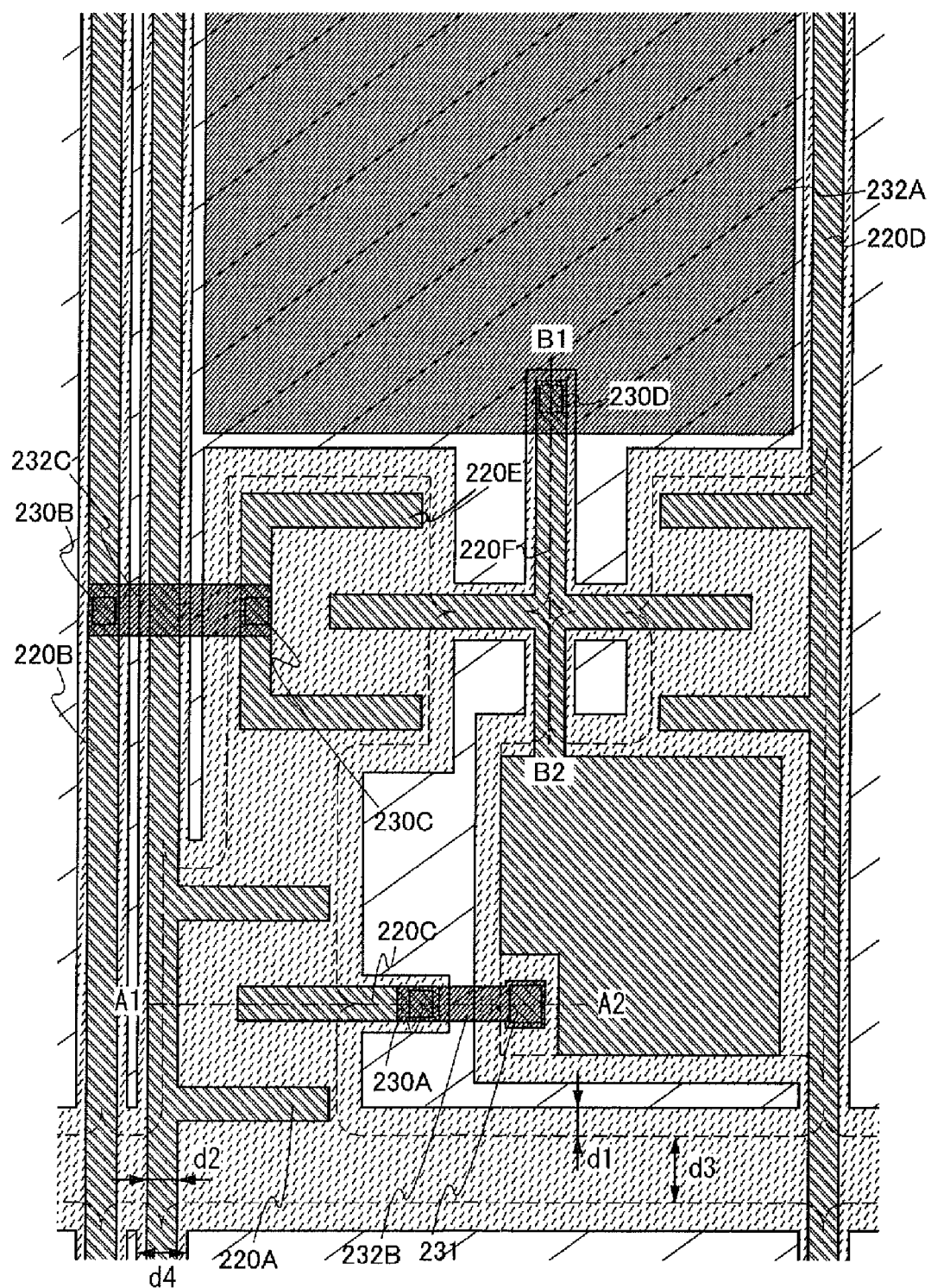
FIG. 50 illustrates an example of a method for manufacturing a thin film transistor and a display device.

FIG. 46, FIG. 47, FIG. 48, FIG. 49, and FIG. 50 are top views of pixels of EL display devices according to this embodiment. FIG. 50 is a completion view in the situation that formation of a pixel electrode is finished. FIGS. 51A to 51C, FIGS. 52A to 52C, FIGS. 53A to 53C, and FIGS. 54A and 54B are cross-sectional views taken along the line A1-A2 in FIG. 46, FIG. 47, FIG. 48, FIG. 49, and FIG. 50.

First, a base film 201, a first conductive film 202, an insulating film 204, a semiconductor film 206, an impurity semiconductor film 208, and a second conductive film 210 are formed over a substrate 200.

Note that a substrate similar to the substrate 100 in Embodiment 1 can be used as the substrate 200. A material and a formation method of the base film 201 can be similar to those of the base film 101 in Embodiment 3. A material and a formation method of the first conductive film 202 can be similar to those of the first conductive film 102 in Embodiment 1. A material and a formation method of the insulating film 204 can be similar to those of the base film 101 in Embodiment 3.

A stacked film of a crystalline semiconductor film and an amorphous semiconductor film is preferably used as the semiconductor film 206. A polycrystalline semiconductor film, a microcrystalline semiconductor film, and the like can be given as the crystalline semiconductor film.

The polycrystalline semiconductor film means a semiconductor film which includes crystal grains and many grain boundaries between the crystal grains. The polycrystalline semiconductor film is formed by, for example, a thermal crystallization method or a laser crystallization method. Here, the thermal crystallization method means a crystallization method in which an amorphous semiconductor film is formed over a substrate and the amorphous semiconductor is crystallized by heating the substrate. The laser crystallization method means a crystallization method in which an amorphous semiconductor film is formed over a substrate and the amorphous semiconductor film is irradiated with a laser beam to crystallize the amorphous semiconductor. Alternatively, a crystallization method in which an element which promotes crystallization such as nickel is added to cause crystallization may be used. In the case where crystallization is performed by adding the element which promotes crystallization, the semiconductor film is preferably subjected to laser irradiation.

The polycrystalline semiconductor is classified into low temperature poly silicon (LTPS), which is obtained by crystallization at such a temperature and for such time as not to cause strain in a glass substrate, and high temperature poly silicon (HTPS), which is obtained by crystallization at higher temperature.

The microcrystalline semiconductor film means a semiconductor film including crystal grains each having a diameter of approximately 2 nm to 100 nm inclusive, and includes in its category a semiconductor film whose entire surface is formed of only crystal grains and a semiconductor film in which amorphous semiconductor exists between crystal grains. As a formation method of the microcrystalline semiconductor film, a method in which a crystal nucleus is formed and made to grow; a method in which an amorphous semiconductor film, an insulating film in contact with the amorphous semiconductor film, and a metal film are formed and the metal film is irradiated with a laser beam so that the amorphous semiconductor is crystallized by heat generated in the metal film; or the like may be employed. Note that a crystalline semiconductor film formed by performing a thermal crystallization method or a laser crystallization method on an amorphous semiconductor film is not included in the category of the microcrystalline semiconductor film.

For example, when a stacked film formed by stacking an amorphous semiconductor film over a crystalline semiconductor film is used as the semiconductor film 206, a transistor included in a pixel circuit of an EL display device can be operated at high speed. Here, a polycrystalline semiconductor (including LTPS and HTPS) film or a microcrystalline semiconductor film may be used as the crystalline semiconductor film.

When an amorphous semiconductor film is placed over a crystalline semiconductor film, a surface of the microcrystalline semiconductor film can be prevented from being oxidized. In addition, withstand voltage can be increased and off current can be reduced.

Note that the crystallinity of the semiconductor film 206 is not particularly limited as long as the pixel circuit of the EL display device is operated normally.

The impurity semiconductor film 208 is a semiconductor film containing an impurity element imparting one conductivity type and is formed using a gas such as a gas for the preparation of semiconductor gas to which the impurity element imparting one conductivity type is added. Since an n-channel thin film transistor is provided in this embodiment, a silicon film containing phosphorus may be provided as the impurity semiconductor film 208 by using a silane gas containing phosphine (chemical formula: $PH_3$), for example. Note that as in the case of the first conductive film 202, the material of the impurity semiconductor film 208 need to have such heat resistance and be not unintentionally etched or eroded in a later step. As long as these conditions are satisfied, the material of the impurity semiconductor film 208 is not limited to a particular material. Note that the crystallinity of the impurity semiconductor film 208 is not particularly limited either. In the case where a region capable of an ohmic contact with a source and drain electrode layer is provided in a part of the semiconductor layer formed using the semiconductor film 206 by doping or the like, the impurity semiconductor film 208 does not have to be provided.

Since an n-channel thin film transistor is manufactured in this embodiment, arsenic or the like may be used as the impurity element imparting one conductivity type, and arsine (chemical formula: $AsH_3$) may be included at a desired concentration in a silane gas used for formation of the impurity semiconductor film 208.

Note that the impurity semiconductor film 208 can be formed by, for example, a CVD method (including a thermal CVD method, a plasma CVD method, and the like) or the like; however, the formation method of the impurity semiconductor film 208 is not limited to a particular method.

The second conductive film 210 can be formed using a material which is similar to the material of the second conductive film 110 in Embodiment 1 but is different from the material of the first conductive film 202. The second conductive film 210 can be formed by a similar method to the method for forming the second conductive film 110 in Embodiment 1.

Figure 51A:
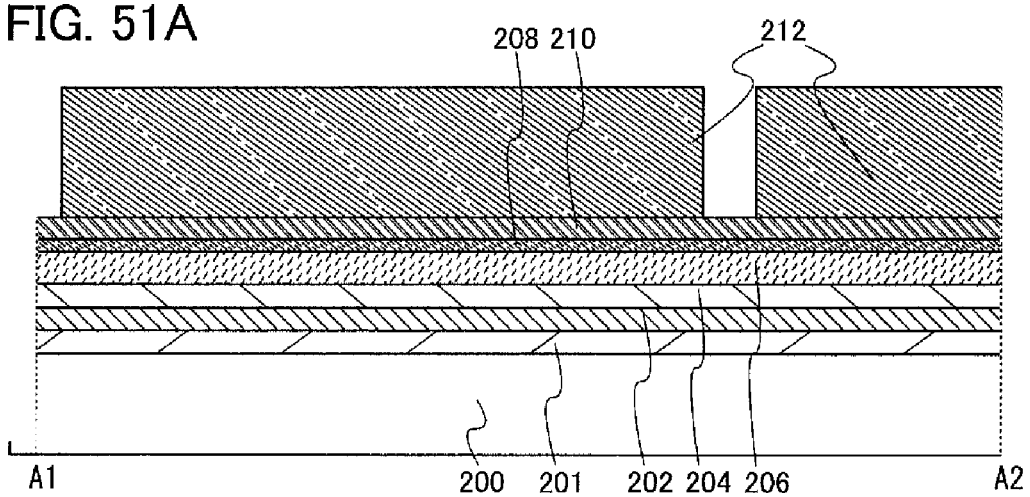
FIGS. 51A to 51C illustrate an example of a method for manufacturing a thin film transistor and a display device.
Figure 51B:
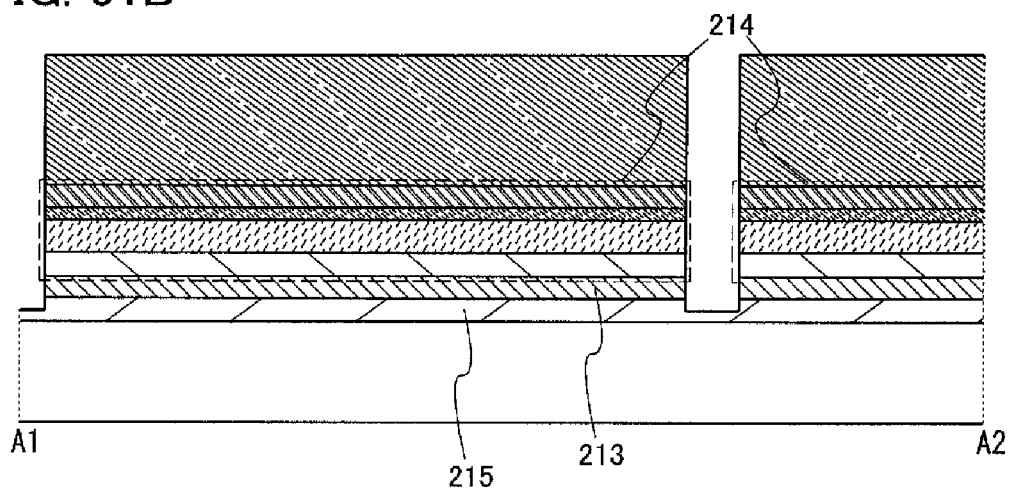
Figure 51C:
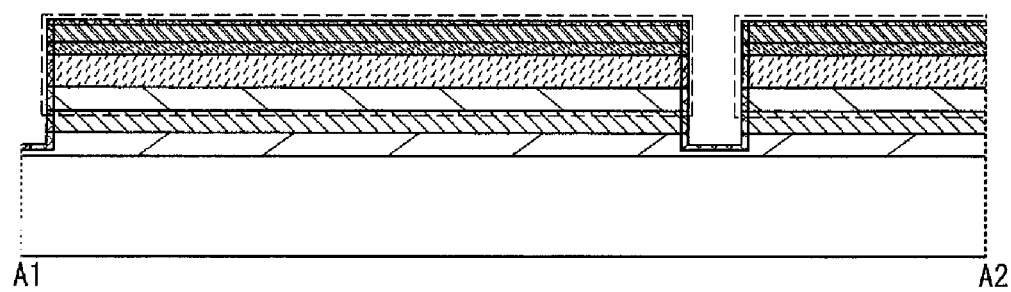

Next, a first resist mask 212 is formed over the second conductive film 210 (see FIG. 51A). Here, it is preferable that the first resist mask 212 be a resist mask having a depressed portion or a projected portion like the first resist mask 170 in Embodiment 2. In other words, the first resist mask 212 can also be referred to as a resist mask including a plurality of regions (here, two regions) having different thicknesses. In the first resist mask 212, the thicker region is called a projected portion of the first resist mask 212 and the thinner region is called a depressed portion of the first resist mask 212. Note that this embodiment is not limited to the above description, and a resist mask which does not have a depressed portion and a projected portion may also be used like Embodiment 1.

In the first resist mask 212, the projected portion is formed on a region where a source and drain electrode layer 220 is formed, and the depressed portion is formed on a region where a semiconductor layer 224 is exposed without existence of the source and drain electrode layer 220.

When the first resist mask 212 is a resist mask having the depressed portion or the projected portion, the first resist mask 212 can be formed using a multi-tone mask as described in Embodiment 2.

Next, first etching is performed using the first resist mask 212 in a manner similar to that of Embodiment 1. That is, the first conductive film 202, the insulating film 204, the semiconductor film 206, the impurity semiconductor film 208, and the second conductive film 210 are patterned by etching, whereby a thin-film stack body 214 and an etched first conductive film 213 are formed (see FIG. 46 and FIG. 51B). In this case, an upper portion of the base film 201 is also etched to form an etched insulating film 215. Similarly to Embodiment 1, the first etching is preferably performed by dry etching. In other words, it is preferred that dry etching is employed for a step of forming the etched first conductive film 213 by processing the first conductive film 202. After that, the first resist mask 212 is removed. Note that the base film 201 is not always necessarily etched.

By the etched insulating film 215 which serves as a base film, unintentional etching of the substrate 200 can be prevented in the first etching. As a result, an impurity metal element included in the substrate 200 can be prevented from attaching to and entering the semiconductor layer 224.

Figure 52A:
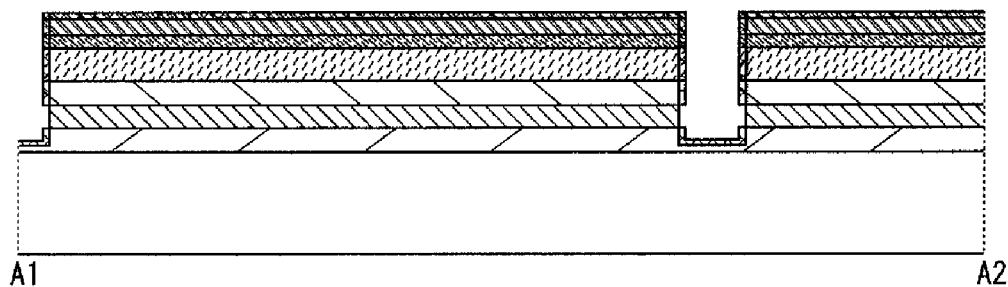
FIGS. 52A to 52C illustrate an example of a method for manufacturing a thin film transistor and a display device.

Here, oxidation treatment is performed as in Embodiment 1 (see FIG. 51C), and then, cleaning is preferably performed (FIG. 52A). Note that the oxidation treatment may be performed without removal of the first resist mask 212.

Next, second etching is performed. That is, the first conductive film 202 is etched to be patterned, whereby a gate electrode layer 216 is formed (see FIG. 47 and FIG. 52B).

Note that the gate electrode layer 216 forms the gate electrode of the thin film transistor, the gate wiring, one electrode of the capacitor, and the supporting portion. When a gate electrode layer is referred to as a "gate electrode layer 216A", the gate electrode layer forms the gate wiring, the gate electrode of the first transistor 181, and the gate electrode of the third transistor 183. When a gate electrode layer is referred to as a "gate electrode layer 216B", the gate electrode layer forms the gate electrode of the second transistor 182 and one electrode of the capacitor 184. When a gate electrode layer is referred to as a "gate electrode layer 216C", the gate electrode layer forms the supporting portion. These gate electrode layers are collectively referred to as the gate electrode layer 216.

The second etching is performed under such etching conditions that a side surface of the gate electrode layer 216 formed using the first conductive film 202 is provided more on the inside than a side surface of the thin-film stack body 214. In other words, the second etching is performed so that the side surface of the gate electrode layer 216 is in contact with a bottom surface of the thin-film stack body 214 (so that the width of the gate electrode layer 216 is narrower than that of the thin-film stack body 214 in the cross section along line A1-A2 in FIGS. 51A to 51C). Further, the second etching is performed under such conditions that the etching rate to the second conductive film 210 is low and the etching rate to the first conductive film 202 is high. In other words, the second etching is performed under the conditions that the etching selectivity of the first conductive film 202 to the second conductive film 210 is high. By performing the second etching under such conditions, the gate electrode layer 216 can be formed.

Note that the shape of the side surface of the gate electrode layer 216 is not particularly limited. For example, the shape may be a tapered shape. The shape of the side surface of the gate electrode layer 216 is determined depending on the conditions such as an etching gas used in the second etching.

Here, the phrase "the conditions that the etching rate to the second conductive film 210 is low and the etching rate to the first conductive film 202 is high" or "the conditions that the etching selectivity of the first conductive film 202 to the second conductive film 210 is high" means conditions satisfying the following first requirement and second requirement.

Figure 47:
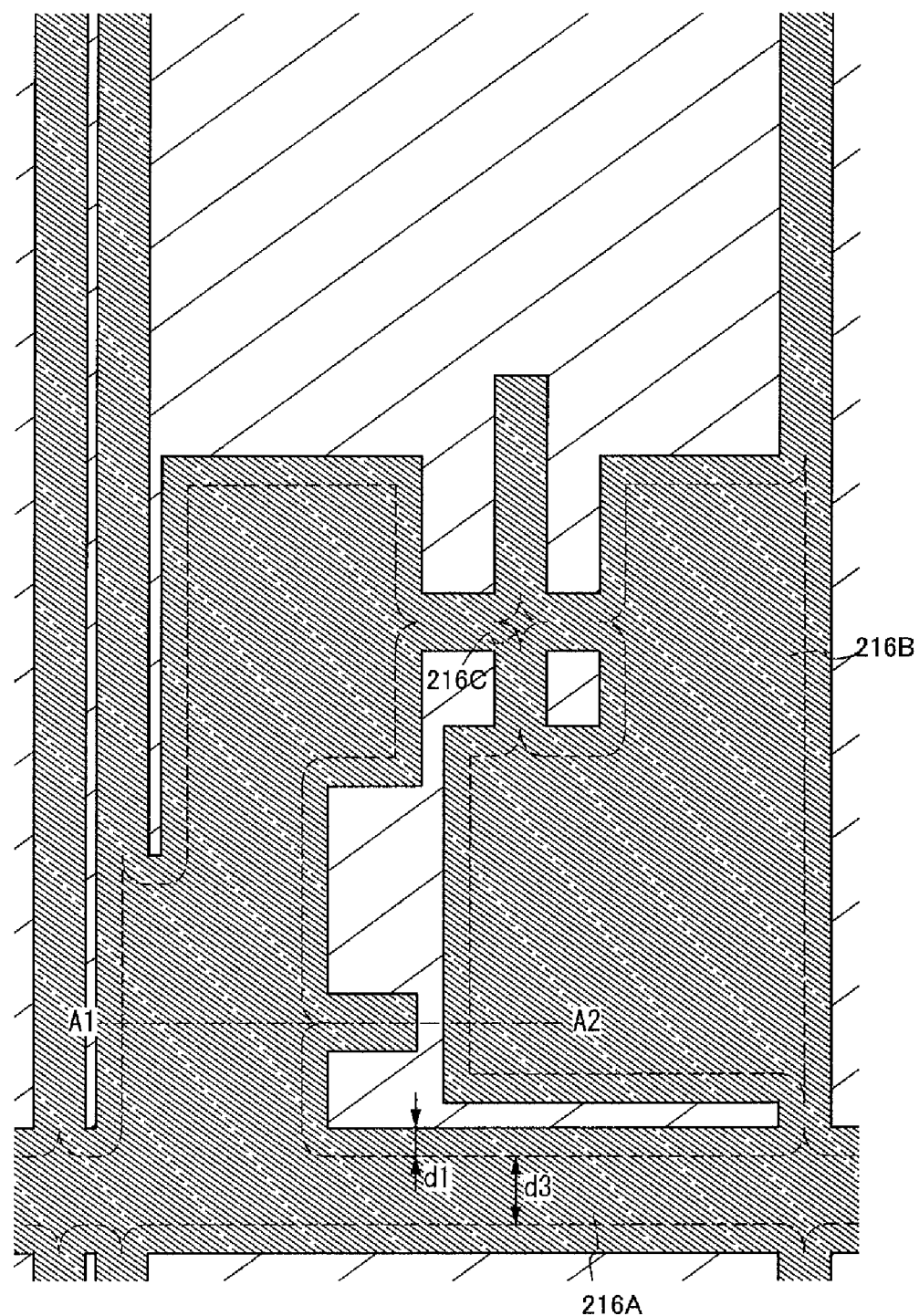
FIG. 47 illustrates an example of a method for manufacturing a thin film transistor and a display device.
Figure 52B:
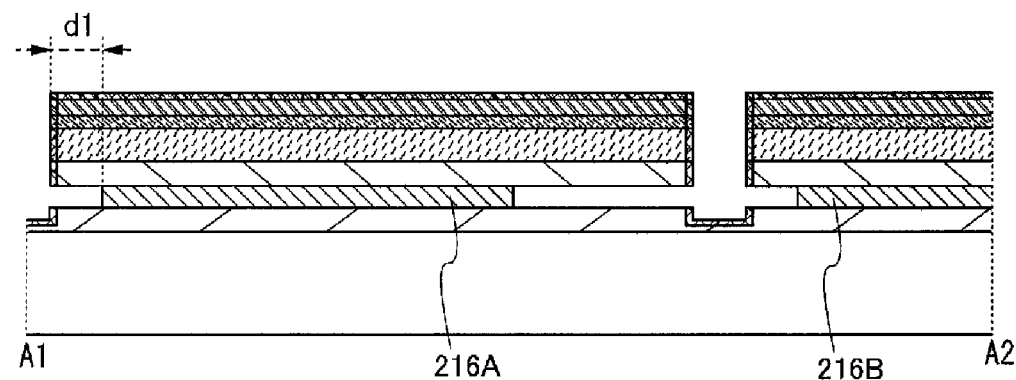

The first requirement is that the gate electrode layer 216 is left at places necessarily provided with the gate electrode layer 216. The places necessarily provided with the gate electrode layer 216 are regions indicated by dotted lines in FIG. 47, FIG. 48, FIG. 49, and FIG. 50. That is, it is necessary that the gate electrode layer 216 is left so as to form a gate wiring, a gate electrode in a transistor, and one electrode in a capacitor after the second etching. In order that the gate electrode layer forms the gate wiring and the capacitor wiring, the second etching need to be performed so as not to disconnect these wirings. As illustrated in FIG. 47 and FIG. 52B, the side surface of the gate electrode layer 216 is preferably more on the inside than the side surface of the thin-film stack body 214 by a distance $d_1$, and the distance $d_1$ may be set as appropriate by a practitioner depending on the layout.

The second requirement is that a minimum width $d_3$ of the gate wiring and the capacitor wiring formed by the gate electrode layer 216 and a minimum width $d_2$ of a source wiring and a power supply line formed by the source and drain electrode layer 220 have appropriate values (see FIG. 50). When the source and drain electrode layer 220 is etched by the second etching, the minimum width $d_2$ of the source wiring and the power supply line is reduced, and the current density of the source wiring and the power supply line becomes excessive, which results in degrading electric characteristics. For that reason, the second etching is performed under the conditions that the etching rate of the first conductive film 202 is not too high and the etching rate of the second conductive film 210 is as low as possible.

Note that a portion where the width of the semiconductor layer overlapping with the source wiring and the power supply line is a minimum width $d_4$ may be provided at an appropriate place for dividing the gate electrode layer in accordance with elements. By the second etching, a pattern in which the gate electrode layer 216 is not left in a region which overlaps with the portion where the width of the semiconductor layer is $d_4$ can be formed. The minimum width $d_4$ of the semiconductor layer is set smaller than approximately twice the distance $d_1$. In other words, the distance $d_1$ is set larger than approximately half the minimum width $d_4$ of the semiconductor layer.

In addition, it is preferred that the width of the electrode in a portion electrically connected to a pixel electrode layer, which is formed of the source and drain electrode layer, be equal to the minimum width $d_2$ of the source wiring.

As described above, the second etching under the condition in which side-etching is performed is very important. This is because, by the second etching in which the first conductive film 202 is side-etched, a pattern which enables desired connection between not only the gate wirings, which are adjacent to each other and are formed of the gate electrode layer 216, but also elements in the pixel circuit can be formed. Since side-etching is performed in the second etching, the second etching proceeds in a substantially isotropic manner.

Here, "side-etching" means etching in which a film is etched in not only a thickness direction of the film to be etched (a direction perpendicular to a substrate surface or a direction perpendicular to a base surface of the film to be etched) but also in a direction perpendicular to the thickness direction (a direction parallel to the substrate surface or a direction parallel to the base surface of the film to be etched). An end portion of the film subjected to side-etching can have various shapes depending on the etching rate of an etching gas or the like to the film to be etched. The end portion of the film is, in many cases, formed with a curved surface.

The gate electrode layer 216C illustrated in FIG. 47 serves as a supporting portion which supports the thin-film stack body 214. By providing the supporting portion, peeling of a film such as the insulating film 204 formed over the gate electrode layer can be prevented. In addition, by providing the supporting portion, a cavity region formed in contact with the gate electrode layer 216 by the second etching can be prevented from being larger than necessary. Furthermore, it is preferable to provide the supporting portion because the thin-film stack body 214 can be prevented from being broken or damaged due to its own weight in the middle of the manufacturing; as a result, yield is increased. However, an embodiment of the present invention is not limited thereto, and the supporting portion is not necessarily provided.

The second etching may be performed using, for example, $ClF_3$ gas or $XeF_2$ gas as in Embodiment 1. In this case, the first conductive film 202 may be formed using tungsten or molybdenum, and the second conductive film 210 may be formed using aluminum or titanium.

Note that the gate electrode layer 216, when seen from the above, has a horn similarly to the gate electrode layer 116 in Embodiment 1 (see FIG. 47). This is because the second etching for forming the gate electrode layer 216 proceeds isotropically or almost isotropically so that the distance $d_1$ between the side surface of the gate electrode layer 216 and the side surface of the thin-film stack body 214 is substantially uniform.

Next, a second resist mask 218 is formed. Note that this embodiment is not limited to this and the second etching may be performed after formation of the second resist mask 218.

When the first resist mask 212 is a resist mask having a depressed portion or a projected portion, the second resist mask 218 may be formed by recession (reduction) of the first resist mask 212, as in Embodiment 2.

Figure 52C:
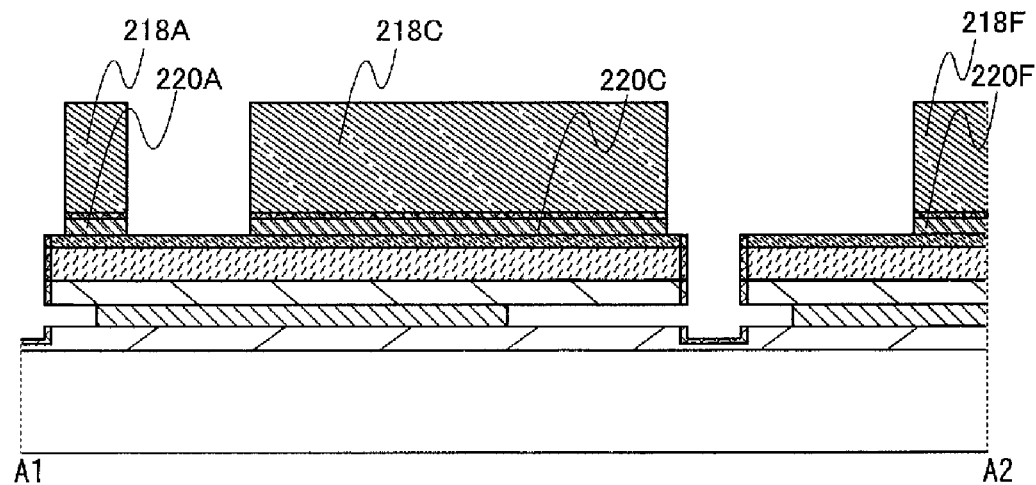

Next, the second conductive film 210 in the thin-film stack body 214 is etched using the second resist mask 218, whereby the source and drain electrode layer 220 is formed (see FIG. 48 and FIG. 52C). Here, as the etching conditions, the conditions by which films other than the second conductive film 210 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the source and drain electrode layer 220 forms the source electrode and the drain electrode of a thin film transistor, the source wiring, the power supply line, the other electrode of the capacitor, and an electrode which electrically connects the thin film transistor and one electrode of a light-emitting element to each other. When a source and drain electrode layer is referred to as the source and drain electrode layer 220A, the source and drain electrode layer forms the source wiring 188 and one of a source electrode and a drain electrode of the first transistor 181. When a source and drain electrode layer is referred to as a source and drain electrode layer 220B, the source and drain electrode layer forms the first power supply line 187. When a source and drain electrode layer is referred to as a source and drain electrode layer 220C, the source and drain electrode layer forms the other of the source electrode and the drain electrode of the first transistor 181 and an electrode which electrically connects the first transistor 181 and the pixel electrode to each other. When a source and drain electrode layer is referred to as a source and drain electrode layer 220D, the source and drain electrode layer forms the second power supply line 189 or one of a source electrode and a drain electrode of the second transistor 182. When a source and drain electrode layer is referred to as a source and drain electrode layer 220E, the source and drain electrode layer forms one of a source electrode and a drain electrode of the third transistor 183. When a source and drain electrode layer is referred to as a source and drain electrode layer 220F, the source and drain electrode layer forms the other electrode of the capacitor 184, the other of the source electrode and the drain electrode of the second transistor 182, the other of the source electrode and the drain electrode of the third transistor 183, and an electrode which electrically connects any of these electrodes and one electrode of the light-emitting element to each other.

Note that the second resist mask 218A overlaps with the source and drain electrode layer 220A, the second resist mask 218B overlaps with the source and drain electrode layer 220B, the second resist mask 218C overlaps with the source and drain electrode layer 220C, the second resist mask 218D overlaps with the source and drain electrode layer 220D, the second resist mask 218E overlaps with the source and drain electrode layer 220E, and the second resist mask 218F overlaps with the source and drain electrode layer 220F.

Note that for etching the second conductive film 210 in the thin-film stack body 214, either wet etching or dry etching may be performed.

Figure 53A:
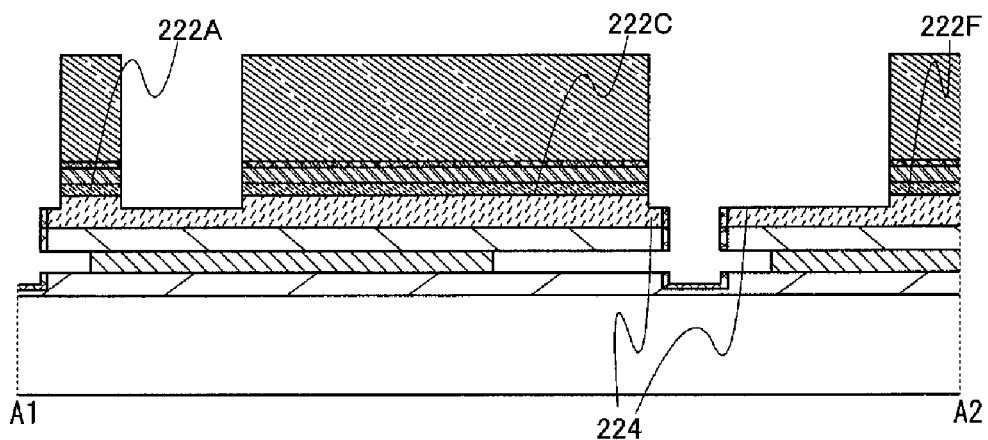
FIGS. 53A to 53C illustrate an example of a method for manufacturing a thin film transistor and a display device.

The impurity semiconductor film 208 and an upper portion (back channel portion) of the semiconductor film 206 in the thin-film stack body 214 are then etched to form a source and drain region 222 and the semiconductor layer 224 (see FIG. 49 and FIG. 53A). Here, as the etching conditions, the conditions by which films other than the impurity semiconductor film 208 and the semiconductor film 206 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the etching of the impurity semiconductor film 208 and the upper portion (back channel portion) of the semiconductor film 206 in the thin-film stack body 214 can be performed by dry etching or wet etching; however, dry etching is preferred.

Figure 53B:
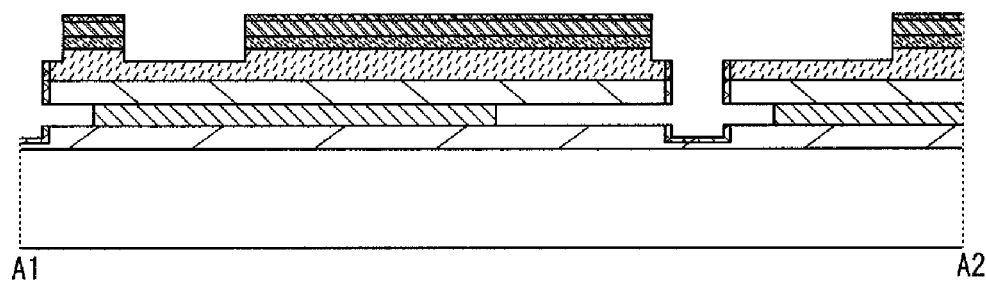
Figure 53C:
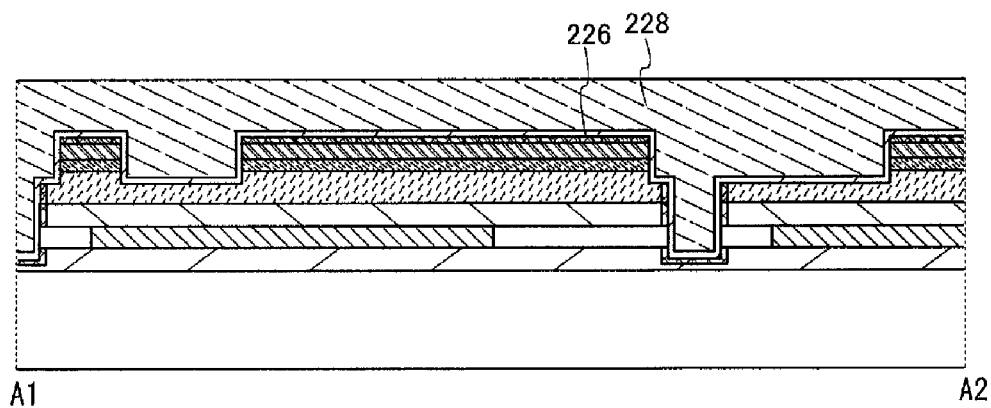

The second resist mask 218 is then removed to complete a thin film transistor (see FIG. 53B). As described above, the thin film transistor applicable to an EL display device can be manufactured using two photomasks. Alternatively, the thin film transistor can be manufactured using one photomask, by using a multi-tone photomask.

Note that the steps described with reference to FIG. 52C and FIG. 53A are collectively referred to as "third etching." The third etching may be performed in separate steps as described above or may be performed in a single step.

A protective insulating film is formed so as to cover the thin film transistor which is formed in the above-described manner. Although the protective insulating film may be formed of only a first protective insulating film 226, here, the protective insulating film is formed of the first protective insulating film 226 and a second protective insulating film 228 (see FIG. 53C and FIG. 55A). The first protective insulating film 226 may be formed in a manner similar to that of the insulating film 204. For example, the first protective insulating film 226 may be formed using silicon nitride, preferably silicon nitride containing hydrogen or silicon oxynitride containing hydrogen; thus, an impurity such as metal can be prevented from entering, dispersing, and contaminating the semiconductor layer 224.

The second protective insulating film 228 is formed by a method by which a surface thereof becomes substantially planar. This is because, when the surface of the second protective insulating film 228 is substantially planar, disconnection or the like of a first pixel electrode layer 232 formed over the second protective insulating film 228 can be prevented. Note that the phrase "substantially planar" means planar in such an extent that the aforementioned aim can be achieved, and does not mean that high planarity is required.

The second protective insulating film 228 can be formed, for example, by a spin coating method or the like using photosensitive polyimide, acrylic, epoxy resin, or the like. Note that an embodiment of the present invention is not limited to these materials and the formation method.

The second protective insulating film 228 is preferably formed by stacking the above-described protective insulating film formed by a method by which the surface thereof becomes substantially planar and a protective insulating film which covers the protective insulating film and prevents entry and release of moisture. Specifically, the protective insulating film which prevents entry and release of moisture is preferably formed using silicon nitride, silicon oxynitride, aluminum oxynitride, aluminum nitride, or the like. The second protective insulating film 228 is preferably formed by, but not limited to, a sputtering method.

Figure 54A:
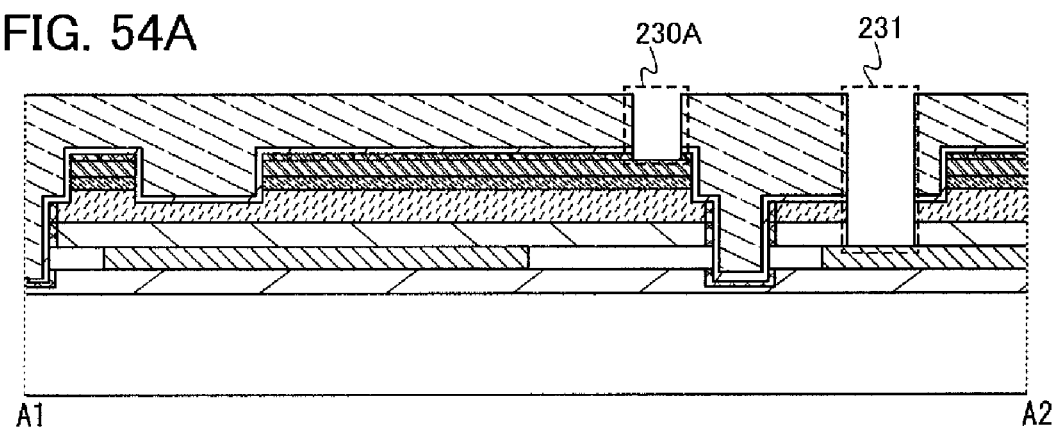
FIGS. 54A and 54B illustrate an example of a method for manufacturing a thin film transistor and a display device.

Next, a first opening 230 and a second opening 231 are formed in the protective insulating film (see FIG. 54A and FIG. 55B). The first opening 230 is formed so as to reach at least a surface of the source and drain electrode layer. The second opening 231 is formed so as to reach at least a surface of the gate electrode layer. The formation method of the first opening 230 and the second opening 231 is not limited to a particular method and may be determined as appropriate by a practitioner in accordance with the diameter of the first opening 230 or the like. For example, the first opening 230 and the second opening 231 can be formed by dry etching using photolithography. Note that by the formation of the first opening 130, an oxide film formed on a surface of the source and drain electrode layer 120 is removed.

The first opening 230 is provided so as to reach the source and drain electrode layer 220, and a plurality of first openings 230 are provided at places necessarily provided with the first opening 230 as illustrated in FIG. 50. A first opening 230A is provided on the source and drain electrode layer 220C, a first opening 230B is provided on the source and drain electrode layer 220B, and a first opening 230C is provided on the source and drain electrode layer 220E.

The second opening 231 is provided so as to reach the gate electrode layer 216. In other words, not only the protective insulating film but also desired regions of the insulating film 204 and the semiconductor layer 224 are removed to provide the second opening 231.

Note that in the case of forming the openings by photolithography, one photomask is used.

Figure 54B:
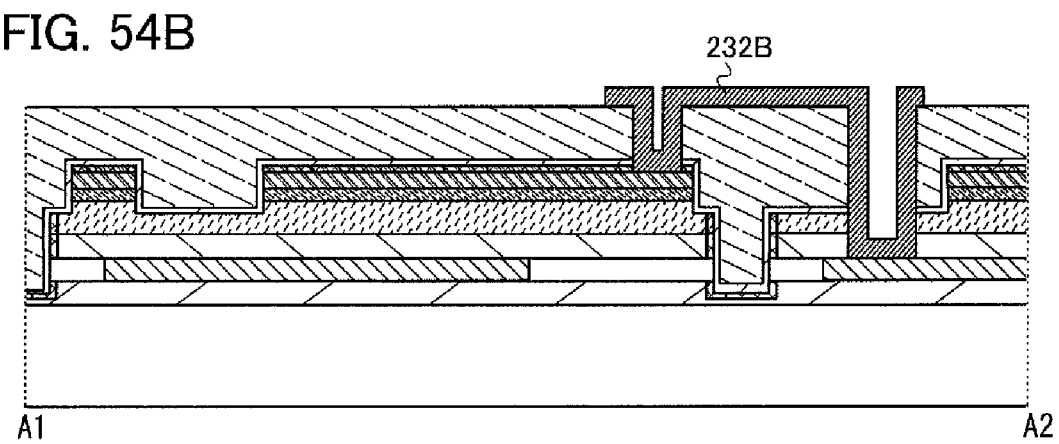

Next, the first pixel electrode layer 232 is formed over the protective insulating film (see FIG. 50 and FIG. 54B). The first pixel electrode layer 232 is formed so as to be electrically connected to the source and drain electrode layer 220 or the gate electrode layer 216 through the first opening 230 or the second opening 231, respectively. Specifically, the first pixel electrode layer 232 is formed so as to be electrically connected to the source and drain electrode layer 220C through the first opening 230A, to the source and drain electrode layer 220B through the first opening 230B, to the source and drain electrode layer 220E through the first opening 230C, to the gate electrode layer 216B through the second opening 231.

Note that in the case of forming the first pixel electrode layer 232 by photolithography, one photomask is used.

As described above, a transistor applicable to a pixel of an EL display device and one of pixel electrodes which is electrically connected to the transistor can be formed. An EL layer is further formed over this pixel electrode to form the other of the pixel electrodes over the EL layer; thus, an EL display device can be manufactured. The steps following this are briefly described below.

Since the thin film transistor included in the pixel is an n-channel transistor, it is preferable to form the first pixel electrode layer 232 using a material which functions as a cathode. The cathode can be formed using a material having a low work function such as, but not limited to, Ca, Al, MgAg, AlLi, or the like. In addition, the first pixel electrode layer 232 may be a single-layer film or a stacked-layer film including a plurality of films.

Next, a partition wall 233 is formed on the side surface (end portion) of the first pixel electrode layer 232 and over the protective insulating film (see FIG. 55C). The partition wall 233 has an opening, and the first pixel electrode layer 232 is exposed through the opening. The partition wall 233 is formed using an organic resin film, an inorganic insulating film, or organic polysiloxane. Specifically, the partition wall 233 may be formed using polyimide, polyamide, polyimide amide, acrylic, or benzocyclobutene-based resin. It is particularly preferable that the partition wall 233 be formed using a photosensitive material to have an opening over the first pixel electrode layer 232 and a side surface of the opening have a tilted surface with continuous curvature.

Next, an EL layer 234 is formed to be in contact with the first pixel electrode layer 232 at the opening of the partition wall 233 (see FIG. 55C). The EL layer 234 may be a single-layer film or a stacked-layer film including a plurality of layers. The EL layer 234 includes at least a light-emitting layer. It is preferable that the light-emitting layer be electrically connected to a second pixel electrode layer 235 through a hole-transporting layer.

The second pixel electrode layer 235 is then formed using a material which functions as an anode, to cover the EL layer (see FIG. 55C). The second pixel electrode layer 235 corresponds to the common electrode 190 in FIG. 45. The second pixel electrode layer 235 can be formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like can be given. The film of the conductive material having a light-transmitting property may be formed by a sputtering method, a CVD method, or the like; however, the formation method is not limited to a particular method. In addition, the second pixel electrode layer 235 may be a single-layer film or a stacked-layer film including a plurality of films.

Here, ITO is used for the second pixel electrode layer 235. In the opening of the partition wall 233, the first pixel electrode layer 232, the EL layer 234, and the second pixel electrode layer 235 overlap with one another, and a light-emitting element 236 is thus formed. The light-emitting element 236 corresponds to the light-emitting element 185 in FIG. 45. Next, a third protective insulating film (not illustrated) is preferably formed over the second pixel electrode layer 235 and the partition wall 233 so that oxygen, hydrogen, moisture, carbon dioxide, or the like does not enter the light-emitting element 236. As a material of the third protective insulating film, a material having a function of preventing entry and release of moisture is selected from materials which are similar to those of the first protective insulating film 226. The third protective insulating film is preferably formed using silicon nitride, silicon oxynitride, aluminum oxynitride, aluminum nitride, or the like. Further, a silicon nitride film, a DLC film, or the like is preferably provided to cover the third protective insulating film.

It is preferable to further perform packaging (sealing) with a protective film (e.g., a bonding film or an ultraviolet curing resin film) or a covering material in order to prevent exposure to air. The protective film and the covering material are preferably formed using a material which has low gas-permeability and causes less degassing.

In the above-described manner, a light-emitting element of a top emission EL display device can be formed (see FIG. 55C). However, this embodiment is not limited to the above description, but can be a bottom emission EL display device or a dual emission EL display device. In the bottom emission structure or the dual emission structure, the first pixel electrode layer 232 is formed using a conductive material having a light-transmitting property. Note that, in the case where the first pixel electrode layer 232 is formed using a material functioning as an anode, the first pixel electrode layer 232 may be formed using ITO, for example. The use of such a structure for the first pixel electrode layer 232 allows the manufacture of a bottom emission EL display device. In this case, the second pixel electrode layer 235 may be formed using a material functioning as a cathode so as to cover the EL layer 234. As the material which functions as a cathode, a material having a low work function such as Ca, Al, MgAg, AlLi, or the like can be given. Note that the EL layer 234 and the second pixel electrode layer 235 are preferably formed by vapor deposition using a mask. That is, it is preferable to form the second pixel electrode layer 235 using a material that is capable of forming a film by the vapor deposition.

Note that the materials and the formation methods of the protective insulating film and the like described above are not limited to those described above as long as light emission of the EL layer is not interfered and deterioration and the like can be prevented.

Further, in the top emission structure, a first pixel electrode layer 232A may be formed so as to cover the region where the pixel circuit is formed. In this case, first, only the conductive layers corresponding to a first pixel electrode layer 232B and a first pixel electrode layer 232C are formed, insulating films each having a first opening 230D are formed over the conductive layers, and then, the first pixel electrode layer 232A is formed so as to be electrically connected to a source and drain electrode layer 220F through the first opening 230D. By forming the first pixel electrode layer 232A so as to cover the region where the pixel circuit is formed, the light-emitting region can be enlarged and higher definition display can be performed.

Note that although an organic EL element is described here as a light-emitting element, an inorganic EL element can also be used as a light-emitting element.

Note that a terminal connection portion is similar to any of the terminal connection portions described in Embodiment 1.

In the above-described manner, an EL display device can be manufactured. The method fro manufacturing an EL display device described above can be implemented in combination with a manufacturing method described in any of the other embodiments as appropriate, and similar effects can be obtained.

Note that the pixel structure of this embodiment is not limited to the pixel structure described above, but can be applied to a variety of EL display devices.

Embodiment 10

As in Embodiment 7, an EL display device described in Embodiment 9 can also utilize a height difference generated by formation of a thin film transistor or the like in order to separately form EL layers between adjacent pixels.

In such an EL display device, since the height difference generated by formation of the thin film transistor or the like is utilized to separately form the EL layers, the EL layers can be formed favorably.

Embodiment 11

In this embodiment, electronic devices in which a display panel or a display device manufactured by any of the methods described in Embodiments 1 to 10 is incorporated as a display portion will be described with reference to FIGS. 56A and 56B, FIG. 57, and FIGS. 58A to 58C. Examples of such electronic devices include cameras such as video cameras or digital cameras; head mounted displays (goggle type displays); car navigation systems; projectors; car stereos; personal computers; and portable information terminals (e.g., mobile computers, mobile phones, and e-book readers). Examples of the electronic devices are illustrated in FIGS. 56A and 56B.

Figure 56A:
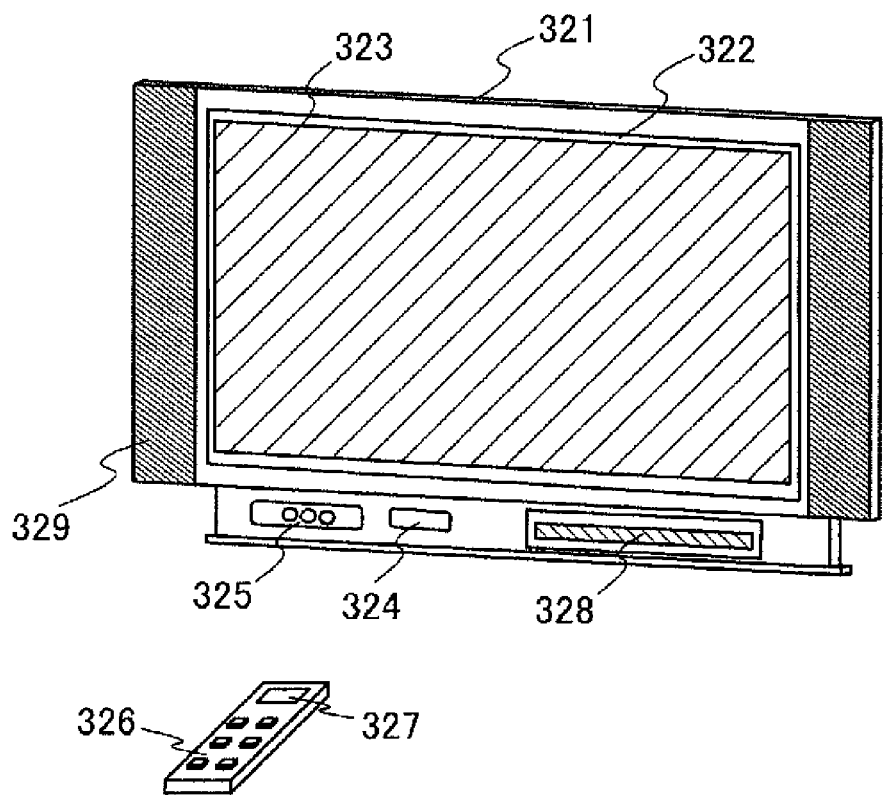
FIGS. 56A and 56B each illustrate an example of an electronic device.
Figure 56B:
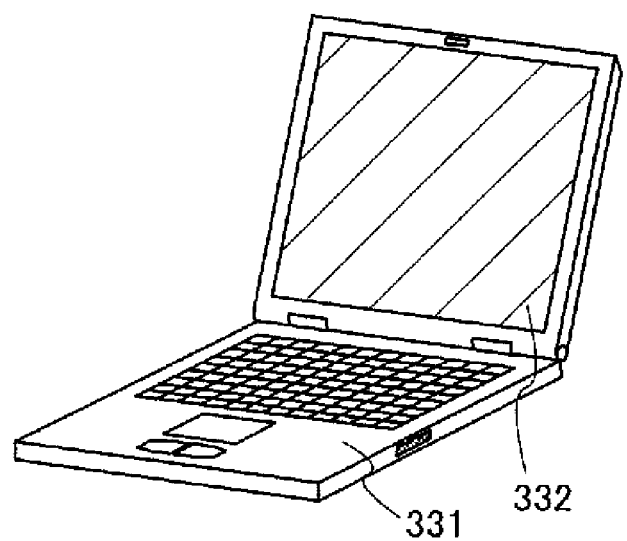

FIG. 56A illustrates a television device. A television device illustrated in FIG. 56A can be completed by incorporating a display panel into a housing. A main screen 323 is formed using a display panel manufactured by any of the manufacturing methods described in Embodiments 1 to 10, and a speaker portion 329, operation switches, and the like are provided as its accessory equipment.

As illustrated in FIG. 56A, a display panel 322 manufactured by any of the manufacturing methods described in Embodiments 1 to 10 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) information communication can be performed. The television device can be operated using switches incorporated into the housing or by a remote control device 326 provided separately. A display portion 327 which displays output information may be provided for the remote control device 326.

Further, the television device may include a sub-screen 328 formed using a second display panel for displaying channels, volume, and the like, in addition to the main screen 323.

Figure 57:
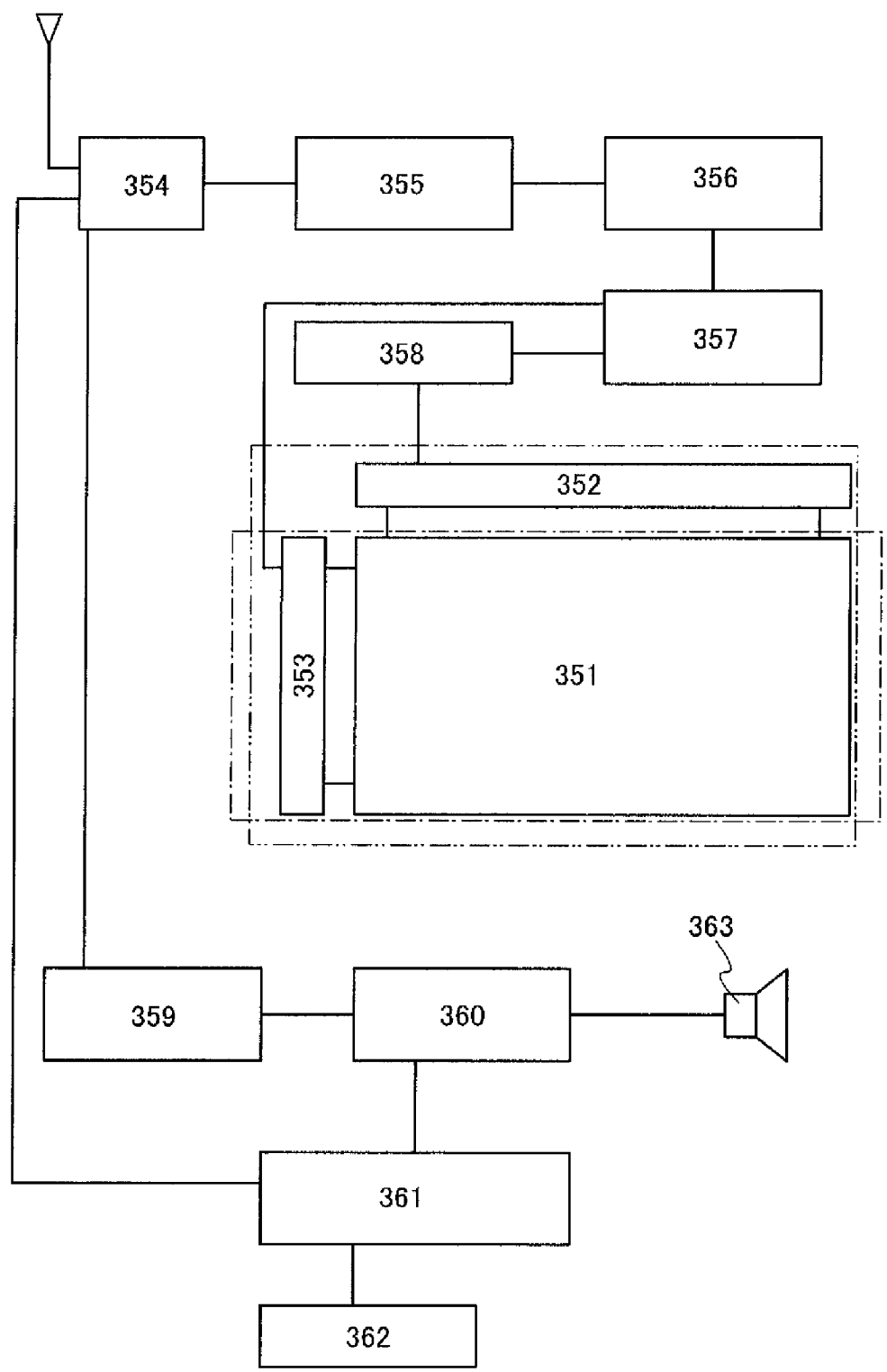
FIG. 57 illustrates a block diagram of a main structure of television appliance as an example of an electronic device.

FIG. 57 is a block diagram of a main structure of a television device. A pixel portion 351 is formed in a display panel. A signal line driver circuit 352 and a scanning line driver circuit 353 may be mounted on the display panel by a COG method.

As structures of other external circuits, a video signal amplifier circuit 355 amplifying a video signal among signals received by a tuner 354; a video signal processing circuit 356 converting signals output from the video signal amplifier circuit 355 into color signals corresponding to each colors of red, green, and blue; a control circuit 357 for converting the video signal into a signal which meets input specifications of a driver IC; and the like are provided on the input side of the video signal. The control circuit 357 outputs signals to each of the scanning line side and the signal line side. In the case of digital driving, a signal dividing circuit 358 may be provided on the signal line side, and an input digital signal may be divided into an integral number of pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control information on a receiving station (receiving frequency) or sound volume from an input portion 362 and transmits signals to the tuner 354 and the audio signal processing circuit 360.

Naturally, the display device which is an embodiment of the present invention is not limited to the television device, but can also be applied to large-size display media such as information display boards at train stations, airports, and the like, or advertisement display boards on the street, as well as monitors of personal computers. By using the method for manufacturing a display device described in an embodiment, productivity of these display media can be improved.

When the display panel or display device manufactured by any of the methods for manufacturing a display device described in Embodiments 1 to 10 is applied to the main screen 323 and the sub-screen 328, productivity of television devices can be increased.

A mobile computer illustrated in FIG. 56B includes a main body 331, a display portion 332, and the like. When the display panel or display device manufactured by any of the methods for manufacturing a display device described in Embodiments 1 to 10 is applied to the display portion 332, productivity of computers can be increased.

Figure 58A:
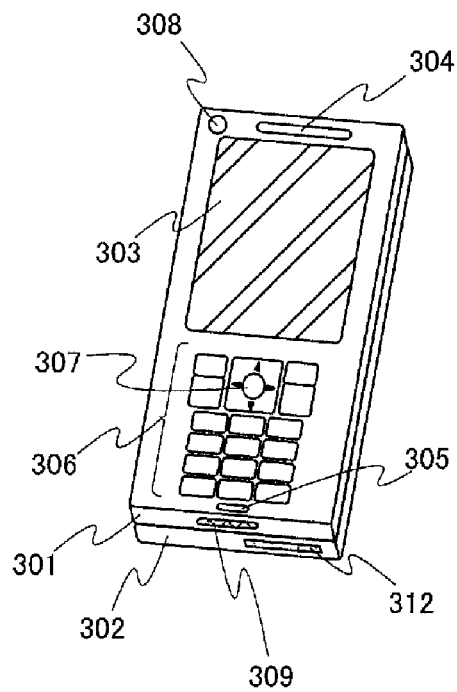
FIGS. 58A to 58C each illustrate an example of an electronic device.
Figure 58B:
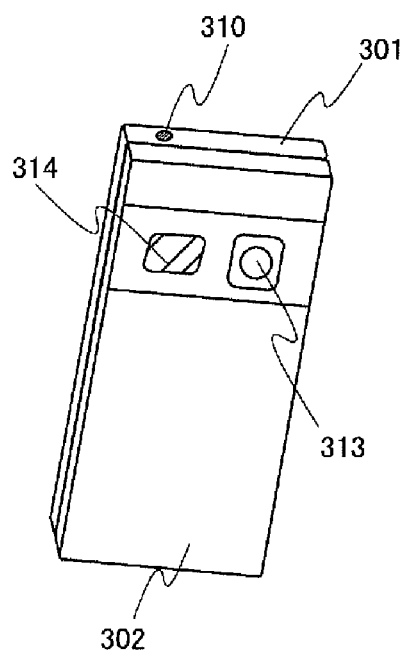
Figure 58C:
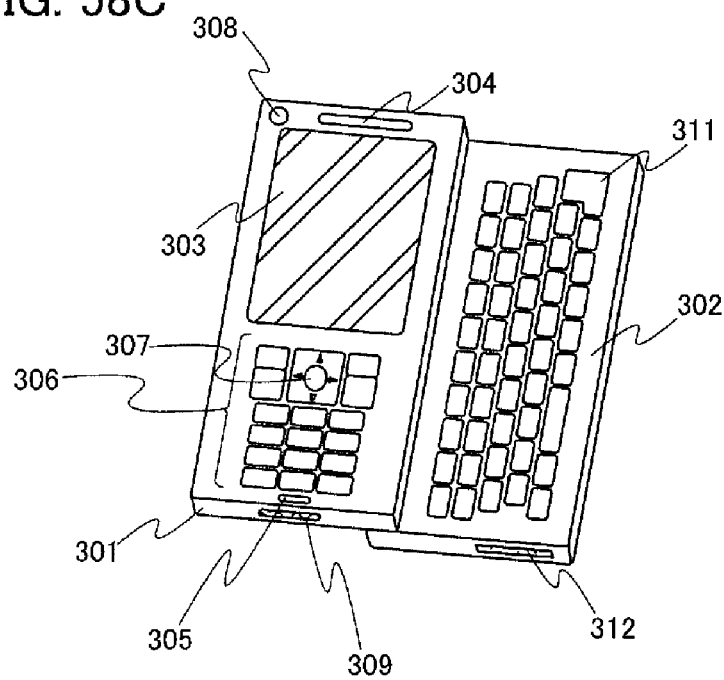

FIGS. 58A to 58C illustrate an example of a mobile phone. FIG. 58A is a front view, FIG. 58B is a rear view, and FIG. 58C is a front view when two housings slide. A mobile phone illustrated in FIGS. 58A to 58C includes two housings 301 and 302. The mobile phone is a so-called smartphone which has both functions of a mobile phone and a portable information terminal, and incorporates a computer and can process a variety of data processing in addition to voice calls.

The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above-described structure, a non-contact IC chip, a small size memory device, or the like may be incorporated in the mobile phone illustrated in FIGS. 58A to 58C.

The display panel or display device manufactured by any of the methods for manufacturing a display device described in Embodiments 1 to 10 can be incorporated in the display portion 303. Since the display portion 303 and the front camera lens 308 are provided in the same plane, the mobile phone can be used as a videophone.

By using the speaker 304 and the microphone 305, the mobile phone can be used as an audio recording device (sound recorder) or an audio reproducing device. With use of the operation keys 306, operation of incoming and outgoing calls, simple information input for electronic mail or the like, scrolling of a screen displayed on the display portion, cursor motion for selecting information displayed on the display portion, and the like are possible.

In the case where much information needs to be handled, such as the case of creating documents and using the mobile phone as a portable information terminal, the use of the keyboard 311 is convenient. Further, the housings 301 and 302 overlapped with each other (FIG. 58A) slide and can be developed as illustrated in FIG. 58C. In the case where the mobile phone is used as a portable information terminal, smooth cursor operation with the keyboard 311 and the pointing device 307 can be performed. The jack 309 for an external connection terminal can be connected to various cables such as an AC adapter or a USB cable, whereby the mobile phone can be charged or can perform data communication with a personal computer or the like. Moreover, by inserting a recording medium into the external memory slot 312, the mobile phone can deal with storing and moving a large amount of data.

In the rear surface of the housing 302 (FIG. 58B), the rear camera 313 and the light 314 are provided, and the display portion 303 can be used as a viewfinder to take still and motion picture.

Further, the mobile phone may have an infrared communication function, a USB port, a function of receiving one segment television broadcast, an earphone jack, or the like, in addition to the above-described functions and structures.

Since various electronic devices described in this embodiment can be manufactured by any of the methods for manufacturing a thin film transistor and a display device described in Embodiments 1 to 10, productivity of these electronic devices can be increased.

As a result, manufacturing cost of these electronic devices can be significantly reduced.

This application is based on Japanese Patent Application serial no. 2009-016472 filed with Japan Patent Office on Jan. 28, 2009, the entire contents of which are hereby incorporated by reference.

What is claimed is:

1. A method for manufacturing a semiconductor device including a thin film transistor comprising the steps of:
   forming a first conductive film;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask over the second conductive film;
   performing first etching on the insulating film, the semiconductor film, the impurity semiconductor film, and the second conductive film using the first resist mask to expose at least a surface of the first conductive film;
   performing an oxidation treatment to oxidize at least a side surface of the semiconductor film and the surface of the first conductive film;
   performing second etching in which side-etching is performed on part of the first conductive film by dry etching to form a gate electrode layer after performing the oxidation treatment;
   forming a second resist mask over the second conductive film; and
   performing third etching on each part of the second conductive film, the impurity semiconductor film, and the semiconductor film using the second resist mask to form a source and drain electrode layer, a source and drain region, and a semiconductor layer.

2. The method for manufacturing a semiconductor device according to claim 1,
   wherein the first conductive film is formed using tungsten, and
   wherein the dry etching is performed using a ClF$_3$ gas.

3. The method for manufacturing a semiconductor device according to claim 1,
   wherein an element region is formed by the first etching, and
   wherein the second etching makes a side surface of the gate electrode layer more on the inside than a side surface of the element region by an substantially uniform distance.

4. The method for manufacturing a semiconductor device according to claim 1, wherein a pixel electrode is selectively formed to be electrically connected to the source and drain electrode layer of the thin film transistor.

5. The method for manufacturing a semiconductor device, according to claim 1, further comprising the steps of:
   forming a protective insulating film over the thin film transistor;
   forming an opening in the protective insulating film so as to expose part of the source and drain electrode layer; and
   selectively forming a pixel electrode in the opening and over the protective insulating film.

6. The method for manufacturing a semiconductor device according to claim 5, wherein the protective insulating film is formed by stacking an insulating film formed by a CVD method or a sputtering method and an insulating film formed by a spin coating method.

7. The method for manufacturing a semiconductor device according to claim 1, wherein the impurity semiconductor film and the semiconductor film are etched under a condition different from a condition of etching for the second conductive film.

8. The method for manufacturing a semiconductor device according to claim 1, wherein the second resist mask is formed after the second etching is performed.

9. A method for manufacturing a semiconductor device including a thin film transistor comprising the steps of:
   forming a first conductive film;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask over the second conductive film;
   performing first etching on the insulating film, the semiconductor film, the impurity semiconductor film, and the second conductive film using the first resist mask to expose at least a surface of the first conductive film;
   performing an oxidation treatment to oxidize at least a side surface of the semiconductor film and the surface of the first conductive film;
   forming a second resist mask over the second conductive film;
   performing second etching in which side-etching is performed on part of the first conductive film by dry etching to form a gate electrode layer, wherein the second etching is performed after the second resist mask is formed; and
   performing third etching on each part of the second conductive film, the impurity semiconductor film, and the semiconductor film using the second resist mask to form a source and drain electrode layer, a source and drain region, and a semiconductor layer.

10. The method for manufacturing a semiconductor device according to claim 9,
    wherein the first conductive film is formed using tungsten, and
    wherein the dry etching is performed using a ClF$_3$ gas.

11. The method for manufacturing a semiconductor device according to claim 9,
    wherein an element region is formed by the first etching, and
    wherein the second etching makes a side surface of the gate electrode layer more on the inside than a side surface of the element region by an substantially uniform distance.

12. The method for manufacturing a semiconductor device according to claim 9, wherein a pixel electrode is selectively formed to be electrically connected to the source and drain electrode layer of the thin film transistor.

13. The method for manufacturing a semiconductor device according to claim 9, further comprising the steps of:
forming a protective insulating film over the thin film transistor;
forming an opening in the protective insulating film so as to expose part of the source and drain electrode layer; and
selectively forming a pixel electrode in the opening and over the protective insulating film.

14. The method for manufacturing a semiconductor device according to claim 13, wherein the protective insulating film is formed by stacking an insulating film formed by a CVD method or a sputtering method and an insulating film formed by a spin coating method.

15. The method for manufacturing a semiconductor device according to claim 9, wherein the impurity semiconductor film and the semiconductor film are etched under a condition different from a condition of etching for the second conductive film.

16. A method for manufacturing a semiconductor device including a thin film transistor comprising the steps of:
forming a first conductive film;
forming an insulating film over the first conductive film;
forming a semiconductor film over the insulating film;
forming an impurity semiconductor film over the semiconductor film;
forming a second conductive film over the impurity semiconductor film;
forming a first resist mask having a depressed portion over the second conductive film;
performing first etching on the insulating film, the semiconductor film, the impurity semiconductor film, and the second conductive film using the first resist mask to expose at least a surface of the first conductive film;
performing an oxidation treatment to oxidize at least a side surface of the semiconductor film and the surface of the first conductive film;
performing second etching in which side-etching is performed on part of the first conductive film by dry etching to form a gate electrode layer after performing the oxidation treatment;
forming a second resist mask by making the first resist mask recede to expose part of the second conductive film, wherein the part of the second conductive film overlaps with the depressed portion of the first resist mask; and
performing third etching on each part of the second conductive film, the impurity semiconductor film, and the semiconductor film using the second resist mask to form a source and drain electrode layer, a source and drain region, and a semiconductor layer.

17. The method for manufacturing a semiconductor device according to claim 16, wherein the first resist mask having the depressed portion is formed using a multi-tone mask.

18. The method for manufacturing a semiconductor device according to claim 16,
wherein the first conductive film is formed using tungsten, and
wherein the dry etching is performed using a ClF$_3$ gas.

19. The method for manufacturing a semiconductor device according to claim 16,
wherein an element region is formed by the first etching, and
wherein the second etching makes a side surface of the gate electrode layer more on the inside than a side surface of the element region by an substantially uniform distance.

20. The method for manufacturing a semiconductor device according to claim 16, wherein a pixel electrode is selectively formed to be electrically connected to the source and drain electrode layer of the thin film transistor.

21. The method for manufacturing a semiconductor device according to claim 16, further comprising the steps of:
forming a protective insulating film over the thin film transistor;
forming an opening in the protective insulating film so as to expose part of the source and drain electrode layer; and
selectively forming a pixel electrode in the opening and over the protective insulating film.

22. The method for manufacturing a semiconductor device according to claim 21, wherein the protective insulating film is formed by stacking an insulating film formed by a CVD method or a sputtering method and an insulating film formed by a spin coating method.

23. The method for manufacturing a semiconductor device according to claim 16, wherein the impurity semiconductor film and the semiconductor film are etched under a condition different from a condition of etching for the second conductive film.

24. The method for manufacturing a semiconductor device according to claim 16, wherein the second resist mask is formed after the second etching is performed.

25. A method for manufacturing a semiconductor device including a thin film transistor comprising the steps of:
forming a first conductive film;
forming an insulating film over the first conductive film;
forming a semiconductor film over the insulating film;
forming an impurity semiconductor film over the semiconductor film;
forming a second conductive film over the impurity semiconductor film;
forming a first resist mask having a depressed portion over the second conductive film;
performing first etching on the insulating film, the semiconductor film, the impurity semiconductor film, and the second conductive film using the first resist mask to expose at least a surface of the first conductive film;
performing an oxidation treatment to oxidize at least a side surface of the semiconductor film and the surface of the first conductive film;
forming a second resist mask by making the first resist mask recede to expose part of the second conductive film, wherein the part of the second conductive film overlaps with the depressed portion of the first resist mask;
performing second etching in which side-etching is performed on part of the first conductive film by dry etching to form a gate electrode layer, wherein the second etching is performed after the second resist mask is formed; and
performing third etching o each part of the second conductive film, the impurity semiconductor film, and the semiconductor film using the second resist mask to form a source and drain electrode layer, a source and drain region, and a semiconductor layer.

26. The method for manufacturing a semiconductor device according to claim 25, wherein the first resist mask having the depressed portion is formed using a multi-tone mask.

27. The method for manufacturing a semiconductor device according to claim 25,
wherein the first conductive film is formed using tungsten, and
wherein the dry etching is performed using a ClF$_3$ gas.

28. The method for manufacturing a semiconductor device according to claim 25,
wherein an element region is formed by the first etching, and
wherein the second etching makes a side surface of the gate electrode layer more on the inside than a side surface of the element region by an substantially uniform distance.

29. The method for manufacturing a semiconductor device according to claim 25, wherein a pixel electrode is selectively formed to be electrically connected to the source and drain electrode layer of the thin film transistor.

30. The method for manufacturing a semiconductor device according to claim 25, further comprising the steps of:
forming a protective insulating film over the thin film transistor;
forming an opening in the protective insulating film so as to expose part of the source and drain electrode layer; and
selectively forming a pixel electrode in the opening and over the protective insulating film.

31. The method for manufacturing a semiconductor device according to claim 30, wherein the protective insulating film is formed by stacking an insulating film formed by a CVD method or a sputtering method and an insulating film formed by a spin coating method.

32. The method for manufacturing a semiconductor device according to claim 25, wherein the impurity semiconductor film and the semiconductor film are etched under a condition different from a condition of etching for the second conductive film.

33. A thin film transistor comprising:
a gate electrode layer;
a gate insulating layer over the gate electrode layer;
a semiconductor layer over the gate insulating layer;
an impurity semiconductor layer over the semiconductor layer;
a source and drain electrode layer over the impurity semiconductor layer;
a cavity in contact with a side surface of the gate electrode layer, and
a protective insulating layer over the source and drain electrode layer,
wherein a side surface of the semiconductor layer is oxidized, and
wherein the protective insulating layer is in contact with the cavity and an oxidized side surface of the semiconductor layer.

34. The thin film transistor according to claim 33, wherein a surface of the source and drain electrode layer is oxidized.

35. The thin film transistor according to claim 33, wherein the cavity is surrounded by the gate electrode, the gate insulating layer, the protective insulating layer, and the semiconductor layer.

36. The thin film transistor according to claim 33, wherein the oxidized side surface of the semiconductor layer is overlapped with the cavity.

* * * * *